(12) United States Patent
Kaneda et al.

(10) Patent No.: US 8,030,840 B2
(45) Date of Patent: Oct. 4, 2011

(54) LIGHT EMITTING DEVICE, LIGHTING SYSTEM, BACKLIGHT UNIT FOR DISPLAY DEVICE AND DISPLAY DEVICE

(75) Inventors: Hideaki Kaneda, Ibaraki (JP); Naoto Kijima, Kanagawa (JP); Eiji Hattori, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 12/775,020

(22) Filed: May 6, 2010

(65) Prior Publication Data

US 2010/0213861 A1 Aug. 26, 2010

Related U.S. Application Data

(63) Continuation of application No. 11/631,388, filed as application No. PCT/JP2005/011940 on Jun. 29, 2005, now Pat. No. 7,737,623.

(30) Foreign Application Priority Data

Jun. 30, 2004 (JP) ................................ 2004-194154
Oct. 18, 2004 (JP) ................................ 2004-303363

(51) Int. Cl.
*H01J 1/62* (2006.01)
(52) U.S. Cl. ....................................... 313/503; 313/506
(58) Field of Classification Search .................. 313/498, 313/503, 506, 509
See application file for complete search history.

(56) References Cited

U.S. PATENT DOCUMENTS

| | | |
|---|---|---|
| 5,611,959 A | 3/1997 | Kijima et al. |
| 6,488,390 B1 | 12/2002 | Lebens et al. |
| 6,712,993 B2 | 3/2004 | Kijima et al. |
| 7,001,537 B2 | 2/2006 | Kijima et al. |
| 7,006,172 B2 | 2/2006 | Kawana et al. |
| 2004/0251809 A1 | 12/2004 | Shimomura et al. |
| 2005/0145854 A1 | 7/2005 | Seto et al. |

FOREIGN PATENT DOCUMENTS

| | | |
|---|---|---|
| JP | 9 297560 | 11/1997 |
| JP | 2001-184921 | 7/2001 |
| JP | 2003 17751 | 1/2003 |

(Continued)

OTHER PUBLICATIONS

Srivastava, A.M., et al., "Thirteenth International Symposium on the Physics and Chemistry of Luminescent Materials", Jun. 2004; pp. 1-3.

(Continued)

*Primary Examiner* — Vip Patel
(74) *Attorney, Agent, or Firm* — Oblon, Spivak, McClelland, Maier & Neustadt, L.L.P.

(57) ABSTRACT

To enhance emission efficiency and color rendering, a light emitting device 1 comprises: at least one light source 3; at least one first emitting section 4 having at least one sort of luminescent material that can emit light including a wavelength component that is longer than the light emitted from light source 3 when excited by the light emitted from light source 3; at least one second emitting section 5 having at least one sort of luminescent material that can emit light including a wavelength component that is longer than the light emitted from first emitting section 4 when excited by the light emitted from light source 3 and first emitting section 4; wherein light emitting device 1 comprises at least one light shielding unit 6 that protects at least a part of the light emitted from first emitting section 4 from entering second emitting section 5.

13 Claims, 23 Drawing Sheets

FOREIGN PATENT DOCUMENTS

| | | |
|---|---|---|
| JP | 2003 64358 | 3/2003 |
| JP | 2003-133595 | 5/2003 |
| JP | 2004-48040 | 2/2004 |
| JP | 2004-62772 | 2/2004 |
| JP | 2004 71726 | 3/2004 |
| JP | 2004 88003 | 3/2004 |
| JP | 2004-128241 | 4/2004 |
| JP | 2004 241138 | 8/2004 |
| JP | 2005 243699 | 9/2005 |
| JP | 2006 8721 | 1/2006 |
| WO | 2006 003930 | 1/2006 |
| WO | 2006 003932 | 1/2006 |

OTHER PUBLICATIONS

National Institute of Material Science, "Success in Development of Red Phosphor for White Led" (MIMS Press Release); Aug. 31, 2004; pp. 1-7 (with English Translation).

"Nitride phosphor-related presentation for The Japan Society of Applied Physics", Sep. 2004 (with English Translation).

Uheda, K., et al., The Crystal Structure and Photoluminescence Properties of a New Red Phsophor, Calcium Aluminum Silicon Nitride Doped with Divalent Europium . . . Presented for the Electrochemical Society of Japan, Oct. 2004.

Office Action issued Dec. 14, 2010, in Japanese Patent Application No. 2005-190352 (with English translation).

LIGHT EMITTING DEVICE, LIGHTING SYSTEM, BACKLIGHT UNIT FOR DISPLAY DEVICE AND DISPLAY DEVICE

This application is a Continuation of U.S. Ser. No. 11/631,388 filed May 14, 2007, allowed, which is a 371 application of PCT/JP05/11940 filed Jun. 29, 2005 and claims the benefit of Japanese Application No. 2004-194154 filed Jun. 30, 2004 and Japanese Application No. 2004-303363 filed Oct. 18, 2004. The contents of each of these applications are incorporated herein by reference in their entirety.

TECHNICAL FIELD

This invention relates to alight emitting device, a lighting system, a backlight unit for display device and a display device.

BACKGROUND ART

Devices such as cold cathode tube and the like have previously been used as light source for a lighting system or a liquid crystal display backlight. Recently, pseudo-white light sources have been developed as an alternative light source, which is a combination of a light source emitting blue light and materials emitting yellow light as a result of absorbing blue light. In this pseudo-white light source, an InGaN base light-emitting diode is used as light source emitting blue light and cerium-activated yttrium aluminate is used as a material emitting yellow light, for example.

However, color spectrum generated by pseudo-white light sources is essentially deficient in green light component and red light component and, therefore, these pseudo-white light sources were poor in their color rendering and color reproduction property. In order to solve this problem, proposals have been made to improve the light rendering property and light reproduction property of these pseudo-white light sources. These proposals include modification of yttrium aluminate complex so that it emits yellowish green light, or further addition of such substances as to absorb blue light and emit red light to the yttrium aluminate complex so as to supplement red light component of the pseudo-white light source.

In many cases, however, red luminescent materials absorb not only blue light but also green light or yellow light whose wavelength is longer than blue light but shorter than red light. As such substances can be cited europium activated alkali earth metal sulfides, europium activated alkali earth metal and silicon nitrides, and europium activated alkali earth metal and silicon oxynitrides. These substances usually absorb light of 400 nm to 580 nm wavelength efficiently and emit orange to red light with peak wavelength of 580 nm to 680 nm.

Orange to red luminescent materials, typified by the above-mentioned ones, absorb shorter wavelength, green to yellow light. Therefore, combined use of orange to red luminescent materials and green to yellow luminescent materials results in partial absorption of green to yellow light component by orange to red luminescent materials, and this causes a marked decrease in luminous flux of light emitting device.

At present, attempts are being made to prevent the loss of luminous flux caused by absorption of short wavelength light by luminescent materials emitting long wavelength light. Patent Document 1 is one of such examples. In this patent, a light emitting device comprises two kinds of materials (here called, "material A" and "material B"), which absorb light from a light source and emit light of different wavelength. It is so arranged that, when the material A (which corresponds to a material emitting orange to red light) absorbs a part of the light emitted from the material B (which corresponds to a material emitting green to yellow light), the improvement in color rendering and the prevention of luminous flux loss can be achieved by locating the material A closer to the light source than the material B is.

In addition, display devices have previously been used which visualize clearly images formed on the image formation unit by irradiating light (backlight) directed against the image formation unit, with some images formed thereon, from behind. Display devices of this kind include: liquid crystal display using a liquid crystal unit as image formation unit, indoors indicator (emergency exit lamp, traffic signal and the like) with its sign (image formation unit) illuminated with light originated inside.

These display devices usually comprise a backlight unit which radiates light from behind against the image formation unit. Fluorescence lamp and cold cathode tube have previously been used as this kind of backlight unit.

The problem is, fluorescent lamps and cold cathode tubes, used as backlight unit, are difficult to reduce in size of the backlight unit and, besides, their lifetime is rather short.

Another concern is that these devices contain mercury in them, which may exert an undesirable effect on the environment, making their use even more difficult.

In recent years, a proposal has been made to design, as backlight unit, a light emitting device which makes use of a light source and fluorescent materials capable of absorbing light from the light source and emitting fluorescence. For example, the art as mentioned above, which utilizes pseudo-white light source as backlight unit using light-emitting diode of InGaN system and cerium-activated yttrium aluminate as light source and luminescent materials, respectively.

Another proposal is to use a light emitting device proposed in Patent Document 1 as backlight.

[Patent Document 1] Japanese Patent Laid-Open Publication (Kokai) No. 2004-71726

DISCLOSURE OF THE INVENTION

Problem to Be Solved by the Invention

However, in the art of Patent Document 1, material A and material B emit light in wide directions and a considerable portion of light emitted from material B (approximately half of it) is absorbed by material A, this causing marked loss of luminous flux. Emission efficiency of this light emitting device was, therefore, low.

As was pointed earlier, a light emitting device comprising a light source emitting blue light and materials absorbing blue light and emitting yellow light achieves high emission efficiency but with poor color rendering.

In display devices based on previous light emitting devices, in order to display the color of images formed on the image formation unit with high color reproduction (that is, in order to enhance the color reproduction), it is desirable that white light used as backlight is light containing three primary colors. Three primary colors here represent red, blue and green colors. From this standpoint, light emitting devices, previously used and based on a light source emitting blue light and fluorescent materials emitting yellow light, are deficient in red and green light components and their color reproduction is not adequate.

In a display device based on technology described in Patent Document 1, white light comprising all of blue, green and red light is emitted and, therefore, there is no problem in color reproduction. However, light from fluorescent materials (red and green light) is emitted in wide directions and most of light emitted from green fluorescent materials is absorbed by red fluorescent materials, causing marked loss in luminous flux. This leads to low emission efficiency of backlight unit and, also, to increased energy consumption of the display device.

The present invention has been made in view of such problems as mentioned above. The object of the invention includes the following: to heighten the emission efficiency and color rendering of a light emitting device which comprises two or more luminescent materials that absorb and emit light; to provide a lighting system, a backlight unit for a display device and a display device, using the light emitting device; to provide display device with excellent color rendering property, by using a backlight unit with high emission efficiency.

Means for Solving the Problem

The inventors of the present invention made an intensive investigation to solve the above problems, and found that, with a light emitting device comprising two or more luminescent materials, it is possible to enhance the emission efficiency and color rendering of the light emitting device by blocking the light from one luminescent material from entering the region containing the other luminescent material, and thus by reducing the absorption amount of light emitted by one luminescent material, by the other luminescent material.

On the basis of the above findings, a display device using backlight was set up so that the backlight unit was composed of blue color light source emitting blue light, green light emitting section that contains green luminescent material emitting light on excitation by blue light and that emits green light, and red light emitting section that contains red luminescent material emitting light on excitation by blue light and that emits red light. The above green light emitting section and the red light emitting section were arranged so that each unit, at least a part of them, can function independently. This resulted in the increase in emission efficiency of the white light emitted and improvement in color rendering property of the display device, leading to the completion of the present invention.

Accordingly, the light emitting device of the present invention is characterized in that it comprises: at least one light source; at least one first emitting section having at least one sort of luminescent material that can emit light including a wavelength component that is longer than that of the light emitted from said light source when excited by the light emitted from said light source; at least one second emitting section having at least one sort of luminescent material that can emit light including a wavelength component that is longer than that of the light emitted from said first emitting section when excited by the light emitted from said light source and said first emitting section; and at least one light shielding unit that protects at least a part of the light emitted from said first emitting section from entering said second emitting section (claim 1). With this construction, the absorption of light coming from the first emitting section by the second emitting section is reduced, and, as a consequence, emission efficiency and color rendering of the light emitting device can be improved.

It is desirable that said light shielding unit reflects at least a part of the light emitted from said first emitting section (claim 2). This makes possible the efficient use of light emitted from the first emitting section and improves the emission efficiency and color rendering of the light emitting device.

The lighting system of the present invention is characterized by the use of the above-mentioned light emitting device (claim 3).

Further, the backlight unit for display device of the present invention is characterized by the use of the above-mentioned light emitting device (claim 4).

Further, the display device of the present invention is characterized by the use of the above-mentioned light emitting device (claim 5).

Another display device of the present invention is characterized in that it comprises: at least one backlight unit that emits backlight; and at least one image formation unit that forms images at the front side thereof when irradiated with the backlight emitted by said backlight unit on the back side thereof; wherein said backlight unit comprises: at least one light source; at least one first emitting section having at least one sort of luminescent material that can emit light including a wavelength component that is longer than that of the light emitted from said light source when excited by the light emitted from said light source; and at least one second emitting section formed at least partly independently of said first emitting section and having at least one sort of luminescent material that can emit light including a wavelength component that is longer than that of the light emitted from said first emitting section when excited by the light emitted from said light source and said first emitting section. (Claim 6). With this construction, both emission efficiency and color rendering property of the display device can be improved.

As another preferred feature of the present invention, the display device comprises: at least one backlight unit that emits white light; and at least one image formation unit that forms images at the front side thereof when irradiated with the white light emitted by said backlight unit on the back side thereof; wherein said backlight unit comprises: at least one blue color light source that emits blue light; at least one green light emitting section having green luminescent material that emits green light when excited by the blue light so as to emit green light; and at least one red light emitting section, formed at least partly independently of said green light emitting section, having red luminescent material that emits red light when excited by the blue light so as to emit red light (claim 7). Also with this construction, both emission efficiency and color rendering property of the display device can be improved.

It is preferred that the display device mentioned above comprises at least one diffusion plate, placed between said backlight unit and said image formation unit, so as to disperse the light emitted from said backlight unit (claim 8).

It is also preferred that the display device mentioned above comprises at least one optical waveguide so as to lead the light from said backlight unit to said image formation unit (claim 9).

Advantageous Effect of the Invention

The present invention makes possible the creation of a light emitting device which is excellent in both emission efficiency and color rendering.

The use of the light emitting device of the present invention makes possible the creation of a lighting system, backlight unit for display device, and display device which is excellent in both emission efficiency and color rendering.

Further, both emission efficiency and color reproduction property of a display device can be greatly improved through the use of the display device of the present invention.

BRIEF DESCRIPTION OF THE DRAWINGS

FIG. 1(a) is its cross-sectional view and FIG. 1(b) is its exploded perspective view.

FIG. 2(a) is its cross-sectional view and FIG. 2(b) is its exploded perspective view.

BEST MODE FOR CARRYING OUT THE INVENTION

Figure 1A:
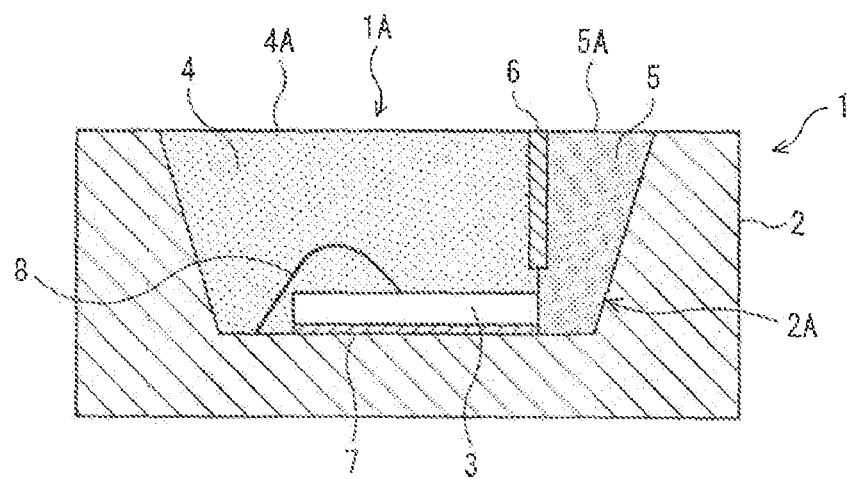
FIG. 1(a) and FIG. 1(b) show schematically the essential part of a light emitting device, as exemplified in a first embodiment of the present invention.

The present invention will now be explained in detail referring to examples. It should be borne in mind that the present invention is not limited to the below-described examples and can be modified any way insofar as it does not depart from the scope of the invention.

I. Explanation on Light Emitting Device

I-1. SUMMARY OF LIGHT EMITTING DEVICE

A light emitting device of the present invention is equipped with a light source, the first emitting section, the second emitting section and a light shielding unit, and is designed to emit light in the desired, predetermined direction (hereinafter referred to as "predetermined direction", as needed). Usually, the light emitting device has a frame which functions as a base to hold the light source, the first emitting section, the second emitting section and the light shielding unit.

I-1-1. Frame

The frame is a base to hold the light source, the first emitting section, the second emitting section and the light shielding unit, and no special limitation is imposed on its shape and its material.

As for specific examples of the frame shape, it can take any form such as board or cup, to cite a few, depending on its use. Among them, a cup-shaped frame is preferable because it can emit light in the desired direction, making possible the efficient use of light emitted from the light emitting device.

Various materials can be used to make a frame. They include inorganic materials such as metal, alloy, glass, carbon or ceramics, and organic materials such as synthetic resin. An appropriate one can be selected according to the method the frame is used.

Further, it is preferable to use for a frame material capable of liberating heat, for example, a material with high thermal conductivity. Usually, a light source releases heat during its use. A frame with a good heat liberation property assures its stable and continuous use even if heat is released during its use.

Furthermore, it is preferable to use, for a frame, a material with good electrical insulation property.

At this point, it is preferable that a surface of the frame, irradiated with light emitted from the light source, the first emitting section and the second emitting section, has a heightened reflectance with regard to at least some component of the irradiated light. It is more preferable that the reflectance is heightened for all the wavelength region of visible light. Therefore, it is preferable that at least a surface of the frame irradiated with light is made of material having high reflectance. Examples include materials (resin used for injection molding and the like) containing substances of high reflectance, such as glass fiber, alumina powder or titania powder. It is preferable to make the entire frame, or the surface of the frame, with such materials.

There is no special limitation on the method to increase the reflectance of the surface of a frame. In addition to selecting a suitable material for the frame itself as described above, it is possible to heighten the light reflectance by plating or evaporation-coating the frame with metal or alloy having high reflectance, such as silver, platinum or aluminum.

Enhanced light reflection can be provided to only a part of the frame or to the entire frame. It is preferable that all the surfaces irradiated with light from the light source, the first emitting section and the second emitting section have enhanced light reflectance.

Additionally, a frame has usually an electrode via which electric power is supplied to the light source.

I-1-2. Light Source

A light source emits exciting light capable of exciting luminescent materials contained in the first emitting section and the second emitting section. It also emits light constituting one component of light emitted from the light emitting device. In other words, a part of light from the light source is absorbed by luminescent materials of the first and the second emitting sections as exciting light, and another part is emitted from the light emitting device in the predetermined direction.

As light source can be used any kind of light source, depending on the use and constitution of the light emitting device. Examples of the light source include: light emitting diode (hereinafter, if necessary, called "LED"), edge-emitting or surface emitting laser diode, electroluminescence element or the like. Usually, inexpensive LED is preferable.

There is no special limitation on the wavelength of light emitted by the light source. Any light source capable of emitting light of suitable wavelength may be selected, depending on the light intended to be emitted from the light emitting device. When white light is intended to be emitted from the light emitting device, for example, the wavelength of light from the light source is usually 370 nm or higher, preferably 380 nm or higher, and usually 500 nm or lower, preferably 480 nm or lower.

As specific examples of light source can be cited LED based on semiconductors of InGaN system, GaAlN system, InGaAlN system or ZnSeS system with crystals grown on a baseboard such as silicon carbide, sapphire or gallium nitride by the MOCVD method and the like.

It is to be noted that one light source can be used singly, or two or more light sources can be used together. Also, one kind of light source can be used, or two or more kinds can be used together. In particular, it is preferable to use a separate light source for each of the first emitting section and the second emitting section to enhance the color rendering of the light emitting device.

In case a common light source is installed for the first emitting section and the second emitting section, instead of installing a separate, independent light source for each section, it is preferable to position the first emitting section closer to the light source than the second emitting section. In other words, the shortest distance between the light source and the first emitting section is preferably smaller than the shortest distance between the light source and the second emitting section.

Suppose that a light shielding unit blocks only a part of the light between the first emitting section and the second emitting section and that a light source is placed closer to the second emitting section than the first emitting section and the light emitted from the light source first enters the second emitting section. In that case, the second emitting section emits light on receiving light from the light source as exciting light. As the light thus emitted can not be used as exciting light of the first emitting section, light from the first emitting section may be deficient in intensity or light from the second emitting section may be too strong in intensity. This may result in the fluctuation of the components of light emitted by the light emitting device from the intended value, and leads to the lowering of color rendering. On the other hand, if the first emitting section is placed closer to the light source than the second emitting section, the light from the light source first enters the first emitting section, which is excited by that light and, as a result, emits light. In this way, both the first emitting section and the second emitting section can perform their emitting function as intended. This will result in little fluctuation of color components of the light emitted from the light emitting device and hence, promote color rendering further.

Even when the first emitting section is placed closer to the light source than the second emitting section, the intensity of the light entering the two sections is also related to other factors such as the surface area, where is irradiated with light from the light source, of the two light emitting sections. Therefore, the distance between the light source and each light emitting section, and the surface area of the two light emitting sections should be designed so that the intensity of the light from the light source at the first emitting section is greater than that at the second emitting section.

There is no special limitation on the method by which a light source is attached to a frame. Soldering is one such method. The kind of solder is not limited to any special one. For example, AuSn or AgSn can be used. In case it is attached by soldering, it is possible to supply electric power from an electrode, formed on the frame, via solder. Especially when high power LED or laser diode, in which the heat release matters, is used as light source, soldering is particularly useful because of its excellent heat dissipating property.

In case a method other than soldering is to be used to attach a light source to a frame, an adhesive agent such as epoxy resin, imide resin or acrylic resin can be used, for example. In this case, use can be made of a paste prepared by adding electroconductive filler such as silver particles or carbon particles to the adhesive agent, which makes possible the electric power supply to the light source by energizing the adhesive agent, similarly to when soldering is used. The use of electroconductive filler is desirable also from the viewpoint of increasing heat dissipating property.

Electric power can be supplied to a light source by any method. In addition to the above-mentioned methods via solder or adhesive agents, a light source and electrode can be connected by wire bonding. There is no limitation on the material or the size of the wire. For example, metals such as gold or aluminum can be used as materials and its diameter is usually in the range of 20 μm to 40 μm. The material or the size, however, is by no means limited by these examples.

As another example of the method of supplying electric power to a light source can be cited a method based on flip-chip mounting using a bump.

I-1-3. First Emitting Section and Second Emitting Section

The first emitting section is constructed to comprise at least one sort of luminescent material which is excited by light from a light source and emits light including a longer wavelength component than the light from the light source. There is no special limitation on the shape of the first emitting section. It can be installed as a single unit in one location, or as two or more units in more than one location. Luminescent materials used in the first emitting section will be described in detail later.

The first emitting section receives light from a light source as exciting light and, as a result, light is emitted by luminescent materials. Light emitted from the first emitting section constitutes a component of light emitted outside from the light emitting device. In case a light shielding unit prevents only a part of the light emitted from the first emitting section from entering the second emitting section, a part of light from the first emitting section functions as exciting light of the luminescent materials in the second emitting section.

The second emitting section, on the other hand, is constructed to comprise at least one luminescent material which is excited by light from a light source and also from the first emitting section and emit light containing longer wavelength component than light from the first emitting section. There is no special limitation on the shape of the second emitting section. It can be installed as a single unit in one location, or as two or more units in more than one location. Luminescent materials used in the second emitting section will be described in detail later.

The second emitting section receives light from a light source as exciting light and, as a result, light is emitted by luminescent materials. In case the second emitting section receives light from the first emitting section, this light also serves as exciting light, causing the luminescent materials to emit light. Light thus emitted from the second emitting section constitutes a component of light emitted outside from the light emitting device.

Furthermore, it is desirable that the first emitting section and the second emitting section mentioned above are opened to the outside of the device at their light exit side. The light exit side referred to here indicates a surface from which the light emitting device emits light in the predetermined direction. Accordingly, light emitted from light source, the first emitting section and the second emitting section is emitted from this light exit side in the predetermined direction. There is no limitation on the shape of the light exit side. Depending on the use of the device, a flat surface, curved surface, concavo-convex surface or the like may be selected. When the light emitted from the light emitting device is emitted in more than one direction, or emitted radially within a certain angle, it is usually so arranged that the strongest light is emitted in the predetermined direction.

That the first emitting section and the second emitting section are opened indicates that the light emitted from these sections in the predetermined direction is not blocked by other members. More concretely, light emitted from the first emitting section in the predetermined direction is emitted to the outside of the light emitting device without being blocked by the light source, light shielding unit, the second emitting section and the frame (if the device is fitted with a frame). Likewise, light emitted from the second emitting section in the predetermined direction is emitted to the outside of the light emitting device without being blocked by the light source, light shielding unit, the first emitting section and the frame (if the device is fitted with a frame). Even in case there is a protective layer formed on the light exit side, or there is a cover placed on the light emitting device, and light emitted from the first emitting section and the second emitting section must pass through these members before leaving the light emitting device, the first emitting section and the second emitting section are deemed opened if the protective layer, cover or the like is such that they allow the light to pass through.

As described above, the first emitting section and the second emitting section, opened at their light exit side, assures that the decrease in intensity of the light emitted from these first and second emitting sections, by making the light be absorbed in the other luminescent material or blocked by the other members, is kept small (or none at all). This can lead to the increase in emission efficiency, decrease in fluctuation of light components emitted from the light emitting device, and improvement in color rendering. That the light of three primary colors, blue, red and green, can be emitted from the light emitting device ensures excellent color reproduction property, subject to proper selection of the light source, the first emitting section and the second emitting section.

I-1-4. Light Shielding Unit

The function of the light shielding unit is to prevent the light emitted from the first emitting section from entering the second emitting section. At least, a part of light emitted by the first emitting section must be blocked from entering the second emitting section by this light shielding unit. Usually, light from the first emitting section should be blocked from entering the second emitting section to the extent that light emitted from the light emitting device has sufficiently high emission efficiency and color rendering to make the device practically usable. It is more preferable that all the light from the first emitting section is prevented from entering the second emitting section. In this way, light from the first emitting section can be blocked from being consumed as exciting light of the second emitting section. Decrease in light intensity of the first emitting section can thus be prevented, leading to an improvement in emission efficiency and color rendering of the light emitting device.

Furthermore, it is preferable that the light shielding unit is so designed as to reflect at least a part of the light emitted by the first emitting section. It is more preferable that the light shielding unit is so designed as to reflect all the light which is emitted by the first emitting section and is irradiated on the light shielding unit. This construction makes possible the efficient use of the light from the first emitting section, leading to enhanced emission efficiency and color rendering of the light emitting device.

In this connection, it is also preferable that the light shielding unit is so designed as to reflect at least a part of the light emitted by the second emitting section. It is more preferable that the light shielding unit is so designed as to reflect all the light which is emitted by the second emitting section and is irradiated on the shielding unit. This construction makes possible the efficient use of the light from the second emitting section, leading to enhanced emission efficiency and color rendering of the light emitting device.

Furthermore, it is preferable that the light shielding unit is so designed as to reflect at least a part of the light emitted by the light source. It is more preferable that the light shielding unit is so designed as to reflect all the light which is emitted by the light source and is irradiated on the shielding unit. This construction makes possible the efficient use of the light from the light source, leading to enhanced emission efficiency and color rendering of the light emitting device.

In concrete terms, it is preferable that at least a part of the surface of the light shielding unit has a high reflectance for at least some components of light irradiated on the light shielding unit (from either the light source, the first emitting section or the second emitting section). It is more preferable that it has a high reflectance for all the wavelength range of visible light. Therefore, it is preferable that, like the frame, at least its surface, irradiated with light, is made of materials having a high reflectance. As examples are cited materials containing high-reflectance substance like glass fiber, alumina powder, titanium powder and the like (for example, resin for injection molding). These materials can be used to manufacture the entire light shielding unit or the surface of the light shielding unit.

There is no special limitation on the method used to increase the reflectance of the surface of the light shielding unit. In addition to the selective use of the materials constituting the light shielding unit itself, as described above, it is possible to plate the unit with such metals as silver, platinum, aluminum or with alloys, which has high reflectance.

The surface with enhanced light reflectance can be the entire surface of the light shielding unit or a part thereof. Usually, it is preferred that the entire surface, irradiated with light from the light source, the first emitting section and the second emitting section has high reflectance.

There is no special limitation on the shape of the light shielding unit provided that it is capable of blocking at least a part of the light from the first emitting section from reaching the second emitting section. It can be shaped in the form of plate, net or mesh, placed between the first emitting section and the second emitting section. Further, the light shielding unit may be formed integrated with the frame, or separately therefrom. It is usually preferable, though, to decide the position of the light shielding unit so that the light emitting device can emit the intended light efficiently, taking into consideration the emission intensity of the first emitting section and the second emitting section.

It is preferred that a plurality of concave portions (such as cup-shaped recessions) is formed on the frame and each concave portion has the light source and the first or second emitting section, in the viewpoint of ease in production of the light emitting device. In this instance, each wall separating adjacent concave portions functions as light shielding unit. The display device having this constitution will be described in detail in the third embodiment.

There is no specific restriction on the material of light shielding unit, insofar as it can prevent at least a part of light from the first emitting section from entering the second emitting section. It may include inorganic materials such as metal, alloy or glass, and organic materials such as synthetic resin or carbon. An appropriate one can be selected according to the manner the unit is used. In particular, usually, a material that reflects and does not absorb the light from the first and second emitting sections, like described above, is preferably used.

In the light emitting device of the present invention, there provided a light shielding unit between the first and second emitting sections. This construction makes it possible to prevent the light emitted from the first emitting section from entering the second emitting section. This improves the emission efficiency and color rendering of the light emitting device. The explanation about this mechanism will be made in the following section.

Previously, when a part of the light is emitted from the first emitting section toward the second emitting section, the light enters the second emitting section and the luminescent material of the second emitting section absorbs the light from the first emitting section as exciting light. This means there occurs the consumption of the light emitted from the first emitting section by the second emitting section. Therefore, the intensity of the light from the first emitting section, intended to emerge outside of the light emitting device, gets lowered, leading to decrease in luminous flux of the light emerging from the light emitting device and thus in emission efficiency. In addition, as the light emitted from the first emitting section is consumed by the second emitting section, optical component balance of the light emerging from the light emitting device is fluctuated, leading to decrease in color reproduction of the light emitting device.

Moreover, in the conventional construction like Patent Document 1, it is necessary to enlarge the ratio of the luminescent material in the first emitting section against that in the second emitting section to obtain a desired color of the light emerging from the light emitting device, because of the compensation of light emitted from the first emitting section and absorbed in the second emitting section. However, color rendering of light emerging from the light emitting device depends on kinds and usage ratio of luminescent material. That is why the color rendering of the light has been liable to get insufficient, because usage ratio of luminescent material tends to drop out the optimal value very far in the conventionally constructed light emitting device like Patent Document 1.

In contrast to this, in the light emitting device of the present invention, the light shielding unit prevents light from the first emitting section from reaching the second emitting section. This leads to the protection of decrease in intensity of light emitted from the first emitting section and absorbed by the second emitting section. Consequently, emission efficiency of the light emitting device can be enhanced compared to the conventional one.

In addition, as the second emitting section can be prevented from absorbing light from the first emitting section and emitting light, fluctuation in optical component of the light from the light emitting device can be lowered. This leads to enhanced color rendering of the light emitting device, resulting in also improved color rendering and color reproduction property of the light emitting device.

The position, dimensions, shape or the like of components constituting the light emitting device may be decided arbitrarily, insofar as some exciting light (mainly, the light form the light source) can be applied to the first and the second emitting section and light emitted from the light source, first emitting section and second emitting section can emerge outside of the light emitting device.

For example, the first emitting section, second emitting section, light source and frame can be positioned apart from each, having a gap between each. As a specific example, there may be provided a gap between the first emitting section and second emitting section. As another example, there may be a gap between both or either of the first and second emitting sections and light source. As still another example, there may be a gap between both or either of the first and second emitting sections and light shielding unit.

Further, in case some distance is put between the first and second emitting sections, or between either or both of the first and second emitting sections and the light source, for them not to touch with each, some other members may be provided between them. At this point, it is preferable to use desired-light-permeable materials, such as glass or resins like epoxy resin or silicone resin, as other members, because they can maintain luminous flux to be high. As an specific example, a cover layer made of transparent resin can be formed on all circumferences of the light source. Although the first and second emitting sections are separated with this cover layer, light from the light source can be applied to the first and second emitting sections surely as exciting light in a state where the luminous flux is kept to be high. This makes it possible to protect the light source, without lowering intensity of the light emerging from the light emitting device.

In addition, the sizes of the first and the second emitting sections may differ, as mentioned above.

Also, the light emitting device of the present invention may comprise members other than the above-mentioned light source, first emitting section, second emitting section and frame.

For example, it may comprise a cover for protecting the light emitting device itself.

For another example, it may comprise a light guide member, such as mirror, prism, lens, optical fiber or the like, for changing the direction in which light emerges from the light emitting device.

It may also comprise a heat dissipation plate for releasing heat generated in the light emitting device.

It may further comprise, for example, a light diffusion layer or the like outside the light exit side of the light emitting device, for diffusing each component of the light emerging from the light emitting device so as to prevent the color irregularity of the light perceived visually.

I-2. COMPOSITION OF LIGHT EMITTING SECTION

Luminescent materials used in the light emitting device of the present invention can be any substances capable of absorbing excitation light and emitting light containing longer wavelength components than the absorbed exciting light. Luminescent materials are usually mixed with binders when used to form the first emitting section and the second emitting section.

I-2-1. Luminescent Materials

Luminescent materials can be selected from any known such substances, depending on the manner the light emitting devices are used. Light emission can be through any mechanism including fluorescence or phosphorescence. In the first emitting section as well as in the second emitting section, luminescent materials can be either a single sort of substance or a mixture of more than one sort of substances in any possible combination or in any possible ratio. However, luminescent materials in the first emitting section should be selected from those emitting light containing longer wavelength components than the light emitted by the light source, when excited by light from the light source. Luminescent materials in the second emitting section should be selected from those emitting light containing longer wavelength components than the light emitted by the first emitting section, when excited by light from the light source and the first emitting section.

As luminescent materials are preferred those substances absorbing excitation light at wavelength of usually 350 nm or longer, preferably 400 nm or longer, more preferably 430 nm or longer, and absorbing excitation light at wavelength of usually 600 nm or shorter, preferably 570 nm or shorter, more preferably 550 nm or shorter.

Furthermore, luminescent materials are preferably those substances emitting light at wavelength of usually 400 nm or longer, preferably 450 nm or longer, more preferably 500 nm or longer, and emitting light at wavelength of usually 750 nm or shorter, preferably 700 nm or shorter, more preferably 670 nm or shorter.

Regarding luminescent materials of the first emitting section in particular, it is preferable to use those substances absorbing excitation light at wavelength of usually 350 nm or longer, preferably 400 nm or longer, more preferably 430 nm or longer, and absorbing light at wavelength of usually 520 nm or shorter, preferably than 500 nm or shorter, more preferably 480 nm or shorter.

Furthermore, luminescent materials of the first emitting section should be those substances emitting light at wavelength of usually 400 nm or longer, preferably 450 nm or longer, more preferably 500 nm or longer, and emitting light at wavelength of usually 600 nm or shorter, preferably 570 nm or shorter, more preferably 550 nm or shorter.

On the other hand, as luminescent materials of the second emitting section are preferred those substances absorbing excitation light at wavelength of usually 400 nm or longer, preferably 450 nm or longer, more preferably 500 nm or longer, and absorbing light at wavelength of usually 600 nm or shorter, preferably 570 nm or shorter, more preferably 550 nm or shorter.

Furthermore, luminescent materials of the second emitting section are preferably those substances emitting light at wavelength of usually 550 nm or longer, preferably 580 nm or longer, more preferably 600 nm or longer, and emitting light at wavelength of usually 750 nm or shorter, preferably 700 nm or shorter, more preferably 670 nm or shorter.

It is preferable to use luminescent materials having luminous efficiency of usually 40% or longer, preferably 45% or longer, more preferably 50% or longer, still more preferably 55% or longer, most preferably 60% or longer. The luminous efficiency mentioned here represents a product of quantum absorbing efficiency and internal quantum efficiency.

In the following section, preferable luminescent materials to be used in the light emitting device of the present invention will be explained, by exemplifying those suitable for each emitting section. It should be noted that luminescent materials are not limited to those exemplified in the following section, and each substance can be used either for the first emitting section or for the second emitting section, within the scope of the present invention.

(Examples of Suitable Luminescent Materials of the First Emitting Section)

(First Example of the First Emitting Section)

As the first example of the suitable luminescent materials of the first emitting section can be cited the phosphor described by the formula (1) below.

$$M^1_a M^2_b M^3_c O_d \quad \text{Formula (1)}$$

In the formula (1) above, $M^1$, $M^2$, and $M^3$ represent a bivalent metal element, a trivalent metal element, and a tetravalent metal element, respectively, and a, b, c, and d indicate values in the range shown below.

$2.7 \leq a \leq 3.3$
$1.8 \leq b \leq 2.2$
$2.7 \leq c \leq 3.3$
$11.0 \leq d \leq 13.0$ In the formula (1) above, $M^1$ is a bivalent metal element. In view of luminous efficiency or the like, it is preferably at least one type of element selected from the group consisting of Mg, Ca, Zn, Sr, Cd, and Ba, more preferably one element selected from Mg, Ca, and Zn. Ca is particularly preferable. In this instance, Ca can be used either singly or in combination with Mg. In principle, $M^1$ should consist of the elements referred to above as preferable. However, it can contain other bivalent metal elements, as far as efficiency is not impaired.

In the formula (1) above, $M^2$ is a trivalent metal element. As is the case with $M^1$, it is preferably at least one type of element selected from the group consisting of Al, Sc, Ga, Y, In, La, Gd, and Lu, more preferably one element selected from Al, Sc, Y, and Lu. Sc is particularly preferable. In this instance, Sc can be used either singly or in combination with Y or Lu. In principle, $M^2$ should consist of the elements referred to above as preferable. However, it can contain other trivalent metal elements, as far as efficiency is not impaired.

In the formula (1) above, $M^3$ is a tetravalent metal element. From the same consideration as for $M^1$ and $M^2$, it is preferable that $M^3$ contains Si as a minimum requirement. The content of Si in $M^3$ is usually preferably 50 mole % or more, more preferably 70 mole % or more, far more preferably 80 mole % or more, most preferably 90 mole % or more.

In the formula (1) above, apart from Si, tetravalent $M^3$ is preferably at least one type of element selected from the group consisting of Ti, Ge, Zr, Sn and Hf, more preferably one element selected from Ti, Zr, Sn and Hf. Of these, Sn is most preferred. The most preferred $M^3$ element is Si. In principle, $M^3$ should consist of the elements referred to above as preferable. However, it can contain other tetravalent metal elements, as far as efficiency is not impaired.

In this specification, efficiency is deemed not impaired if the content of other elements, relative to above-mentioned $M^1$, $M^2$ and $M^3$, is 10 mole % or lower, preferably 5 mole % or lower, more preferably 1 mole % or lower.

The crystal structures of the above-mentioned phosphors are usually one of the garnet crystal structures. This is usually a body centered cubic lattice crystal where a, b, c and d in the formula (1) above represent the value of 3, 2, 3 and 12, respectively. However, in case where, for example, the element constituting the luminescent center ion occupies the position of the crystal lattice of one of the metal ions of $M^1$, $M^2$, and $M^3$, or is located in the interstice, a, b, c and d may deviate from the above values, that is, 3, 2, 3 and 12. It is, therefore, preferred that a, b, c and d falls within the following range: $2.7 \leq a \leq 3.3$, $1.8 \leq b \leq 2.2$, $2.7 \leq c \leq 3.3$ and $11.0 \leq d \leq 13.0$.

The luminescent center ion, contained in the host material of the above-mentioned crystal structure, is required to contain at least Ce. For the fine adjustment of its fluorescence property, it may contain at least one type of divalent to tetravalent element selected from the group consisting of Cr, Mn, Fe, Co, Ni, Cu, Pr, Nd, Sm, Eu, Tb, Dy, Ho, Er, Tm and Yb. Preferably, it contains at least one type of divalent to tetravalent element selected from the group consisting of Mn, Fe, Co, Ni, Cu, Sm, Eu, Tb, Dy and Yb. Divalent Mn, divalent to trivalent Eu, or trivalent Tb is particularly preferred to be used.

This phosphor is usually excited by light whose wavelength is in the range of 420 nm to 480 nm. The emission spectrum is in the range of 450 nm to 650 nm with its peak in the range of 500 nm to 510 nm.

As concrete examples of the phosphor described above are cited $Ca_3Sc_2Si_3O_{12}$:Ce, $Ca_3(Sc,Mg)_2Si_3O_{12}$:Ce etc.

(Second Example of the First Emitting Section)

As the second example of suitable luminescent materials of the first emitting section can be cited the phosphors described by the formula (2) below.

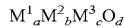  Formula (2)

$$M^1_a M^2_b M^3_c O_d$$

In the formula (2) above, $M^1$ is an activating element that contains Ce as a minimum requirement, $M^2$ is a bivalent metal element, $M^3$ is a trivalent metal element, and a, b, c and d indicate values in the range shown below.

$0.0001 \leq a \leq 0.2$
$0.8 \leq b \leq 1.2$
$1.6 \leq c \leq 2.4$
$3.2 \leq d \leq 4.8$ In the formula (2) above, $M^1$ represents an activating element contained in a host crystal referred to later, and contains Ce as a minimum requirement. For the purpose of improving light storage property, chromaticity adjustment or intensification, it can contain at least one type of divalent to tetravalent element selected from the group consisting of Cr, Mn, Fe, Co, Ni, Cu, Ce, Pr, Nd, Sm, Eu, Tb, Dy, Ho, Er, Tm and Yb.

In the formula (2) above, a, which represents the content of activating element $M^1$, is a value in the range of $0.0001 \leq a \leq 0.2$. In case the value of a is too small, the number of the luminescent center ions in the host crystal of the phosphor is small and this may result in the lowering of emission intensity. On the other hand, if the value of a is too large, concentration quenching may occur, resulting in the lowering of emission intensity. In terms of emission intensity, therefore, the value of a is preferably 0.0005 or larger. More preferably, it is 0.002 or larger. On the other hand, it is preferably 0.1 or smaller. More preferably, it is 0.04 or smaller. As the content of Ce becomes higher, the emission peak wavelength is shifted to a longer wavelength region resulting in a relative increase in the emitting amount of green light component having high visual sensitivity. Therefore, from the viewpoint of desirable balance of emission intensity and emission peak wavelength, the preferable value of a is usually 0.004 or larger. More preferably, it is 0.008 or larger. Still more preferably, it is 0.02 or larger. On the other side, it is preferably 0.15 or smaller. More preferably, it is 0.1 or smaller. Still more preferably, it is 0.08 or smaller.

In the formula (2) shown above, $M^2$ is a bivalent metal element. From the standpoint of luminous efficiency, it is preferably at least one type of element selected from the group consisting of Mg, Ca, Zn, Sr, Cd and Ba, more preferably one element selected from Mg, Ca, and Sr. It is particularly preferable that Ca accounts for 50 mole % or more of the elements of $M^2$.

In the formula (2) shown above, $M^3$ is a trivalent metal element. From the same consideration as for $M^2$, it is preferably at least one type of element selected from the group consisting of Al, Sc, Ga, Y, In, La, Gd, Yb and Lu, more preferably one element selected from Al, Sc, Yb and Lu. Far more preferable is Sc or a combination of Sc and Al or a combination of Sc and Lu. It is particularly preferable that Sc accounts for 50 mole % or more of the elements of $M^3$.

The host crystal of the above-mentioned phosphor is usually a crystal represented by the composition $M^2 M^3_2 O_4$, which consists of a divalent metal element $M^2$, trivalent metal element $M^3$ and oxygen. In terms of chemical composition, therefore, b, c and d in the formula (2) above indicate a number of 1, 2 and 4, respectively. However, in case where, for example, the activating element Ce occupies the position of the crystal lattice of the metal elements $M^2$ or $M^3$, or is located in the interstice, b, c and d may deviate from the above-mentioned values, that is, 1, 2 and 4.

In the formula (2) above, b represents a value which is usually 0.8 or larger, preferably 0.9 or larger. It is usually 1.2 or smaller, preferably 1.1 or smaller. And, c represents a value which is usually 1.6 or larger, preferably 1.8 or larger. It is usually 2.4 or smaller, preferably 2.2 or smaller. Further, d represents a value which is usually 3.2 or larger, preferably 3.6 or larger. It is usually 4.8 or smaller, preferably 4.4 or smaller.

In the formula (2) above, $M^2$ and $M^3$ represent a divalent metal element and a trivalent metal element, respectively. A very small amount of $M^2$ and/or $M^3$ can be replaced by univalent, tetravalent or pentavalent metal element so as to adjust the balance of the electric charge or the like, if that replacement does not cause any fundamental change in light emitting characteristics or crystal structure of the phosphor. Further, the phosphor can also contain a minute amount of anions such as halogen (F, Cl, Br, I), nitrogen, sulfur or selenium.

This phosphor is excited by light whose wavelength is in the range of 420 nm to 480 nm. The most efficient excitation range is 440 nm to 470 nm. The emission spectrum is in the range of 450 nm to 700 nm with its peak in the range of 490 nm to 550 nm.

(Other Example of the First Emitting Section)

The following are other examples of suitable luminescent materials of the first emitting section: $Y_3(Al, Ga)_5O_{12}$:Ce, $(Ba, Ca, Sr)MgAl_{10}O_{17}$:Eu, $(Ba, Mg, Ca, Sr)_5(PO_4)_3Cl$:Eu, $(Ba, Ca, Sr)_3MgSi_2O_8$:Eu, which have a peak wavelength between 400 nm and 500 nm; $(Ba, Ca, Sr)MgAl_{10}O_{17}$:Eu, Mn, $(Ba, Ca, Sr)Al_2O_4$:Eu, $(Ba, Ca, Sr)Al_2O_4$:Eu, Mn, $(Ca, Sr)Al_2O_4$:Eu, Eu-activated α-sialon represented by the general formula $Ca_xSi_{12-(m+n)}Al_{(m+n)}O_nN_{16-n}$:Eu(0.3<x<1.5, 0.6<m<3, 0≦n<1.5), which have a peak wavelength between 500 nm and 600 nm. It should be noted that the above examples are by no means restrictive.

The above mentioned phosphors can be used either singly or as combination of more than one phosphors in any possible combination and in any possible ratio.

Of the phosphors exemplified above, those having a garnet crystal structure are preferred because they are resistant against heat, light and water. As a concrete example of phosphors having a garnet crystal structure can be cited a phosphor that has previously been cited as the first example of green light emitting phosphor and $Y_3(Al, Ga)_5O_{12}$:Ce.

(Examples of Substances Suitable as Luminescent Materials of the Second Emitting Section)

(First Example of the Second Emitting Section)

As the first example of suitable luminescent materials of the second emitting section can be cited the phosphors described by the formula (3) below.

$$M_aA_bD_cE_dX_e \quad \text{Formula (3)}$$

In the formula (3) above, M represents one or more than one elements selected from the group consisting of Mn, Ce, Pr, Nd, Sm, Eu, Tb, Dy, Ho, Er, Tm and Yb. It contains Eu as a minimum requirement. A represents one or more than one elements selected from bivalent metal elements other than M. D represents one or more than one elements selected from tetravalent metal elements. E represents one or more than one elements selected from trivalent metal elements. X represents one or more than one elements selected from O, N, and F.

In the formula (3) above, a, b, c, d and e indicate a value in the range shown below.

$0.00001 \leq a \leq 0.1$
$a+b=1$
$0.5 \leq c \leq 4$
$0.5 \leq d \leq 8$
$0.8 \times (\frac{2}{3} + \frac{4}{3} \times c + d) \leq e$
$e \leq 1.2 \times (\frac{2}{3} + \frac{4}{3} \times c + d)$ In the formula (3) above, M represents one or more than one elements selected from the group consisting of Mn, Ce, Pr, Nd, Sm, Eu, Tb, Dy, Ho, Er, Tm and Yb. It contains Eu as a minimum requirement. More preferably, M represents one or more than one elements selected from the group consisting of Mn, Ce, Sm, Eu, Tb, Dy, Er, and Yb. Eu is the particularly preferable element.

In the formula (3) above, A represents one or more than one elements selected from bivalent metal elements other than M. Preferably, it represents one or more than one elements selected from Mg, Ca, Sr and Ba. Particularly preferable is Ca or a mixed system consisting of Ca and Sr.

Furthermore in the formula (3) above, D represents one or more than one elements selected from tetravalent metal elements. Preferably, it represents one or more than one elements selected from the group consisting of Si, Ge, Sn, Ti, Zr and Hf. Si is the particularly preferable element.

In the formula (3) above, E represents one or more than one elements selected from trivalent metal elements. Preferably, it represents one or more than one elements selected from the group consisting of B, Al, Ga, In, Sc, Y, La, Gd and Lu. Al is the particularly preferable element.

Furthermore in the formula (3) above, X represents one or more than one elements selected from O, N, and F. Particularly preferred is N or a combination of N and O.

In the formula (3) above, a represents the content of M element which plays the role of luminescent center. It is preferable to set a, the ratio of the number of M atom to the number of (M+A) atom in the phosphor {a=(number of M atom/(number of M atom+number of A atom)), at 0.00001 or larger, and 0.1 or smaller. If the value of a is smaller than 0.00001, the number of M element constituting the luminescent center is small and this may result in the lowering of emission brightness. If the value of a is larger than 0.1, concentration quenching due to interaction among M ions themselves may occur, resulting in the lowering of emission brightness. In case the M element is Eu, it is preferable that the value a is set in the range of 0.002 or larger, and 0.03 or smaller, as it can have high emission brightness then.

Furthermore, in the formula (3) above, c represents the content of D element such as Si, and falls in the range of $0.5 \leq c \leq 4$. Preferably, the value of c is in the range $0.5 \leq c \leq 1.8$, more preferably c is 1. It is likely that emission brightness decreases in case the value of c is smaller than 0.5, and in case it is larger than 4. In the range $0.5 \leq c \leq 1.8$, emission brightness is high. It is particularly high in case the value of c is 1.

Furthermore, in the formula (3) above, d represents the content of E element such as Al and falls in the range of $0.5 \leq d \leq 8$. Preferably, the value of d is in the range $0.5 \leq d \leq 1.8$, more preferably d is 1. It is likely that emission brightness decreases in case the value of d is smaller than 0.5, and in case it is larger than 8. In the range $0.5 \leq d \leq 1.8$, emission brightness is high. It is particularly high in case the value of d is 1.

Furthermore, in the formula (3) above, e represents the content of X element such as N. The value of e is larger than or equal to $0.8 \times \{(\frac{2}{3})+(\frac{4}{3}) \times c+d\}$, and smaller than or equal to $1.2 \times \{(\frac{2}{3})+(\frac{4}{3}) \times c+d\}$. It is more preferable that e takes the value of 3. In case the value deviates outside the above range, emission brightness is likely to decrease.

Of the compositions mentioned above, the preferable composition ensuring high emission brightness is such that it contains Eu as M element, Ca as A element, Si as D element, Al as E element, and N as X element as a minimum requirement. It is particularly preferable that it is an inorganic compound in which M element is Eu, A element is Ca, D element is Si, E element is Al, and X element is N or a mixture of N and O.

This phosphor is excited by light whose wavelength is at least 580 nm or lower, the most efficient range being 400 nm to 550 nm. It, therefore, absorbs light coming from the first emitting section most efficiently. The emission spectrum has its peak in the range of 580 nm to 720 nm.

(Second Example of the Second Emitting Section)

As the second example of suitable luminescent materials of the second emitting section can be cited the phosphors described by the formula (4) below.

$$Eu_aCa_bSr_cM_dS_e \quad \text{Formula (4)}$$

In the formula (4) above, M represents at least one element selected from Ba, Mg, and Zn and a, b, c d and e indicate a value in the range shown below.

$0.0002 \leq a 0.02$
$0.3 \leq b \leq 0.9998$
$0 \leq d \leq 0.1$
$a+b+c+d=1$
$0.9 \leq e \leq 1.1$ In terms of thermal stability, the preferable range of a in the formula (4) above is usually 0.0002 or larger, more preferably 0.0004 or larger, and usually 0.02 or smaller.

In terms of temperature characteristics, the preferable range of a in the formula (4) above is usually 0.0004 or larger, and usually 0.01 or smaller. Preferably, it is 0.007 or smaller, more preferably 0.005 or smaller and still more preferably 0.004 or smaller.

From the viewpoint of emission intensity, the preferable range of a in the formula (4) above is usually 0.0004 or larger. More preferably, it is 0.001 or larger. On the other hand, it should usually be 0.02 or smaller. Preferably, it is 0.008 or smaller. If the content of $Eu^{2+}$, the luminescent center ion, is smaller than that range described above, emission intensity tends to be lowered. On the other hand, if the value of a is larger than that range described above, the phenomenon of concentration quenching occurs, this also causing the lowering of emission intensity.

Taking into consideration all of thermal stability, temperature characteristics and emission intensity, the preferable range of a in the formula (4) above is usually 0.0004 or larger, more preferably 0.001 or larger, and usually 0.004 or smaller.

In the fundamental crystal structure $Eu_aCa_bSr_cM_dS_e$ in the formula (4) above, the molar ratio of the cationic site, occupied by Eu, Ca, Sr or M, and anionic site, occupied by S, is 1:1. Cationic deficiency or anionic deficiency, even if present to a small extent, does not seriously affect the fluorescence performance, required in the present invention. Therefore, the fundamental crystal of the above formula (4) may be used, with the molar ratio e of the anionic site occupied by S above being in the range of 0.9 or larger and 1.1 or smaller.

In the phosphor described in the formula (4) above, M, which represents at least one type of element selected from the group consisting of Ba, Mg, and Zn, is not necessarily an essential element in the present invention. However, even when it is contained in phosphor represented by the formula (4) with a molar ratio d of M, which is $0 \leq d \leq 0.1$, the object of the present invention can be achieved.

The presence of elements other than Eu, Ca, Sr, Ba, Mg, Zn and S, contained as impurities in the phosphor shown in the formula (4) above, does not adversely affect its use if the content is 1% or less.

This phosphor is excited by light of the wavelength of 600 nm or shorter. The most efficient excitation is obtained at 400 nm to 550 nm and, therefore, it absorbs well the light emitted from the first emitting section. The emission spectrum has its peak at 620 nm to 680 nm.

[Other Examples of the Second Emitting Section]

Luminescent materials of the second emitting section can be any other substances emitting light of the wavelength of 550 nm to 750 nm, which is longer than the light from the first emitting section. Examples include the following: Eu-activated α-sialon represented by the general formula $Ca_xSi_{12-(m+n)}Al_{(m+n)}O_nN_{16-n}$:Eu (here, $0.3<x<1.5$, $0.6<m<3$, $0 \leq n<1.5$), $Ca_2Si_5N_8$:Eu, $CaSi_7N_{10}$:Eu, and Europium complex emitting fluorescence.

The above phosphors can be used either singly or as any combination of more than one substances in any possible combination and in any possible ratio.

[Diameter or the Like of Luminescent Materials]

Luminescent materials are usually used as particles. The diameter of the particles of the luminescent materials is usually 150 μm or smaller. Preferably, the diameter is 50 μm or smaller, more preferably, 20 μm or smaller, still more preferably 10 μm or smaller, most preferably 5 μm or smaller. If the diameter is larger than the above range, the fluctuation of the luminescent color emerging from light emitting device tends to be larger. It is also likely that uniform application of luminescent materials becomes difficult in case luminescent materials are mixed with a sealing agent. The diameter is usually 0.001 μm or larger. Preferably, it is 0.01 μm or larger, more preferably, 0.1 μm or larger, still more preferably 1 μm or larger, most preferably 2 μm or larger. Luminous efficiency is lowered below the above range.

The volume ratio of the luminescent materials of the second emitting section to that of the first emitting section may take any value. The ratio is usually 0.05 or larger, preferably 0.1 or larger, more preferably 0.2 or larger, and usually 1 or smaller, preferably 0.8 or smaller, more preferably 0.5 or smaller. It is difficult to obtain desirable white light when this ratio is too large or too small.

In case a binder is not used in preparing the first emitting section and the second emitting section, luminescent materials can be calcinated, for example, and it is possible to use these sintered substances directly for the first and the second emitting sections. Otherwise, luminescent materials can be made into glass, or single crystals of these substances can be manipulated, to prepare the first emitting section and the second emitting section without using a binder. It is also possible to add other additives and the like to the light emitting sections in the absence of a binder.

To the second emitting section are added luminescent materials, which are excited by light from the light source and first emitting section, and emit light containing longer wavelength component than the first emitting section, binder and other additional components. Furthermore, luminescent materials in the first emitting section can be added to the second emitting section. However, it is preferable to keep the concentration of the luminescent materials of the first emitting section contained in the second emitting section small in order to obtain a larger luminous flux. It is more preferable that the second emitting section does not contain luminescent materials of the first emitting section.

On the other hand, the first emitting section does not usually contain luminescent materials of the second emitting section. However, it may contain the luminescent materials of the second emitting section as long as luminous flux from the first emitting section does not decrease due to such substances. It is preferable that the volume of such substances in the first emitting section is less than or equal to 40 volume %. It is more preferable that the luminescent materials of the second emitting section are not contained at all. Luminescent materials of the second emitting section can be excited by the light emitted from the first emitting section. However, in the first emitting section, light emitted by the luminescent materials of the first emitting section should not be absorbed excessively by the co-existing luminescent materials of the second emitting section. Luminescent materials of each section should be selected so that the above requirement is met.

I-2-2. Binder

As is mentioned above, the first and the second emitting sections may contain binders in addition to luminescent materials. Binders are usually used to bind together luminescent materials present in the powder form or in the particulate form, or to attach luminescent materials to a frame. There is no specific limitation on the binder of the present invention, and any known types of it may be used arbitrarily.

However, in case light emitting devices are constructed to be transmissive type, which is composed in such a way that the light emitted from the light source, the first emitting section and the second emitting section passes through the first emitting section or the second emitting section before leaving the light emitting device towards outside, it is preferable to select as binder such substances which permit transmission of every component of light emitted by the light emitting device.

Resins and inorganic materials such as glass can be used as binder. Concrete examples include resins prepared by organic synthetic resin such as epoxy resins or silicone resins, and inorganic material such as polysiloxane gel or glass.

When resin is used as binder, no particular limitation is imposed on its viscosity. It is desirable to select a binder having suitable viscosity, taking into consideration the particle diameter and specific gravity, especially specific gravity per unit surface area, of luminescent materials used. For example, when epoxy resin is used as binder and particle diameter of luminescent materials is in the range of 2 μm to 5 μm with its specific gravity in the range of 2 to 5, it is desirable to use epoxy resin with viscosity of 1 Pas to 10 Pas. Under this condition, luminescent materials can be dispersed well.

It is to be noted that one kind of binder can be used singly, or two or more kinds of binders can be used in any combination and in any ratio.

I-2-3. Ratio of Luminescent Material Used

In case binder is added to the luminescent material, luminescent materials and binders can be mixed in any ratios. The weight ratio of luminescent materials to binder is usually set to be larger than or equal to 0.01. Preferably, it is set to be larger than or equal to 0.05, and more preferably, it is set to be larger than or equal to 0.1. The ratio should usually be less than or equal to 5. Preferably, it is less than or equal to 1, and more preferably, it is less than or equal to 0.5.

With a transmissive-type light emitting device, it is preferred that the luminescent materials are properly dispersed in the first emitting section and the second emitting section in order to obtain larger luminous flux. On the other hand, with a light emitting device of light reflection type (namely, light from light source, the first emitting section and the second emitting section leaves the light emitting device towards outside without passing through the first and the second emitting sections), it is preferred that luminescent materials are packed in high density in order to obtain larger luminous flux. The ratio of the luminescent materials and binder should be decided, as well as from the above-mentioned viewpoint, taking into consideration the use of light emitting device, kind and physicochemical property of luminescent materials, and kind and viscosity of binders.

The color of light emitted from a light emitting device can be modified any way by adjusting the ratio of the luminescent materials of the first emitting section and the second emitting section and by adjusting the amount of each luminescent material used. Thus, in addition to light with the chromaticity coordinate of (x=0.333, y=0.333), it is possible to obtain intermediate-color light with the chromaticity coordinates of (x=0.47, y=0.42), (x=0.35, y=0.25), (x=0.25, y=0.30), and (x=0.30, y=0.40).

I-2-4. Other Components

Luminescent materials may contain additional components so that the first emitting section and second emitting section consist of luminescent materials, appropriately used binders and other additional components.

Additional components are not limited to specific compounds and any known additives can be used. For example, in order to control light distribution characteristics or color mixing, diffusion agents such as alumina or yttria are preferred as additional components. When luminescent materials are packed in high density, adhesive agents such as calcium pyrophosphate or barium calcium borate are preferable as additional components.

I-2-5. Method of Production of Light Emitting Section

The method of production of the first and the second emitting sections are not limited to any specific method. These units can be produced in any way. Examples of the production method will be described below. It should be noted that methods other than those described here are also possible.

The first and the second emitting sections can be produced, for example, by first preparing slurry through dispersing luminescent materials, appropriately selected binder and additional components in a dispersion medium, and by potting or coating the prepared slurry onto a base material such as a frame, followed by drying the slurry.

Slurry can be prepared by mixing into a dispersion medium luminescent materials, appropriately selected binder and additional components. Slurry may be termed paste or pellet depending on what is used as binder. In this specification, the term slurry is used throughout.

The dispersion medium used for the preparation of slurry is not limited to specific compounds, and thereby any known dispersion medium may be used. The examples include the following: chain hydrocarbons such as n-hexane, n-heptane or Solvesso, aromatic hydrocarbons such as toluene or xylene, halogenated hydrocarbons such as trichloroethylene or perchloroethylene, alcohols such as methanol, ethanol, isopropanol or n-butanol, ketones such as acetone, methylethyl ketone or methylisobutyl ketone, esters such as ethyl acetate or n-butyl acetate, ethers such as cellosolve, butylsolve or cellosolve acetate, aqueous solvents such as water or any aqueous solutions.

Then, slurry prepared is applied onto the base material such as a frame. There is no limitation on the method of application. Methods such as dispensing or potting can be used.

In case slurry is applied directly on the frame, the order of application of slurry to be the first emitting section and the second emitting section need not be fixed. Either section can be coated first or the two sections can be coated simultaneously.

After application, dispersion medium is evaporated by drying to prepare the first emitting section and the second emitting section. There is no limitation on the method of drying. Examples include natural drying, heated-air drying, vacuum drying, baking, UV curing, and electron irradiation. In particular, baking at several tens ° C. to one hundred and several tens ° C. is preferable because it requires only inexpensive equipment with dispersion medium removed efficiently.

In case luminescent materials are packed in high density in order to manufacture a light emitting device of light reflection type, as descried earlier, it is preferable to add an adhesive agent to slurry as an additional component. Further, when slurry containing an adhesive agent is applied, it is preferable to use such methods as screen printing or ink jet printing, because it is then easy to compartmentalize the first emitting section and the second emitting section. Needles to say, usual methods of application can also be used even when an adhesive agent is used.

Further, the first emitting section and the second emitting section can be prepared without using slurry. For example, luminescent materials and appropriately selected binder or other additives are mixed, kneaded and molded into the first emitting section and the second emitting section. The method of molding includes: press molding, extrusion molding (T-die extrusion, inflation extrusion, blow molding, melt spinning, contour extrusion and the like), and injection molding.

In case a binder is thermosetting like epoxy resin or silicone resin, it is possible to prepare the first emitting section and the second emitting section by first mixing a binder, not yet cured, luminescent materials and appropriately selected other components, then by molding and heating the mixture to cure the binder. In case a binder is UV-curable, it is possible to cure the binder resin by UV curing to make the first emitting section and the second emitting section, instead of heating in the above-mentioned process.

The first emitting section and the second emitting section can be prepared as one process of manufacturing the light emitting device. Otherwise, these units can be prepared as independent units first, and later incorporated into the frame. Furthermore, it is also possible to prepare a unit combining the frame and either the first emitting section or the second emitting section. The light emitting device can be completed by assembling these units.

In this connection, there is no limitation to the way in which a light shielding unit is set up. For example, the first and the second emitting sections are made first, followed by setting a light shielding unit between them. Otherwise, a light shielding unit can be introduced in a frame first, and then the first and the second emitting sections are formed by applying the above-mentioned slurry and the like in the groove partitioned by the light shielding unit.

I-3. EMBODIMENTS

In the following section are explained various embodiments in which the present invention is executed. The present invention is not restricted to the following embodiments, but any modification is allowed within the scope of the present invention.

I-3-1. First Embodiment

Figure 1B:
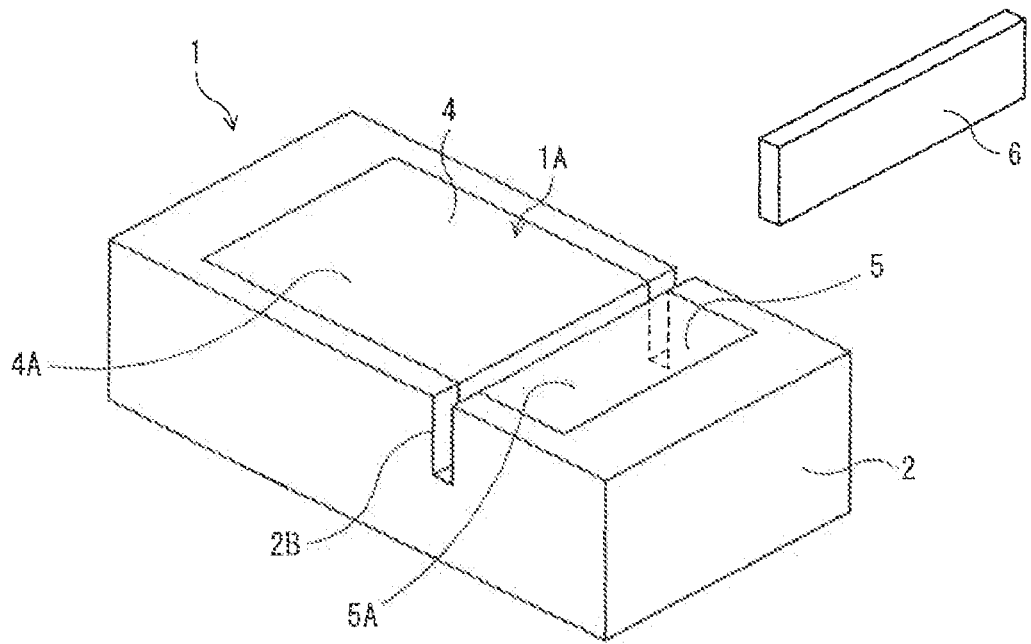

FIG. 1(a) and FIG. 1(b) show schematically the essential parts of a light emitting device as a first embodiment of the present invention. FIG. 1(a) is a cross-sectional view, and FIG. 1(b) is an exploded perspective view, with a divider plate removed for ease of explanation.

As shown in FIG. 1(a) and FIG. 1(b), the light emitting device 1 of the present embodiment consists of frame 2, blue LED (blue emitting section) 3, which is a light source, green light emitting section 4, which functions as the first emitting section, red light emitting section 5, which functions as the second emitting section, and divider plate 6, which functions as light shielding unit.

Frame 2 constitutes a resinous base to hold blue LED 3, green light emitting section 4, red light emitting section 5 and divider plate 6. On the upper side of the frame 2, a concave portion (a recession) 2A opening upward in Figs., whose cross-sectional view is trapezoidal, is formed. Therefore, the frame 2 is cup-like shaped and thus, enables the light to be emitted from the light emitting device 1 in the predetermined direction, leading to the effective use of emitted light. The dimension of the concave portion 2A of the light emitting device 1 (such as the gradient of the slope or depth from the open end to the bottom) is arranged so that light can be emitted from the light emitting device 1 in the predetermined direction (upwards in the Figs.).

At the bottom of the concave portion 2A, there is an electrode (not shown in the Figs.) and electric power is supplied from outside the light emitting device 1 to the blue LED 3 through that electrode.

The inner surface of the concave portion 2A of the frame 2 is metal plated and has a high reflectance through the entire region of visible light. Thereby, light irradiated on the inner surface of the concave portion 2A of the frame 2 can emerge from the light emitting device 1 in the predetermined direction. Needless to say, care must be taken so that short circuit does not occur between the metal plating and the electrode.

At the bottom of the concave portion 2A of the frame 2 is installed a blue LED 3 as light source. Blue LED is a LED which emits blue light on electric power supply. Part of the blue light emitted by blue LED 3 is absorbed by luminescent material (in this case phosphor) in the green light emitting section 4 and red light emitting section 5 as exciting light. Another part is designed to leave the light emitting device 1 in the predetermined direction (here, upwards in the Figs.).

As mentioned above, blue LED 3 is installed at the bottom of the concave portion 2A of frame 2. Frame 2 and blue LED 3 are connected by means of silver paste (that is, a mixture of an adhesive agent and particles of silver) 7. Blue LED 3 rests on frame 2 by this mechanism. Furthermore, silver paste 7 plays a role in dissipating heat generated by blue LED 3.

Furthermore, frame 2 is fitted with a metal wire 8, which supplies electric power to blue LED 3. Namely, the blue LED 3 and the electrode (not shown in the Figs.) placed at the bottom of the concave portion 2A of the frame 2 are connected by wire bonding using wire 8. By energizing the wire 8, blue LED 3 is supplied with electric power, thereby emitting blue light.

In the concave portion 2A of the frame 2 are installed green light emitting section 4 as the first emitting section and red light emitting section 5 as the second emitting section.

The concave portion 2A is filled with green light emitting section 4 and red light emitting section 5. The surface of green light emitting section 4 and red light emitting section 5 facing the outside of the light emitting device 1 at the open end of the concave portion 2A is functioning as light exit side 1A of the light emitting device 1 emitting light in the predetermined direction. In other words, from this light exit side 1A is emitted, in the predetermined direction, blue light emitted from the blue LED 3, green light emitted from the green light emitting section 4 and red light emitted from the red light emitting section 5.

Green light emitting section 4 consists of green phosphor and transparent resin. Green phosphor is a luminescent material of green light emitting section 4. It is a fluorescent material which is excited by blue light emitted by blue LED 3, and emits green light which has longer wavelength than blue light. Transparent resin functions as binder of green light emitting section 4. In this embodiment is used epoxy resin, a synthetic resin which permits transmission of visible light through the whole range of wavelength.

Green light emitting section 4 is designed to fill the left side of the Figs. from the bottom to the upper open end of the concave portion 2A. The green light emitting section 4 is also designed to cover the upper surface and side surface other than the right side surface of the LED 3 in the Figs. Furthermore, the green light emitting section 4 occupies a larger space than the red light emitting section 5 in the concave portion 2A.

Furthermore, the green light emitting section 4 has a first light exit side 4A at the open end of the concave portion 2A. This first light exit side 4A constitutes a flat-shaped upper surface of the green light emitting section 4 in the Figs., overlapping the flat-shaped surface constituting the upper surface of frame 2. Furthermore, the first light exit side 4A is a surface from which light emitted by green light emitting section 4 is emitted to the outside of the light emitting device 1 in the predetermined direction. Also emitted from here is blue light emitted by blue LED 3. Furthermore, the first light exit side 4A, in combination with the second light exit side 5A described later, constitutes a light exit side 1A of the light emitting device 1, from which light emitted by the light emitting device 1 is emitted outwards. Therefore, green light emitting section 4 is open to the outside of the device through the light exit side 1A.

On the other hand, red light emitting section 5 consists of red phosphor and transparent resin. Red phosphor is a luminescent material of red light emitting section 5. It is a luminescent material which is excited by blue light emitted by blue LED 3 and green light emitted by green light emitting section 4, and emits red light which has longer wavelength than green light. Transparent resin functions as binder of red light emitting section 5. In this embodiment, as is the case with green light emitting section 4, epoxy resin is used, which permits transmission of visible light.

Red light emitting section 5 is designed to fill the right side of the Figs. from the bottom to the upper open end of the concave portion 2A. As mentioned above, the green light emitting section 4 also extends from the bottom to the upper open end of the concave portion 2A. Therefore, the thickness of the green light emitting section 4 and that of the red light emitting section 5 are designed to be approximately equal (as measured in the vertical direction in the Figs). The red light emitting section 5 is also designed to cover the right side surface of the blue LED 3 of the Figs. Furthermore, the red light emitting section 5 occupies a smaller space than the green light emitting section 4 in the concave portion 2A.

Furthermore, the red light emitting section 5 has a second light exit side 5A at the open end of the concave portion 2A, analogously to green light emitting section 4. This second light exit side 5A constitutes a flat-shaped upper surface of the red light emitting section 5 in the Figs., overlapping the flat-shaped surface constituting the upper surface of frame 2. Furthermore, the second light exit side 5A is a surface from which light emitted by red light emitting section 5 is emitted to the outside of the light emitting device 1 in the predetermined direction. Also emitted from here is blue light emitted by blue LED 3. As mentioned above, the second light exit side 5A, in combination with the first light exit side 4A, constitutes a light exit side 1A of the light emitting device 1, from which light emitted by the light emitting device 1 is emitted outwards. Therefore, red light emitting section 5 is open to the outside of the device through the light exit side 1A.

Between green light emitting section 4 and red light emitting section 5, a divider plate 6 is installed as light shielding unit. It is fitted into the insertion slit 2B made in the frame 2. The divider plate 6 extends in depth direction from the open end of the concave portion 2A to close to the blue LED. It is formed to be a rectangular, resinous plate covering the entire width of the concave portion 2A. The entire surface of the divider plate 6 is metal plated like frame 2, thereby reflecting visible light efficiently.

Therefore, most of the light emitted by the green light emitting section 4 is reflected by the divider plate 6 and does not enter the red light emitting section 5. Similarly, most of the light emitted by the red light emitting section 5 is reflected by the divider plate 6 and does not enter the green light emitting section 4. However, there is a very narrow gap between the bottom of the concave portion 2A and the lower end of the divider plate 6. At this gap, the green light emitting section 4 and the red light emitting section 5 are in direct contact with each other. Therefore, at this gap area, there can be traffic of light between those two sections, although to a very limited extent.

The constitution of the light emitting device 1 of the present embodiment is as described in the above sections. Therefore, when the blue light is emitted from the blue LED 3, a part of it is absorbed in the green light emitting section 4 as exciting light and green light is emitted from the green light emitting section 4. Another part of the blue light emitted from the blue LED 3 is absorbed in the red light emitting section 5 as exciting light and red light is emitted from the red light emitting section 5. A small quantity of light emitted from the green light emitting section 4 enters the red light emitting section 5 through the gap, where the green light emitting section 4 and red light emitting section 5 are in contact with each other, and is absorbed and used as exciting light there. In this process, each of blue light, green light and red light emitted is emitted from the light exit side 1A in the predetermined direction.

Such a constitution of light emitting device 1 ensures high emission efficiency and enhanced color rendering. Namely, the presence of the divider plate 6 between the green light emitting section 4 and the red light emitting section 5 works to prevent the light emitted from the green light emitting section 4 from entering the red light emitting section 5. This reduces the quantity of the light emitted from the green light emitting section 4 absorbed in the red light emitting section 5, and leads to enhanced emission efficiency and color rendering. This same mechanism will also bring about reduction in fluctuation of the light components emitted from the light emitting device 1 and will help to improve color reproduction property.

It is possible that green light emitted from the green light emitting section 4 enters the red light emitting section 5 through the gap area present between the green light emitting section 4 and the red light emitting section 5. However, that quantity is very small and does not adversely affect emission efficiency and color rendering. If green light from the green light emitting section 4 is made never to enter the red light emitting section 5 by separating the two sections using divider plate 6 except at the portion where blue LED 3 and red light emitting section 5 contact, emission efficiency and color rendering can be more surely improved.

The surface of frame 2 and surface of divider plate 6 are designed to reflect all visible light efficiently. Blue light emitted by blue LED 3, green light emitted by green light emitting section 4 and red light emitted by red light emitting section 5 are all emitted from light exit side 1A without being absorbed by frame 2 or divider plate 6. Thus, each light is utilized efficiently leading to high emission efficiency.

I-3-2. Second Embodiment

Figure 2A:
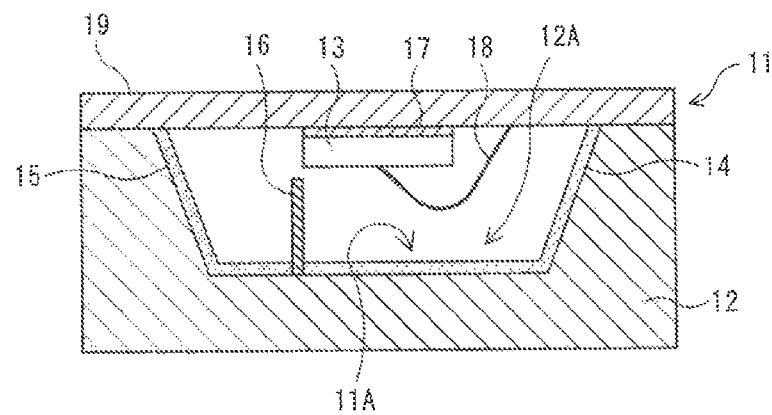
FIG. 2(a) and FIG. 2(b) show schematically the essential part of a light emitting device, as exemplified in a second embodiment of the present invention.
Figure 2B:
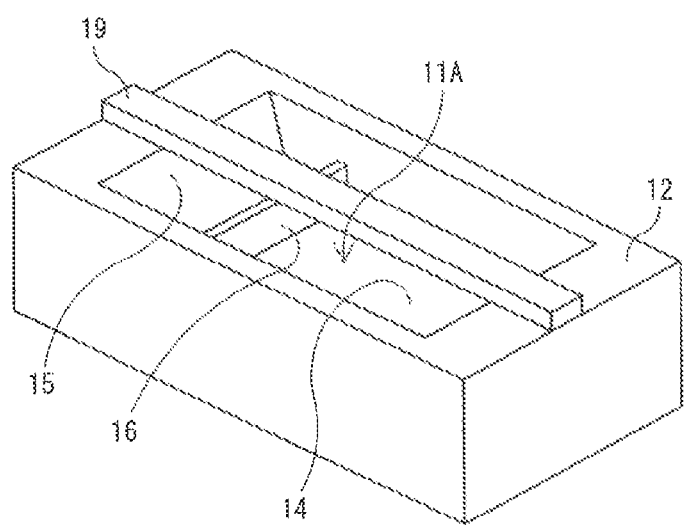

FIG. 2(a) and FIG. 2(b) show schematically the essential parts of a light emitting device as a second embodiment of the present invention. FIG. 2(a) is its cross-sectional view, and FIG. 2(b) is its exploded perspective view. For ease of explanation, in FIG. 2(a), the green light emitting section 14 and red light emitting section 15 are illustrated as much thicker sections than the actual ones. These two sections are in the thin film form to the extent that they are not easily visible.

As shown in FIG. 2(a) and FIG. 2(b), the light emitting device 11 of the present embodiment consists of frame 12, blue LED (blue emitting section) 13, which is a light source, green light emitting section 14, which functions as the first emitting section, red light emitting section 15, which functions as the second emitting section, divider plate 16 and beam 19.

Like frame 2 of the first embodiment, frame 12 constitutes a resinous base to hold blue LED 13, green light emitting section 14, red light emitting section 15, divider plate 16 and beam 19. On the upper side of the frame 12, a concave portion (a recession) 12A opening upward in Figs., whose cross-sectional view is trapezoidal, is formed. Therefore, as is the case with the first embodiment, the light emitting device 11 can emit light in the predetermined direction leading to enhanced emission efficiency.

The surface of the concave portion 12A of the frame 12 is metal plated and, therefore, light irradiated on this surface of the frame 12 can be emitted from the light emitting device 11 in the predetermined (upper, in the Fig.) direction.

On frame 12, beam 19 is placed from one end of the concave portion 12A to the other end. This beam 19 is composed of material which enables at least blue light emitted by blue LED 13, green light emitted by green light emitting section 14 and red light emitted by red light emitting section 15 to pass through. The beam 19 is also fitted with an electrode (not shown in the Fig.) on its undersurface, which supplies electric power to the blue LED 13.

Blue LED 13 is installed under the beam 19 as light source, in the central area. The blue LED 13 is similar to the one explained in the first embodiment and also functions similarly, and therefore, detailed explanation is not given here. The blue LED 13 is fixed to the beam 19 by means of silver paste 17 and is supplied with electric power through wire 18 and the electrode. The silver paste 17 and wire 18 of the light-emitting device 11 are similar to the silver paste 7 and wire in the first embodiment.

On frame 12, green light emitting section 14 as the first emitting section and red light emitting section 15 as the second emitting section are formed like a film with coequal thickness. The entire part of the inner surface of the concave portion 12A of the frame 12 is covered with films of green light emitting section and red light emitting section 15.

The light emitting device 11 is designed to emit light in the predetermined, upper direction of the Figs. The surfaces of the green light emitting section 14 and red light emitting section 15, which are not in direct contact with frame 12 and divider plate 16, functions as light exit side 11A, which permits emission of light from the light emitting device 11 in the predetermined direction. Green light emitting section 14 and red light emitting section 15 are opened to the outside through this light exit side 11A. Consequently, from this light exit side 11A is emitted blue light from blue LED 13, green light from green light emitting section 14 and red light from red light emitting section 15 in the predetermined direction. It is to be noted that blue light from blue LED 13 is not emitted directly in the predetermined direction, but it is reflected by frame and then emitted to the outside of the device.

Furthermore, the space of the frame 12 extending from the bottom of the concave portion 12A to the lower surface of the beam 19 is molded with a material (not shown in the Fig.) that permits transmission of blue light from blue LED 13, green light from green light emitting section 14 and red light from red light emitting section 15.

Green light emitting section 14 is prepared by forming a film on the bottom and slope of the concave portion 12A of the frame 12, the material of which is similar to that of the green light emitting section 4 described in the first embodiment. Furthermore, green light emitting section 14 is prepared so that its film extends from the right end of the concave portion 12A to some point in the left half of the concave portion 12A in the Fig. (here, in the left-hand side of the left end of blue LED 13). Therefore, the green light emitting section 14 occupies a larger area than the red light emitting section 15.

On the other hand, red light emitting section 15 is prepared by forming a film on the surface of the concave portion 12A of the frame 12, the material of which is similar to that of the red light emitting section 5 described in the first embodiment. Furthermore, red light emitting section 15 is prepared on the bottom and slope of the concave portion 12A where the green light emitting section 14 is not formed. As the green light emitting 14 extends from the right end and into the left half of the frame 12 in the Fig., the red light emitting section 15 is located away from the blue LED 13, in comparison with green light emitting section 14.

Therefore, a larger quantity of the blue light from blue LED 13 enters the green light emitting section 14, relative to the red light emitting section 15.

In the light emitting device 11 as illustrated in this embodiment, a divider wall 16 is installed at the boundary of the green light emitting section 14 and the red light emitting section 15. The divider wall 16 extends in depth direction upwards from the bottom of the concave portion 12A to close to the blue LED 13. The divider wall 16 is connected to frame 12 as a rectangular, resinous plate covering the entire width of the concave portion 12A. The entire surface of the divider wall 16 is metal plated like frame 12, thereby reflecting visible light efficiently.

Therefore, most of the light emitted by the green light emitting section 14 is irradiated on the divider wall 16 and does not enter the red light emitting section 15. Similarly, most of the light emitted by the red light emitting section 15 is irradiated on the divider wall 16 and does not enter the green light emitting section 14. However, there is a very narrow gap between the divider wall 16 and the bottom of the concave portion 12 and through this gap, there can be traffic of light between the green light emitting section 14 and red light emitting section 15, although to a very limited extent.

The constitution of the light emitting device 11 is as described in the above sections. Therefore, when the blue light is emitted from the blue LED 13, a part of it is absorbed in the green light emitting section as exciting light and green light is emitted from the green light emitting section 14. Another part of the blue light emitted from the blue LED 13 is absorbed in the red light emitting section 15 as exciting light and red light is emitted from the red light emitting section 15. A small quantity of light emitted from the green light emitting section 14 enters the red light emitting section 15 as exciting light through the gap at the upper end of the divider wall 16, and is absorbed and used as exciting light there. In this process, each of blue light, green light and red light emitted is emitted from the light exit side 11A in the predetermined direction.

Such a constitution of light emitting device 11 ensures high emission efficiency and enhanced color rendering. Namely, the presence of the divider wall 16 between the green light emitting section 14 and the red light emitting section 15 works to prevent the light emitted from the green light emitting section 14 from entering the red light emitting section 15. This reduces the quantity of the light emitted from the green light emitting section 14 absorbed in the red light emitting section 15, and leads to enhanced emission efficiency and color rendering. This same mechanism will also bring about reduction in fluctuation of the light components emitted from the light emitting device 11 and will help to improve color reproduction property.

It is possible that green light emitted from the green light emitting section 14 enters the red light emitting section 15 through the gap at the upper end of divider wall 16. However, that quantity is very small and does not adversely affect emission efficiency and color rendering. If green light from the green light emitting section 14 is made never to enter the red light emitting section 15 by making the divider wall 16 longer, emission efficiency and color rendering can be more surely improved.

The surface of frame 12 and surface of divider wall 16 are designed to reflect all visible light efficiently. Blue light emitted by blue LED 13, green light emitted by green light emitting section 14 and red light emitted by red light emitting section 15 are all emitted from light exit side 11A without being absorbed by frame 12 or divider wall 16. Thus, each light is utilized efficiently leading to high emission efficiency.

According to the light emitting device 11, the operations and effects similar to the light emitting device 1 of the first embodiment can be also achieved.

I-4. USE OF LIGHT EMITTING DEVICE

There is no limitation to use of the light emitting device of the present invention, and it can be applied in any field where light is involved. As specific examples can be cited: lighting system, backlight unit for a display device, display device (or display), and so on.

There is no specific restriction when the light emitting device of the present invention is used as lighting system. It can be used in various modes as light emitting device, such as photoflash, lighting device for video camera, or indoor and outdoor lighting fixture. Pay attention to that, in the light emitting device of the present invention, although wavelengths (or colors) of the lights emitted from the first and second emitting section are different, light emerging from the light emitting device will spread sufficiently after leaving the light emitting device and will be perceived visually in a state where the lights from the light source, first emitting section and second emitting section are well mixed. Thereby, the lights can be observed to be intended color, by our visual perception, without being sorted into their wavelength components. By using light emitting device of the present invention as lighting system, light with high color rendering can be radiated, with high emission efficiency.

The light emitting device of the present invention can be also used as backlight unit with optical elements like optical waveguide in combination. As an example can be cited a backlight unit installed at a cellular phone display for illuminating liquid crystal display of the phone from backside. The light emitting device of the present invention can be used as this backlight unit for a display.

Figure 3:
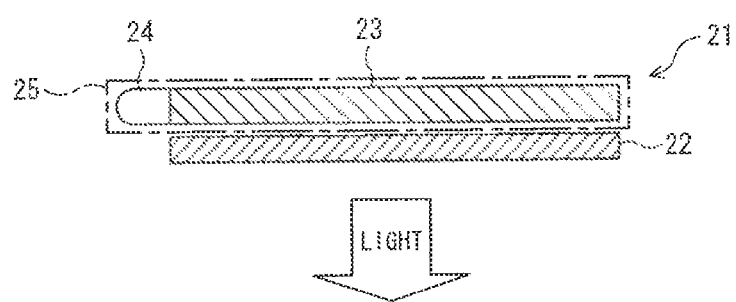
FIG. 3 is a schematic cross-sectional view of the essential part of a display illustrating one example of a backlight unit using a light emitting device of the present invention.

FIG. 3 is a schematical sectional view of the main part of a cellular phone display 21, for illustrating an example of a backlight unit using the light emitting device of the present invention. As shown in FIG. 3, on the backside of the liquid crystal display 22, an optical waveguide 23, having the size corresponding to the entire backside of the liquid crystal display 22, is installed. This optical waveguide 23 is a plate-like optical element, manufactured from the transparent material that can be passed through with the lights of all visible wavelengths, on the lateral side of which the light emitting device 24 is installed. This light emitting device 24 is installed in a manner that the light emerging therefrom can enter the optical waveguide 23. And the backlight unit for a display 25 consists of this optical waveguide 23 and the light emitting device 24. With this construction, the light emerging from the light emitting device 24 enters the optical waveguide 23, and then emerges from a surface of the optical waveguide 23, facing the liquid crystal display 22, toward the liquid crystal display 22. Thereby the liquid crystal display 22 can be illuminated brightly. At this point, although the wavelengths (or colors) of the lights emitted from the first and second emitting sections of the light emitting device 24 are different from each other, as the lights emerging from the light emitting device 24 are mixed and homogenized within the optical waveguide 23, there is no possibility of irregularity in color on illuminating the liquid crystal display 22.

The light emitting device of the present invention is sometimes used as backlight, which illuminates directly a liquid crystal display from backside, for example when it is used for a relatively large type of display device (or display). Even in that case, there is no possibility of irregularity in color, as the lights emerging from the light emitting device are mixed and homogenized on the way to the liquid crystal display.

In this regard, some components like diffusion plate or light diffusion layer can be used to spread light emerging from the light emitting device, for the purpose of mixing the wavelength components of the light emerging from the light emitting device. With this construction, the light can be more surely homogenized. This kind of method can be preferably used for the use application that does not allow even a small irregularity in luminescent color, for example indicators of audiovisual apparatuses.

As mentioned above, by using the light emitting device of the present invention as a backlight or backlight unit for a display device, it is possible to propose a display with high color reproduction and high emission efficiency (or luminance).

II. Explanation about Display Device

In the following section is illustrated a third embodiment of the present invention, in which the display device of the present invention is explained in detail. Though a third embodiment of the present invention is explained using Figs. below, the present invention is not restricted to the following third embodiments, but any modification is allowed within the scope of the present invention.

Figure 4:
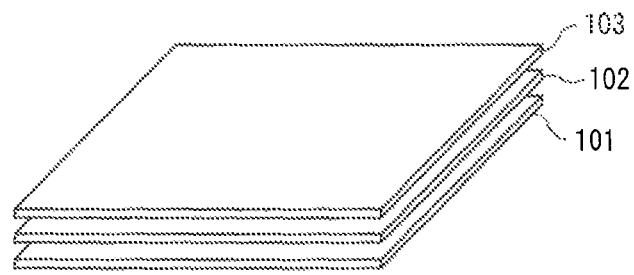
FIG. 4 is a schematic, exploded perspective view illustrating the outline of a display device, as exemplified in a third embodiment of the present invention.
Figure 5:
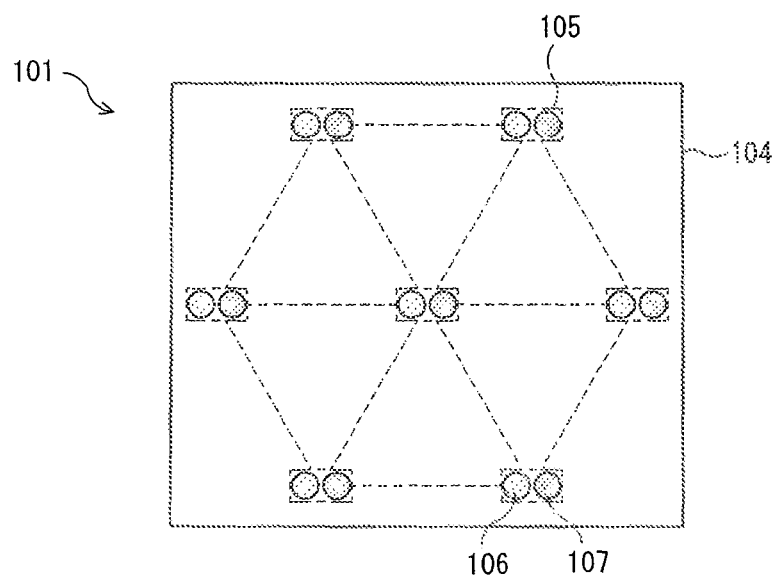
FIG. 5 is a schematic plane view of a backlight unit, as exemplified in a third embodiment of the present invention.
Figure 6:
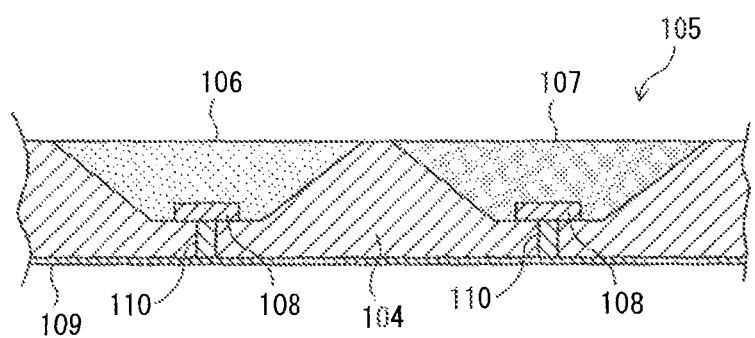
FIG. 6 is a schematic cross-sectional view illustrating the essential part of a backlight unit, as exemplified in a third embodiment of the present invention.

FIG. 4 to FIG. 6 illustrate a third embodiment of the present embodiment. FIG. 4 is a schematic, exploded perspective view illustrating the summary of the display device. FIG. 5 is a schematic plane view of a backlight unit. FIG. 6 is a schematic cross-sectional view of the essential part of the backlight unit.

The display device of the present embodiment comprises a backlight unit, image formation unit, and if necessary, other constituting members like diffusion plate, optical waveguide and so on.

FIG. 4 is a schematic, exploded perspective view illustrating a display device of the present embodiment. As shown in FIG. 4, the display device of the present embodiment includes a backlight unit 101, diffusion plate 102 and image formation unit 103.

II-1. BACKLIGHT UNIT

Backlight unit 101 is a member emitting white light as backlight toward image formation unit 103 via diffusion plate 102. The phrase of "backlight unit 101 emits white light" indicates not only such situation that light turns to be white light just after it is emitted from backlight unit 101 but also indicates broadly that light, not yet to be white light which is sufficiently dispersed just after it is emitted from backlight unit 101, is dispersed on the way to image formation unit 103 and turns to be white light on arriving at image formation unit 103.

FIG. 5 is a schematic plane view of a backlight unit 101 used in the display device of the present embodiment. As shown in FIG. 5, backlight unit 101 of the present embodiment has a plurality of (here, seven) light emitting sections 105 for emitting white light, on basal board 104 which functions as frame. Each light emitting section 105 comprises a green light emitting section 106 as the first emitting section and red light emitting section 107 as the second emitting section.

II-1-1. Basal Board

Basal board 104 serves as a base to install light emitting section 105. It can be constituted similarly to the frame in the above-mentioned light emitting device. Therefore, its shape and size are not limited to special ones and are to be determined depending on the shape, size or use of the display device. For example, the light emitting section 105 of the basal board 104 can take the shape of a board or cup. Its surface can be either flat, curved or concavo-convex. It is preferred to be decided depending on its use.

There is no special limitation on the material of the basal board 104, either. Usually, it is preferable to use a material which does not permit transmission of green light. Indeed, it is possible to use a material capable of transmitting green light. In that case, however, it is preferable to take some measure to block the green light, such as coating the surface of the basal board 104 with a proper material that can prohibit transmission of at least green light. Blocking the transmission of green light will be referred to in more detail later in the explanation of the light emitting section 105.

As concrete example of materials for the basal board 104 can be cited those used for the frame of the light emitting device, mentioned earlier. Particularly preferable is ceramics or the like among inorganic materials and glass epoxy resin or the like among organic materials. It is possible to use one kind of material singly, or to use two or more kinds of materials in any combination and in any ratio.

Further, it is preferable to use for basal board 104 a material capable of liberating heat, for example, a material with high thermal conductivity. Usually, a light source in the light emitting section 105 (See blue light source 108 in FIG. 6) releases heat during its use. Basal board 104 with a good heat liberation property assures its stable and continuous use even if heat is liberated during its use.

Furthermore, it is preferable to use, for a basal board 104, a material with good electrical insulation property.

In selecting a material for the basal board 104 in the constitution of a display device, it is desirable to pay attention to its color. The color may be any color. However, usually, it is preferable to use a white colored or silver colored material. The reason is as follows. It is possible that a part of white light emitted from the light emitting section 105, and reflected by diffusion plate 102 or image formation unit 103, or light entering the display device from outside the device, is reflected by the surface of the backlight unit 101, located on the side where white light is emitted against the image formation unit 103 (hereinafter referred to as "white light exit side", as needed), and that reflected light illuminates the image formation unit 103 from its back. In that case, if the basal board 104 absorbs visible light, lowering of emission efficiency or color drift may occur. Therefore, it is preferable that the white light exit side of the basal board 104 is white or silver in color. Hence, it is preferable that the white light exit side of basal board 104 is made of white- or silver-colored material.

It is preferable that a portion of the surface of the basal board 104, facing the green light emitting section 106 and the red light emitting section 107 within the light emitting sections 105, has a high reflectance with regard to at least some components of the light, which is reflected by the portion. It is more preferable that the reflectance is heightened for all the wavelength region of visible light. The emission efficiency of the backlight unit 101 can be further heightened in this way. Therefore, it is preferable that at least an area of the basal board reflected by light, as mentioned above, is made of material having high reflectance. Examples of the methods of heightening reflectance include those described above for the light emitting device.

Further, it is usual that the basal board 104 is fitted with electrodes and wiring to supply electric power. These electrodes and wiring can be fitted any way. However, in constituting a display device, it is desirable to use a through-hole on the back of the basal board 104 to provide wiring pattern, because, then, the manufacturing of the basal board is easy. There is no limitation on the material of the electrodes or wiring. Such materials as Cu, Au-plated Cu, Ag-plated Cu, Al and Ag can be used.

In the present embodiment, it is supposed that the basal board 104 is made up in the shape of a white board and the surfaces facing the green light emitting section 106 and the red light emitting section 107 are treated so that they can reflect all the wavelength of light in the visible region. Also, it is supposed that the basal board 104 is equipped with an electrical wire 109 on its back, which supplies electric power to the blue light source 108, and that at each position thereof, corresponding to each light emitting section 105, it is equipped with an electrode 110 (See FIG. 6).

II-1-2. Blue Light Source

FIG. 6 is a schematic, cross-sectional view of light emitting section 105. As is shown here in FIG. 6, light emitting section 105 comprises green light emitting section 106 as the first emitting section and red light emitting section 107 as the second emitting section. Green light emitting section 106 and red light emitting section 107 are each fitted with blue light source 108.

Blue light source 108 is a light source which emits blue light as exciting light to excite luminescent materials contained in green light emitting section 106 and red light emitting section 107, similarly to the light source described in the above light emitting device. It also emits blue light as one of the components of white light emitted by backlight unit 101. In other words, a part of the blue light emitted by blue light source 108 is absorbed by luminescent materials in green light emitting section 106 and in red light emitting section 107 as exciting light, and another part of the blue light emitted is emitted so that it is directed from backlight unit 101 towards image formation unit 103.

There is no special limitation on the kind of blue light source 108 and appropriate one can be selected depending on the use and constitution of display device. It is preferred to select one which has equitableness in light distribution and which diffuses light in wide directions.

As embodiment of blue light source 108, one similar to that described for the explanation of light emitting device can be cited. Usually, inexpensive LED is preferred.

When LED is used as blue light source 108, there is no special limitation on its shape. However, it is preferable to make its lateral side tapered in order to increase the external efficiency of light production.

There is no special limitation on the kind of packaging material of LED, either. For example, ceramics or PPA (polyphthalamide) can be appropriately used. As is the case with basal board 104, preferable color for the package is white or silver from the standpoint of improving color reproduction. It is also preferable to achieve high reflectance of light from the standpoint of increasing emission efficiency of backlight unit 101. When there is electrical wiring for blue light source 108, the same requirement as for the above-mentioned basal board 104 and LED package can be applied for the color and reflectance of this wiring.

There is no special limitation on the method by which the blue color light source 108 is attached to the basal board 104. Soldering is one such method. The kind of solder is not limited to any special ones. For example, one similar to that described for the explanation of light emitting device can be used. Especially when large-current-type LED or laser diode, where heat dissipating property is important, is used as blue color light source 108, soldering is particularly useful because of its excellent heat dissipating property.

In case a method other than soldering is to be used to attach the blue color light source 108 to the basal board 104, the methods explained for the explanation of light emitting device can also be used. In this case, the use of a paste prepared by adding electroconductive filler such as silver particles or carbon particles to an adhesive agent, makes possible the electric power supply to the blue color light source 108 via the adhesive agent, similarly to when soldering is used. The use of electroconductive filler is desirable also from the viewpoint of increasing heat dissipating property.

No particular limitation is imposed on the method of electric power supply, either, to the blue color light source 108. Methods similar to those described for the light emitting device can be applied.

The blue color light source 108 can be used as a single unit or as two or more units together. Furthermore, only one kind of blue color light source 108 can be used or two or more different kinds of the light source 108 can be used.

Furthermore, one blue color light source 108 can be shared by green light emitting section 106 and red light emitting section 107, or the same can be shared by more than one light emitting section 105. Usually, it is preferred to install the blue color light source 108 in each of green light emitting section 106 and red light emitting section 107 in order to enhance the color rendering of white light emitted by backlight unit 101.

There is no limitation on the wavelength of the blue light emitted by the blue color light source 108, insofar as backlight unit 101 can emit light of intended wavelength (in the present embodiment, white light). Usually, the wavelength is 350 nm or longer, preferably 370 nm or longer, more preferably 380 nm or longer, still more preferably 400 nm or longer and most preferably 430 nm or longer. It is usually 600 nm or shorter, preferably 570 nm or shorter, more preferably 550 nm or shorter, still more preferably 500 nm or shorter and exceptionally preferably 480 nm or shorter.

In particular, the wavelength of the blue light emitted by blue color light source 108, which is used for green light emitting section 106, is usually 350 nm or longer, preferably 400 nm or longer, more preferably 430 nm or longer, and is usually 520 nm or shorter, preferably 500 nm or shorter, more preferably 480 nm or shorter.

On the other hand, the wavelength of the blue light emitted by blue color light source 108, which is used for red light emitting section 107, is usually 400 nm or longer, preferably 450 nm or longer, more preferably 500 nm or longer, and is usually 600 nm or shorter, preferably 570 nm or shorter, more preferably 550 nm or shorter.

In the present embodiment, LED emitting blue light is supposed to be used as blue color light source 108 in each of the green light emitting section 106 and red light emitting section 107. The basal board 104 is fitted with conductive wire 109 on its back surface and electrode 110, which connects each blue color light source 108 and conductive wire 109, as shown in the FIG. 6. Electric power is supplied to the blue color light source 108 via conductive wire 109 and electrode 110.

II-1-3. Green Light Emitting Section and Red Light Emitting Section

Green light emitting section 106, which is the first emitting section, is designed to comprise at least one luminescent material (green phosphor), which is excited by blue light emitted by blue color light source 108 and can emit green light containing light component in the green color region whose wavelength is longer than that of blue color.

Usually, green light emitting section 106 is prepared in such a way that the above-mentioned luminescent material is filled into a filling portion (concave portion) formed in the basal board 104. Therefore, the shape of the green light emitting section 106 depends on the shape of the filling portion. There is no special limitation on the shape of the green light emitting section 106. Usually, a cup-shaped one, as shown in FIG. 6, is preferable, because this shape ensures that the light is emitted in the predetermined direction, which results in enhanced emission efficiency of backlight unit 101.

Green light emitting section 106 can be installed as a single unit in one location, or as two or more units in more than one location. Furthermore, the number of the green light emitting section 106 installed can be set to be equal to or different from the number of red light emitting section 107.

In the green light emitting section 106, luminescent materials emit light on receiving blue light from blue color light source 108 as exciting light. Light thus emitted (green light) constitutes a component of white light emitted outwards from the backlight unit 101 towards the image formation unit 103.

On the other hand, red light emitting section 107, which is the second emitting section, is designed to comprise at least one luminescent material (red phosphor), which is excited by blue light emitted by blue color light source 108 and can emit red light containing light component in the red color region whose wavelength is longer than that of blue color and above-mentioned green color.

Usually, red light emitting section 107 is prepared in such a way that the above-mentioned luminescent material is filled into a filling portion (concave portion) formed in the basal board 104, similarly to green light emitting section 106. Therefore, the shape of the red light emitting section 107 depends on the shape of the filling portion. There is no special limitation on the shape of the red light emitting section 107. Usually, it is preferable that the section is shaped like a cup, similarly to green light emitting section 106.

Red light emitting section 107 can also be installed as a single unit in one location, or as two or more units in more than one location. Furthermore, the number of the red light emitting section 107 installed can be set to be equal to or different from the number of green light emitting section 106.

In the red light emitting section 107, luminescent materials emit light on receiving blue light from blue color light source 108 as exciting light. Light thus emitted (red light) constitutes a component of white light emitted outwards from the backlight unit 101 towards the image formation unit 103.

In this embodiment, however, the above-mentioned green light emitting section 106 and red light emitting section 107, at least a part of them and preferably all of them, are designed to be formed as independent sections. By forming the green light emitting section 106 and red light emitting section 107 separately from each other, the green light emitted from the green light emitting section 106, at least a part of it and preferably all of it, is prevented from entering the red light emitting section 107. Usually, it is better to prevent green light emitted from the green light emitting section 106 from entering the red light emitting section 107 to such an extent that white light emitted from the backlight unit 101 against the image formation unit 103 has sufficiently high emission efficiency and color reproduction property to make it practically usable. It is preferable that all the green light from the green light emitting section 106 is prevented from entering the red light emitting section 107. Through this manipulation, it is possible to prevent the green light coming from the green light emitting section 106 from being consumed as exciting light of the luminescent materials in the red light emitting section 107, resulting in less decrease in emission intensity of the green light and increase in emission efficiency of the backlight unit 101. Also, excessively high intensity of the red light from the red light emitting section 107 due to absorption of the green light as exciting light is prevented, this leading to the enhanced color rendering of white light emitted from the backlight unit 101.

Usually, the green light emitting section 106 and the red light emitting section 107 are formed by filling the respective luminescent material into the filling portion of the basal board 104. Green light from the green light emitting section 106 is usually blocked by the basal board 104 and does not enter the red light emitting section 107. Namely, the part of basal board 104 between the green light emitting section 106 and the red light emitting section 107 functions as light shielding unit, described previously for the light emitting device. Needless to say, the material for the basal board 104 should be such that it blocks at least green light, or the surface of the board should be so coated.

The above-mentioned blue light, green light and red light can be utilized most efficiently if the board is capable of not only preventing the transmission of green light but also reflecting at least some, preferably all, of the blue, green and red light. This also increases the emission efficiency of the backlight unit 101.

There may be provided a wall to prevent the transmission of green light, between green light emitting section 106 and red light emitting section 107, for the purpose of blocking the transmission of green light more surely. The wall can be formed by, for example, making a portion of the white light exit side, on basal board 104, between green light emitting section 106 and red light emitting section 107 to be convex. To use the convex portion as wall can protect the transmission of green light more surely. At this point, the shape, dimension or the like of this wall can be decided arbitrarily. Material used to form the wall can also be selected arbitrarily and those similar to basal board 104 can be selected. It is preferred to heighten reflectance of the wall surface as well, similarly to basal board 104. In this case, this wall also functions as light shielding unit, mentioned above.

Furthermore, it is desirable that both green light emitting section 106 and red light emitting section 107 are opened to the outside of the device at the white light exit side in order to prevent the green light emitted by green light emitting section 106 from entering red light emitting section 107, as mentioned above. In other words, it is desirable that the green light emitted by green light emitting section 106 is emitted from the white light exit side toward image formation unit 103 without passing through red light emitting section 107, and that the red light emitted by red light emitting section 107 is emitted from the white light exit side toward image formation unit 103 without passing through green light emitting section 106. Even in case there is a protective layer formed on the white light exit side, or there is a cover placed on backlight unit 101, and the green or red light must pass through some other members like this protective layer or cover before leaving backlight unit 101 for outside, green light emitting section 106 and red light emitting section 107 are deemed opened if other member like the protective layer or cover is such that they allow the green and red light to pass through.

As described above, green light emitting section 106 and red light emitting section 107, opened at the white light exit side, assures that the decrease in intensity of the green light and red light, which may be absorbed in the other luminescent material or blocked by the other members, is kept small (or none at all). This can lead to the increase in emission efficiency of backlight unit 101, decrease in fluctuation of white light components emitted from backlight unit 101, and improvement in color rendering. That the white light can be emitted surely using three primary colors, blue, red and green ensures excellent color reproduction property, subject to proper selection of blue light source 108, green light emitting section 106 and red light emitting section 107.

Emission efficiency of above-described backlight unit 101 can be enhanced through basically the same mechanism as the light emitting device. Another detailed explanation on the mechanism of improving the emission efficiency of backlight unit 101 will be made below, in comparison with the conventional art and taking into account the particular use for display device.

In the conventional art, where white light is generated without using all of blue, green and red light at the same time, color reproduction property is not fully sufficient. Even in case all of blue, green and red light are used at the same time, a part of green light is absorbed and consumed by the luminescent material emitting red light, if white light is generated without separating light emitting section 105 into green light emitting section 106, containing green luminescent material, and red light emitting section 107, containing red luminescent material. As is the case with not only the instance such that green luminescent material and red luminescent material are used mixed and diffused in the same emitting section being, but also the instance where green luminescent material and red luminescent material are used at separated emitting sections, like in Patent Document 1. Therefore, the intensity of the green light, intended to emerge outside of backlight unit 101, gets lowered, leading to decrease in luminous flux of the white light emerging from the backlight unit 101 and thus in emission efficiency. In addition, as the green light is consumed by the luminescent material emitting the red light and thus red light is intensified excessively, optical component balance of the white light emerging from the backlight unit 101 is fluctuated, leading to decrease in color reproduction of the display device.

Moreover, in the conventional construction, it is necessary to enlarge the ratio of the luminescent material in the green light emitting section against the luminescent material which emits the red light to obtain a desired color of the white light emerging from the backlight unit 101, because of the compensation of light emitted from the green light emitting section and absorbed in the red light emitting section. However, color rendering of white light depends on kinds and usage ratio of luminescent material. That is why the color rendering of the light has been liable to get insufficient, because usage ratio of luminescent material tends to drop out the optimal value very far in the conventionally constructed the backlight unit like Patent Document 1.

In contrast to this, in the backlight unit 101 used in the present embodiment, green light can be prevented from entering red light emitting section 107. This leads to the protection of decrease in intensity of green light and absorbed by the red light emitting section 107. Consequently, emission efficiency of the backlight unit 101 can be enhanced compared to the conventional one.

In addition, as the red light emitting section 107 can be prevented from absorbing green light and emitting light, fluctuation in optical components of the white light from the backlight unit 101 can be lowered. This leads to enhanced color rendering of the backlight unit 101, resulting in also improved color rendering property and color reproduction of the display device.

Green light emitting section 106 and red light emitting section 107 can be disposed at any location insofar as light emitted from blue light source 108, green and red light emitting sections 106, 107 (or blue, green and red light) can be emitted from backlight unit 101. However, it is preferable to dispose them as light emitting section 105, formed by incorporating the green and red light emitting sections 106, 107 so that they can emit the intended white light, as shown in this embodiment. It is desirable to pair green and red light emitting sections 106, 107 each in possibly smallest number to constitute light emitting section 105 as long as they can emit the intended colored white light, as the color of white light depends on the color and the ratio of intensity of each blue, green and red light. If it is necessary to increase the intensity of white light, it is preferred to increase the number of the light emitting section 105, which is the number unit, from the standpoint of ease in designing and manufacturing. Though each light emitting section 105 contains a single green and red light emitting section 106, 107 respectively in this embodiment, each of them can be installed in two or more as needed.

Green light emitting section 106 and red light emitting section 107 can also be disposed at any location within light emitting section 105. They can be arranged side by side as in the present embodiment, or one can be installed surrounding the other. Any more complicated disposition can be selected.

When increasing the number of light emitting section 105, the light emitting sections 105 can also be disposed at any location. However, the light emitting sections 105 are preferred to be positioned at uniform intervals, because in that way the image formation unit 103 can be irradiated uniformly. Therefore, it is desirable that each light emitting section 105 is disposed, as shown in FIG. 5, at each apex of equilateral triangles (See dashed lines of FIG. 5), arranged continuously altogether.

The size of green light emitting section 106 and red light emitting section 107 can be selected arbitrarily. But usually it is designed subject to the intended white light constitution. White light is emitted from backlight unit 101 toward image formation unit 103, as mixed light consisting of blue, green and red light. Accordingly, the perceived color of the white light changes depending on the intensity of each mixed light of blue, green and red. This fact requires the adjustment of balance in intensity of each blue, green and red light in order to obtain intended colored white light. One such method of adjusting the balance in intensity of each blue, green and red light is to adjust the size of green light emitting section 106 and red light emitting section 107. Green light emitting section 106 is set to be larger compared to red light emitting section 107 in order to intensify green light, and green light emitting section 106 is set to be smaller compared to red light emitting section 107 in order to weaken green light.

The method of adjusting the balance of each intensity of blue, green and red light is not restricted to the above-mentioned way of adjusting the size of green light emitting section 106 and red light emitting section 107, but any appropriate method can be used.

For example, intended white light can be obtained also by adjusting the ratio of the value of electric power supplied on blue light source 108 installed at green light emitting section 106 to that of supplied on blue light source 108 installed at red light emitting section 107. This method can also make an adjustment of the balance of each intensities of blue, green and red light and generate intended white light.

Otherwise, when blue light source 108 is driven by electric pulses, the intended white color can be generated by adjusting the duty ratio of it. In other words, by adjusting the ratio of pulse lighting period of blue light source 108 installed at green light emitting section 106 to that of blue light source 108 installed at red light emitting section 107, the balance of each intensities of blue, green and red light can be adjusted and intended white light can be generated.

Further, by adjusting the ratio of amount of luminescent materials contained in green light emitting section 106 to that in red light emitting section 107, the balance of each intensities of blue, green and red light can be adjusted and intended white light can be generated.

For adjusting each color and the balance of each intensities of blue, green and red light, to obtain the intended white light, actually the light emitted from green light emitting section 106 and red light emitting section 107 will be used to make the adjustment. White light generated by mixing blue, green and red light can be considered to be a light consisting of a mixed light of blue and green light (hereinafter called "short wavelength light", as needed) and another mixed light of blue and red light (hereinafter called "long wavelength light", as needed). On this aspect, short wavelength light is a light emitted from green light emitting section, and long wavelength light is a light emitted from red light emitting section. Accordingly, by controlling green light emitting section 106 and red light emitting section 107 to adjust the color and intensity of each short and long wavelength light, emitted from green and red light emitting section 106, 107 respectively, the intended color of white light, emitted from each light emitting section 105, can be obtained.

Figure 7:
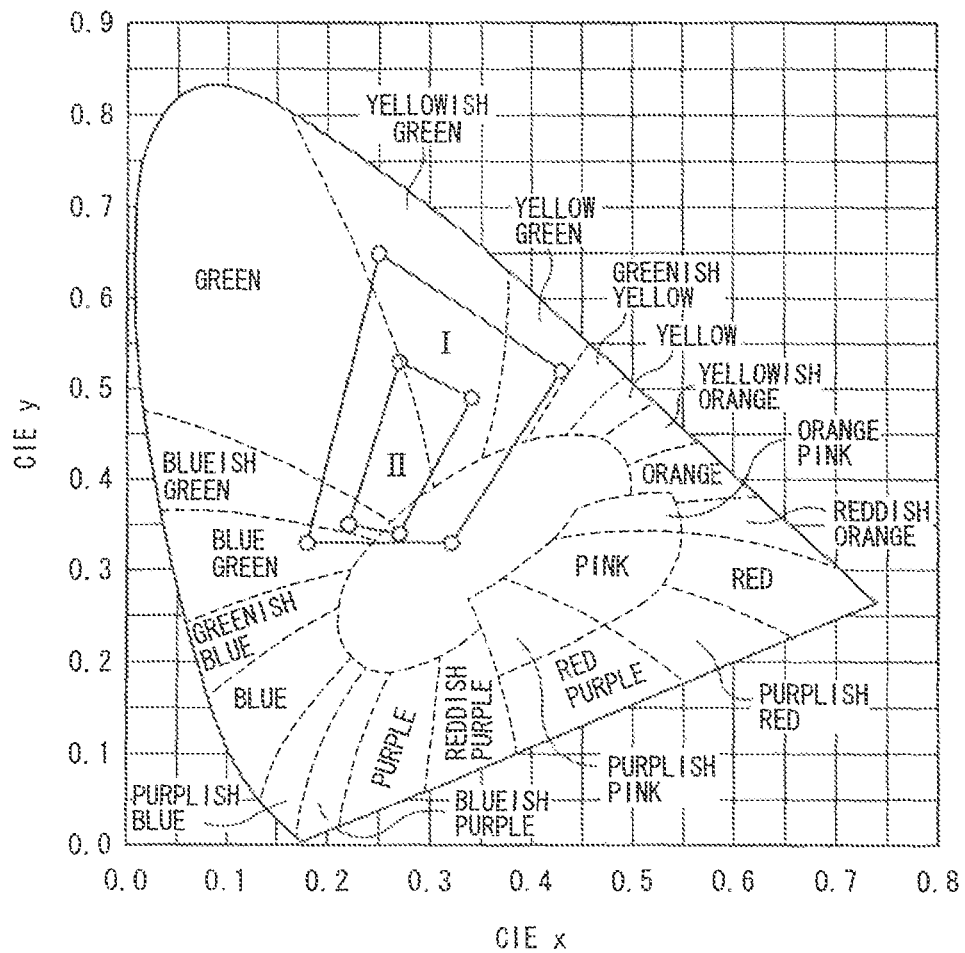
FIG. 7 is a chromaticity diagram illustrating the desirable range of the chromaticity coordinates of light generated by mixing blue light and green light, as exemplified in the display unit of a third embodiment of the present invention.

At this point, the above-mentioned short wavelength light (or mixed light consisting of blue light and green light) preferably takes a chromaticity coordinate of (x, y), as shown in FIG. 7, in the range surrounded by (0.25, 0.65), (0.43, 0.52), (0.32, 0.33), and (0.18, 0.33) (shown by range I in FIG. 7). It is more preferably in the range surrounded by (0.27, 0.53), (0.34, 0.49), (0.27, 0.34), and (0.22, 0.35) (shown by range II in FIG. 7). It is because balance between the luminance and the color reproduction property is superior.

The chromaticity coordinate of the above-mentioned long wavelength light (or mixed light consisting of blue light and red light) can be decided to be opposite to that of the short wavelength light based on the chromaticity coordinate of the intended white light.

In this embodiment, light emitting sections 105 are deemed to be formed by filling luminescent materials, corresponding to respective green light emitting section 106 and red light emitting section 107, and binder into filling portions, arranged independently one by one on the basal board 104 and having the same shapes (circular in upper surface and trapezoidal in cross-section). Each light emitting section 105 is disposed, as shown in FIG. 6, at each apex of equilateral triangles, arranged continuously altogether (See dashed lines of FIG. 6), this leading to the uniform intervals between each of the light emitting sections 105.

II-1-4. Composition of Light Emitting Section

The green light emitting section 106, which is the first emitting section, contains luminescent materials capable of absorbing exciting light and emitting green light. On the other hand, the red light emitting section 107, which is the second emitting section, contains luminescent materials capable of absorbing exciting light and emitting red light. In these green and red light emitting sections 106, 107, luminescent materials are usually retained on the basal board 104 using a binder.

II-1-4-1. Luminescent Material

Luminescent materials can be selected from any known such materials. Light emission can be through any mechanism including fluorescence or phosphorescence. In the green light emitting section 106 as well as in the red light emitting section 107, luminescent materials can be either a single sort of substance or a mixture of more than one sorts of substance in any possible combination or in any possible ratio. However, it is desirable that the luminescent materials in each of the green light emitting section 106 and red light emitting section 107 are appropriately selected, taking into consideration the chromaticity coordinate of the intended white light.

There is no special limitation on the wavelength of the green light emitted by the green luminescent material used in the green light emitting section 106, so long as the backlight unit 101 can emit white light. Preferably, it is in the same range of wavelength as that considered desirable for the luminescent material of the first emitting section described in the above-mentioned light emitting device.

On the other hand, there is no special limitation either on the wavelength of the red light emitted by the red luminescent material used in the red light emitting section 107, so long as the backlight unit 101 can emit white light. Preferably, it is in the same range of wavelength as that considered desirable for the luminescent material of the second emitting section described in the above-mentioned light emitting device.

It is preferable to use luminescent materials having luminous efficiency of 40% or higher, preferably 45% or higher, more preferably 50% or higher, still more preferably 55% or higher, most preferably 60% or higher. The luminous efficiency mentioned here represents a product of quantum absorbing efficiency and internal quantum efficiency.

Luminescent materials referred to as desirable for the first emitting section of the above-mentioned light emitting device can also be cited as desirable luminescent materials of the green light emitting section 106. Likewise, luminescent materials referred to as desirable for the second emitting section of the above-mentioned light emitting device can also be cited as desirable luminescent materials of the red light emitting section 107.

When used for the constitution of a display device as well, luminescent materials, both for green light emitting and for red light emitting, are usually used as particles. The diameter of the particles can be any appropriate one, but usually 150 μm or smaller. Preferably, the diameter is 50 μm or smaller, more preferably, 20 μm or smaller, still more preferably 15 μm or smaller. If the diameter is larger than the above range, the fluctuation of the white color emerging from the backlight unit 101 tends to be larger. It is also likely that uniform application of luminescent materials becomes difficult in case luminescent materials are mixed with a sealing agent (binder). The diameter is usually 0.001 μm or larger. Preferably, it is 0.01 μm or larger, more preferably, 0.1 μm or larger, still more preferably 1 μm or larger, still more preferably 2 μm or larger, most preferably 5 μm or larger. Luminous efficiency is lowered below the above range.

In case green light emitting section 106 and red light emitting section 107 are prepared without using a binder, for example, these sections can be prepared in the same way as the first emitting section and the second emitting section mentioned above for light emitting device.

Further, to the red light emitting section 107 are added luminescent materials capable of emitting red light, binder and other additional components. Furthermore, luminescent materials emitting green light can also be added. However, it is preferable to keep the concentration of the green luminescent materials contained in the red light emitting section 107 small in order to obtain a larger luminous flux. It is preferable that the red light emitting section 107 does not contain green luminescent materials.

On the other hand, the green light emitting section 106 does not usually contain luminescent materials emitting red light. However, it may contain red luminescent materials as long as luminous flux of the green light does not decrease due to such materials. It is preferable that the volume of red luminescent materials in the green light emitting section 106 is less than or equal to 40 volume %. It is more preferable that red luminescent materials are not contained in the green light emitting section 106 at all.

Red luminescent materials can be excited by green light. However, in the green light emitting section 106, the green light emitted by the green luminescent material should not be absorbed excessively by the co-existing red luminescent material. Luminescent materials in each of the green and red light emitting section 106, 107 should be adjusted so that the above requirement is met.

II-1-4-2. Binder

As is mentioned above, the green light emitting section 106 and the red light emitting section 107 may contain binders in addition to luminescent materials. As is the case with the above-mentioned light emitting device, binders are usually used to bind together luminescent materials present in the powder form or in the particulate form, or to attach luminescent materials to the basal board 104. Any known binders can be used for the backlight unit 101.

However, in case backlight unit 101 is constructed to be transmissive type, which is in such a way that the light emitted from the blue light source 108, the green light emitting section 106 and the red light emitting section 107 passes through the green light emitting section 106 or the red light emitting section 107 before leaving the backlight unit 101 towards outside, as shown in FIG. 6, it is preferable to select as binder such substances which permit transmission of each component of white light (namely, blue light, green light and red light) emitted by backlight unit 101.

As an example of a binder, one similar to that of the above-mentioned light emitting device can be cited.

When resin is used as binder, no particular limitation is imposed on its viscosity. It is desirable to select a binder having suitable viscosity, taking into consideration the particle diameter and specific gravity, especially specific gravity per unit surface area, of luminescent materials used. For example, similarly to the above-mentioned light emitting device, when epoxy resin is used as binder and particle diameter of luminescent materials is in the range of 2 μm to 5 μm with its specific gravity in the range of 2 to 5, it is desirable to use epoxy resin with viscosity of 1 Pas to 10 Pas. Under this condition, luminescent materials can be dispersed well.

It is to be noted that one kind of binder can be used singly, or two or more kinds of binders can be used in any combination in any ratio.

II-1-4-3. Ratio of Luminescent Material Used

In case binder is added to the green light emitting section 106 or to the red light emitting section 107, luminescent materials and binders can be mixed in any ratios. The weight ratio of luminescent materials to binder is usually set to be 0.01 or larger. Preferably, it is set to be 0.05 or larger, and more preferably, it is set to be 0.1 or larger. The ratio should usually be 5 or smaller. Preferably, it is 1 or smaller, and more preferably, it is 0.5 or smaller.

With a transmissive type backlight unit 101, it is preferred that the luminescent materials are properly dispersed in the green light emitting section 106 and the red light emitting section 107 in order to obtain larger luminous flux. On the other hand, with a backlight unit 101 of light reflection type (namely, light from blue light source 108, the green light emitting section 106 and the red light emitting section 107 leaves the light emitting device towards outside without passing through the green and the red light emitting sections 106, 107. See FIG. 8), it is preferred that luminescent materials are packed in high density in order to obtain larger luminous flux. Therefore, taking these things into consideration, the composition of luminescent materials should be decided depending on the use of display device, kind and physicochemical property of luminescent materials, and kind and viscosity of binders.

The color of white light emitted from the backlight unit 101, in addition to generating usual white light with a chromaticity coordinate of (x, y)=(0.33, 0.33), can be modified any way in order to correct the transmission characteristics of an image formation unit comprising any combination of a liquid crystal plate, display plate, diffusion plate, optical waveguide and the like. It is possible to generate light having a chromaticity coordinate in the range surrounded by (0.28, 0.25), (0.25, 0.28), (0.34, 0.40), and (0.40, 0.34).

II-1-4-4. Other Components

Luminescent materials may contain additional components so that the green light emitting section 106 and the red light emitting section 107 consist of luminescent materials, appropriately used binders and other additional components.

Additional components are not limited to specific compounds and any known additives can be used. For example, additives similar to the one described for the above-mentioned light emitting device can be used.

II-1-4-5. Method of Preparing Light Emitting Section

The method of preparing the green light emitting section 106 and the red light emitting section 107 is not limited to any specific method. For example, these units can be prepared in a method similar to the one described for the first emitting section and the second emitting section of the above-mentioned light emitting device.

In this embodiment, it is assumed that the green light emitting section 106 and the red light emitting section 107 are each composed of appropriate phosphors and binders. The amount and kind of luminescent materials and the size of the green and red light emitting section 106, 107 are assumed to be set so that the light emitted from the backlight unit 101 can be white light {namely, light with a chromaticity coordinate of (x=0.33, y=0.33)} when dispersed with the diffusion plate 102, if appropriate blue light is emitted from the blue light source 108.

II-2. DIFFUSION PLATE

A diffusion plate 102 is a member for dispersing the light emitted from backlight unit 101. This diffusion plate 102 is installed between backlight unit 101 and image formation unit 103, as shown in FIG. 4. The light emitted from backlight unit 101 is dispersed within the diffusion plate 102 and comes to be white light, which then emitted toward image formation unit 103.

There is no limitation on concrete constitution of diffusion plate 102. Therefore, any shape, material, size or the like thereof can be selected, resulting in that any known diffusion plate can be used. Examples include: a sheet with convexoconcave on both sides; and a structure formed so that minute particles of synthetic resin, glass or the like is dissipated in a binder such as synthetic resin. In the latter instance, light diffusion is achieved through the mechanism caused by the difference in refractive index between the binder and minute particles. The sheet, binder, minute particles or the like used in these examples are usually formed from materials which allow each component of white light emitted from backlight unit 101, which is blue, green and red light, to pass through.

In this embodiment, it is assumed that a sheet having convexoconcave on both sides and transparent for visible light is used as diffusion plate 102.

II-3. IMAGE FORMATION UNIT

An image formation unit 103 forms images at the front side thereof when irradiated with above-mentioned white light emitted by backlight unit 101 on the back side thereof. There is no specific limitation on it and any known one having any shape, size, material and so on can be used, insofar as it can form some images and allow the transmission of at least a part of backlight radiated thereon.

As examples of image formation unit 103 can be cited a liquid crystal unit used in liquid crystal displays or the like, and a indicator used in internal lighting indicators.

One example of a liquid crystal unit is such that a liquid crystal layer, formed by color filter, transparent electrode, oriented film, liquid crystal, another oriented film and another transparent electrode in this order, is retained within a case like glass cell with polarizing film on front side and back side. In this example of liquid crystal unit, images are formed by controlling the molecular arrangement of liquid crystal using an electrode for energizing the transparent electrodes. At that time, with the white light (backlight) radiated from the above-mentioned backlight unit 101 onto this liquid crystal unit from back side, the images formed at the liquid crystal unit can be clearly displayed at the front side of the liquid crystal unit.

Images formed on image formation unit can be displayed at any position by the display device, insofar as it is at the front side of the image formation unit. The images can be displayed at the front side of the image formation unit directly, as well as they can be displayed by projecting the image on some projection screen. This kind of example is a liquid crystal projector.

In case an indicator is used as image formation unit, images formed on the indicator can be clearly displayed at the front side of the indicator by illuminating the indicator from back side with white light (backlight) emitted from the above-mentioned backlight unit 101.

Any type of images, such as letters or graphics, can be formed at the image formation unit 103.

In this embodiment, a liquid crystal unit that displays images directly at the front side thereof is used as image formation unit 103.

II-4. ADVANTAGEOUS EFFECTS

When the display device of the present embodiment, having above-mentioned constitution, is used, it should be applied with appropriate electric power through wiring 109 and electrode 110, in order to allow blue light source 108 of backlight unit 101 to emit intended white light. The blue light source 8, applied with electric power, emits blue light with intensity corresponding to the electric power supplied. A part of the blue light is directed to the diffusion plate 102 as one component of white light, and another part of it is absorbed by the luminescent materials within the corresponding green light emitting sections 106 and red light emitting sections 107.

Green light emitting section 106 emits green light on excitation of blue light absorbed by the luminescent material. This green light is directed to the diffusion plate 102 as one component of white light. On the other hand, red light emitting section 107 emits red light on excitation of red light absorbed by the luminescent material. This red light is also directed to the diffusion plate 102 as one component of white light. At this point, as green and red light emitting section 106, 107 are formed independently from each other, green light is not absorbed by the luminescent material of red light emitting section 107. This enables the prevention of lowering the luminous flux of green light and of disturbing the balance of components included in white light.

Blue, green and red light emitted from backlight unit 101 enters diffusion plate 102 and is dissipated within the diffusion plate 102. And then it is emitted toward image formation unit 103. The light emitted from backlight unit 101 may be perceived visually as the light having irregularly divided colors, because it is not yet dissipated sufficiently before entering diffusion plate 102. However it is dissipated within the diffusion plate 102 and can be excellent white colored light, perceived visually as white light, at the moment of reaching image formation unit 103.

Image formation unit 103 is irradiated with white light emitted from diffusion plate 102 from back side, which makes images formed on image formation unit 103 be displayed clearly at the front of image formation unit 103. The color reproduction property, with this images displayed on image formation unit 103, can be highly improved, because the white light contains blue, green and red light components and the balance of the components of the white light can be maintained well.

Further, decrease in the luminous flux can be prevented, as green light is not allowed to be absorbed by the luminescent material within red light emitting section 107. This results in the saving of the energy to produce backlight. In other words, emission efficiency of backlight can be enhanced.

II-5. OTHERS

Although the third embodiment of the present invention has been explained in detail, it is to be understood that the display device of the present invention is not limited to the third embodiment and it can be modified anyway insofar as it does not depart from the scope of the invention.

Figure 8:
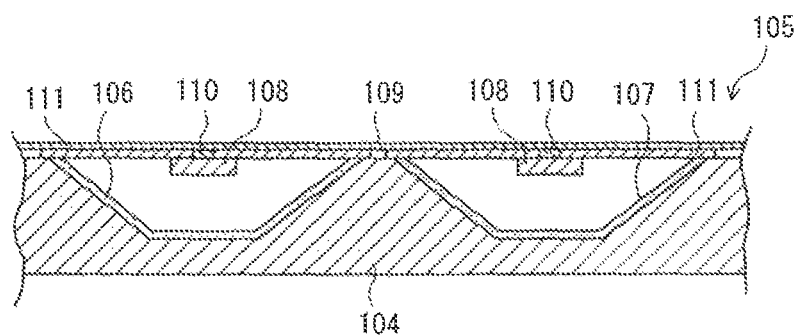
FIG. 8 is a schematic cross-sectional view illustrating the essential part of a backlight unit, as exemplified in the modified example of a third embodiment of the present invention.

For example, either green light emitting section 106 or red light emitting section 107 may be formed as reflecting type of one, as shown in FIG. 8. Namely, in the constitution of FIG. 8, blue light source 108 is installed apart from basal board 104 by beam 111, and green and red light emitting sections 106, 107 are formed by coating them on the surface of concave portion of basal board 104. Wiring 109 and electrodes 108 are positioned at the surface of basal board 104 and beam 111 respectively, so as to allow electric power to be supplied to blue light source 108. Other than these, green light emitting section 106 and red light emitting section 107 of FIG. 8 is constructed in similar way to the above-mentioned third embodiment. In this instance, a part of blue light emitted from blue light source 108 is emitted to image formation unit 103 as one component of white light and another part of it is directed to green light emitting section 106 and red light emitting section 107. At green light emitting section 106 and red light emitting section 107, formed on the surface of concave portions, the luminescent material is excited by the blue light and emit green light and red light. After all, backlight unit 101 can emit white light. In addition, as green light emitting section 106 and red light emitting section 107 are installed independently from each other, green light is not absorbed by the luminescent material of red light emitting section 107 when it is emitted. This enables the prevention of lowering the luminous flux of green light and of fluctuating the balance of components included in white light. In FIG. 8, the components having the same reference letters as in FIGS. 4 to 7 show the same components as in FIGS. 4 to 7.

Further, green light emitting section 106 and red light emitting section 107 may be formed by using a surface mount type frame. A backlight unit 101 with this surface mount type frame is sometimes preferred depending on the use of the display device.

Figure 9:
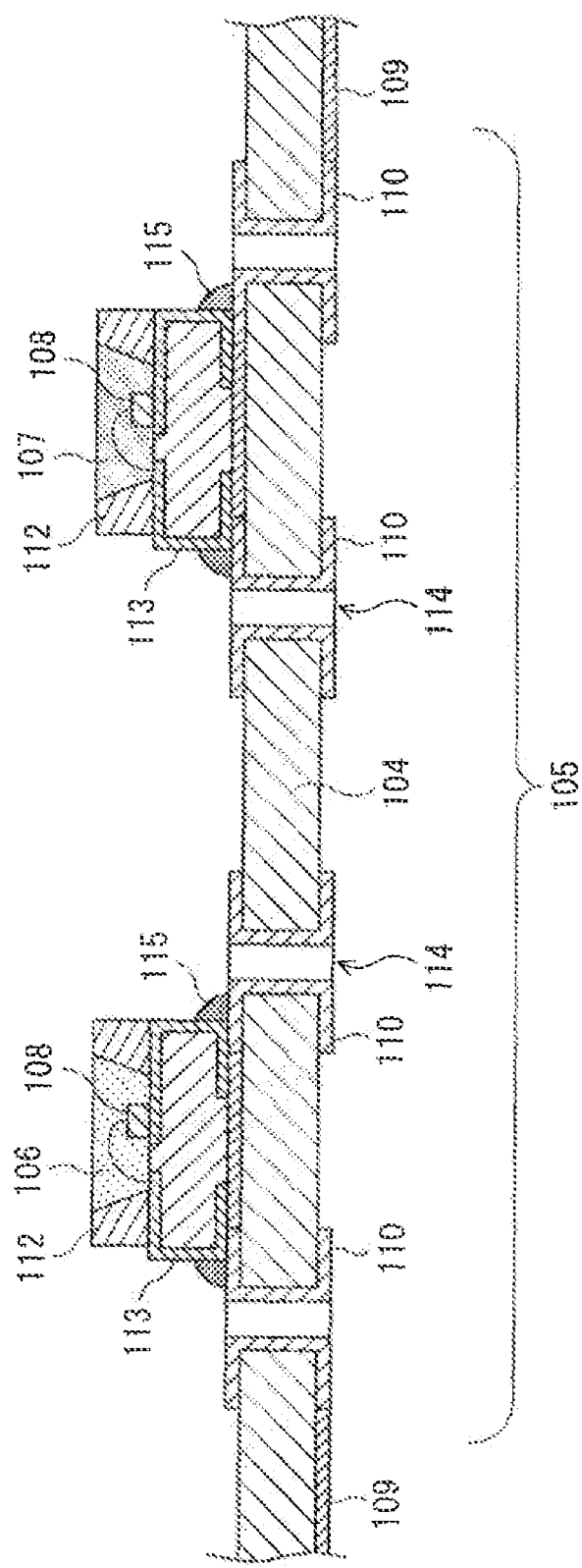
FIG. 9 is a schematic, cross-sectional view of one example of the constitution of a light emitting section using a surface-mounted type frame, as exemplified in the backlight unit in the modified example of a third embodiment of the present invention.

One concrete example of the constitution of light emitting section 105 using surface mount type frame is illustrated in FIG. 9. FIG. 9 is a schematic, cross-sectional view of one example of the constitution of a light emitting section 105 using a surface-mounted type frame. In FIG. 9, the components having the same reference letters as in FIGS. 4 to 8 show the same components as in FIGS. 4 to 8.

In the constitution of FIG. 9, a green light emitting section 106 and a red light emitting section 107, formed within a different frame 112 respectively, are installed on one side of basal board 104. This pair of green and red light emitting section 106, 107 forms a light emitting section 105.

It is desirable to form frame 112 so that shape, size, material (including heat dissipating property, color and reflection) and the like thereof are similar to those of basal board 104 described particularly in the above-mentioned third embodiment, as well as that it is not allowed to pass through any green light emitted from green light emitting section 106. In FIG. 9, it is assumed that each light emitting section 105 has a pair of frame 112, each of which is cup-shaped, with concave portion, and that it has wiring 113 formed to connect between the bottom of the concave portion and the underside of frame 112. It is also assumed that a blue light source 108, having a wiring 113 connected, is installed in each of the above-mentioned frame 112, which is paired two by two, and that one frame 112 of the pair is filled with green luminescent material and binder to form green light emitting section 106 and the other frame 112 of the pair is filled with red luminescent material and binder to form red light emitting section 107. Basal board 104 is supposed to be formed with through-holes 114, each of them having an electrode 110 installed. The electrodes 110 can be supplied with electric power via wirings 109 formed on the backside of basal board 104. The electrodes 110 and wirings 113 of frames 112 are connected using solder 115, which makes it possible to apply electric power to blue light source 108. The solder 115 is assumed to have functions not only of applying electric power to blue light source 108 but also of fixing green and red light emitting sections 106, 107 onto basal board 104, as well as of releasing heat generated at green and red light emitting sections 106, 107.

In this instance, where light emitting section 105 is constituted using a surface-mounted type frame, a part of blue light emitted from blue light source 108 is emitted to image formation unit 103 as one component of white light and another part of it is directed to green light emitting section 106 and red light emitting section 107. Green light emitting section 106 and red light emitting section 107, formed on the surface of concave portions, are excited by the blue light and emit green light and red light. After all, backlight unit 101 can emit white light. In addition, as green light emitting section 106 and red light emitting section 107 are installed independently from each other, green light is not absorbed by the luminescent material of red light emitting section 107 when it is emitted. This enables the prevention of lowering the luminous flux of green light and of fluctuating the balance of components included in white light.

An optical waveguide may be used for leading the white light from backlight unit 101 to image formation unit 103, for another example. With this optical waveguide, backlight unit 101 can be disposed at the location other than the facing position to image formation unit 103 as in the above-mentioned embodiment. This results in the heightened possibility of display device design. There is no specific limitation on the optical waveguide. Any known ones, such as mirror, prism, lens or optical fiber, can be used arbitrarily.

Figure 10:
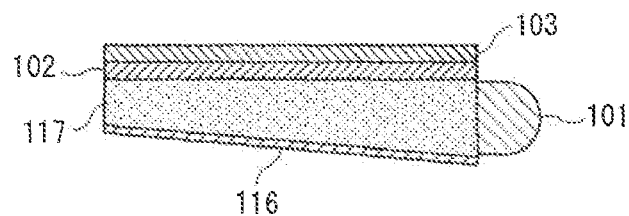
FIG. 10 is a schematic cross-sectional view illustrating the constitution of a display device using a optical waveguide, as exemplified in the modified example of a third embodiment of the present invention.

FIG. 10 is a schematic cross-sectional view illustrating the constitution of a display device using an optical waveguide. By using an optical waveguide, backlight unit 101 can be positioned at a lateral side of image formation unit 103, as exemplified in FIG. 10. In the constitution of FIG. 10, an optical waveguide 117 having reflection film 116 on the back side is used. Here, white light introduced from a lateral side (right hand side of Fig.) is reflected at reflection film 116 and then guided toward diffusion plate 102, located at the front (upper side of Fig.). With this construction as shown in FIG. 10, backlight unit 101 can be positioned at a lateral side of image formation unit 103. In FIG. 10, the components having the same reference letters as in FIGS. 4 to 9 show the same components as in FIGS. 4 to 9.

For another example, the display device may comprise some other components, such as antiflection film, view expansion film, luminance-enhancing film, lens sheet, protective cover, heat dissipation plate or the like, as needed.

It is possible to incorporate the constitutions described in the explanation about light emitting device and those described in the explanation about display device. It is also possible to combine each of above-mentioned embodiments and modifications.

The constitution of third embodiment can be achieved using light sources or luminescent materials emitting lights other than blue, red and green.

Light emitting devices or backlight units may comprise three or more light emitting sections, by providing a third emitting section to the above-mentioned light emitting device or by providing a yellow light emitting section to the backlight unit.

EXAMPLES

The present invention will be explained in further detail below referring to examples. It is to be understood that the present invention is not limited to specific examples explained below and it can be modified anyway insofar as it does not depart from the scope of the invention.

Example 1

Preparation of Green Light Emitting Section

The green light emitting section was prepared so that the mixed light (short wavelength light) consisting of blue light and green light, emitted from the green light emitting section, gives a chromaticity coordinate of (x, y)=(0.25, 0.35). The detail was as follows.

By using a surface mount type frame, as shown in FIG. 9, having a concave portion of about 2.5 mm in diameter and about 0.9 mm in depth, a blue LED (C460MB, made by Cree) was placed on the bottom of the concave portion of the frame as blue light source so that electric power is supplied to the blue light source from behind the board. In that concave portion fitted with the blue light source, paste consisting of a luminescent material $Ca_{2.94}Ce_{0.06}Sc_{1.94}Mg_{0.06}Si_3O_{12}$ and silicone resin (binder) was filled to form a green light emitting section. The ratio of the luminescent material and the binder was approx. 95:5 by weight.

(Preparation of Red Light Emitting Section)

The red light emitting section was prepared so that the mixed light (long wavelength light) consisting of blue light and red light, emitted from the red light emitting section, gives a chromaticity coordinate of (x, y)=(0.56, 0.27). More specifically, as luminescent material, $Ca_{0.992}AlSiEu_{0.008}N_{2.85}O_{0.15}$ was used. The ratio of the luminescent material and the binder was set at approx. 98:2 by weight. Other details were similar to those described for the green light emitting section.

(Measurement of White Light)

Electric current of 20 mA was supplied to the blue LED of both the green light emitting section and the red light emitting section, and the LED was allowed to emit light. Light emitted from each of green and red light emitting section was measured for the emission spectrum of the emitted light, using a spectroscope HR2000 (Ocean Optics) and an integrating sphere for LED (Ocean Optics). It was confirmed that the chromaticity coordinate of the emitted light coincides with the intended chromaticity coordinate.

Figure 11:
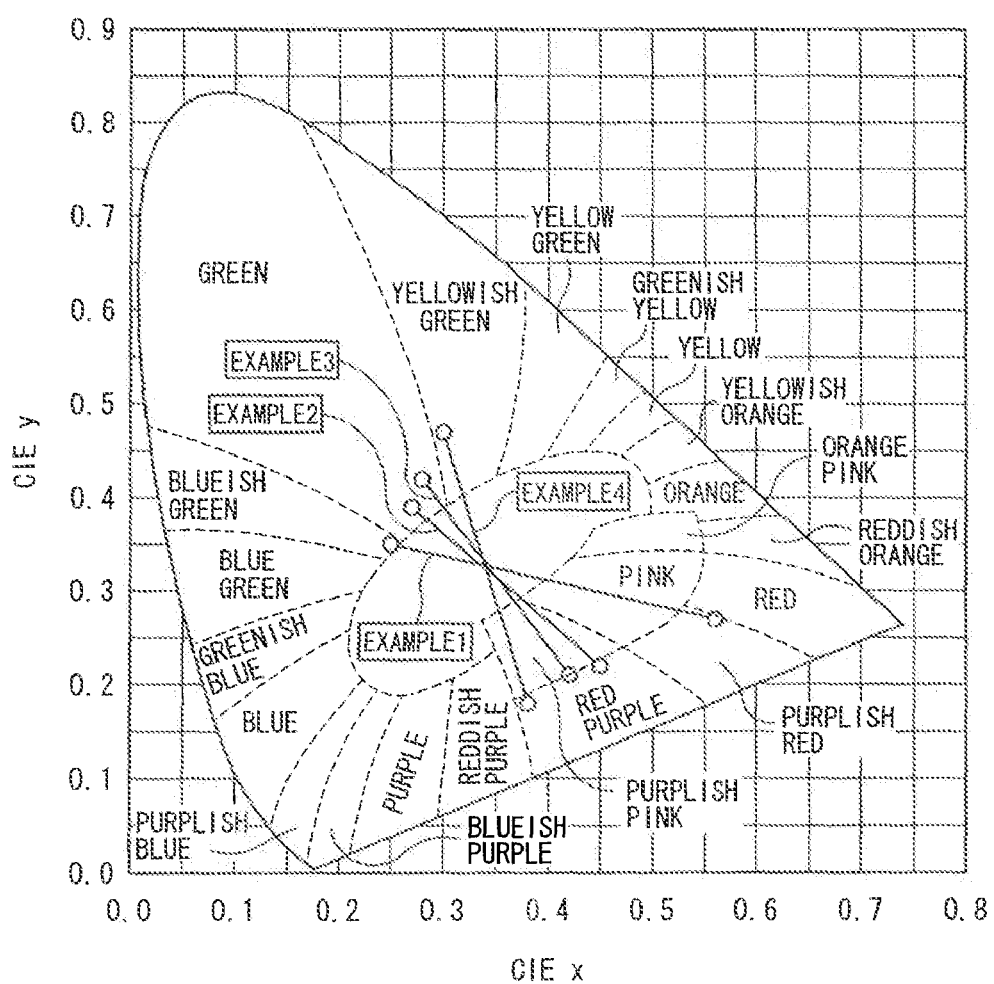
FIG. 11 is a chromaticity diagram illustrating the method of generating white light, as explained in examples 1 to 4 of the present invention.
Figure 12:
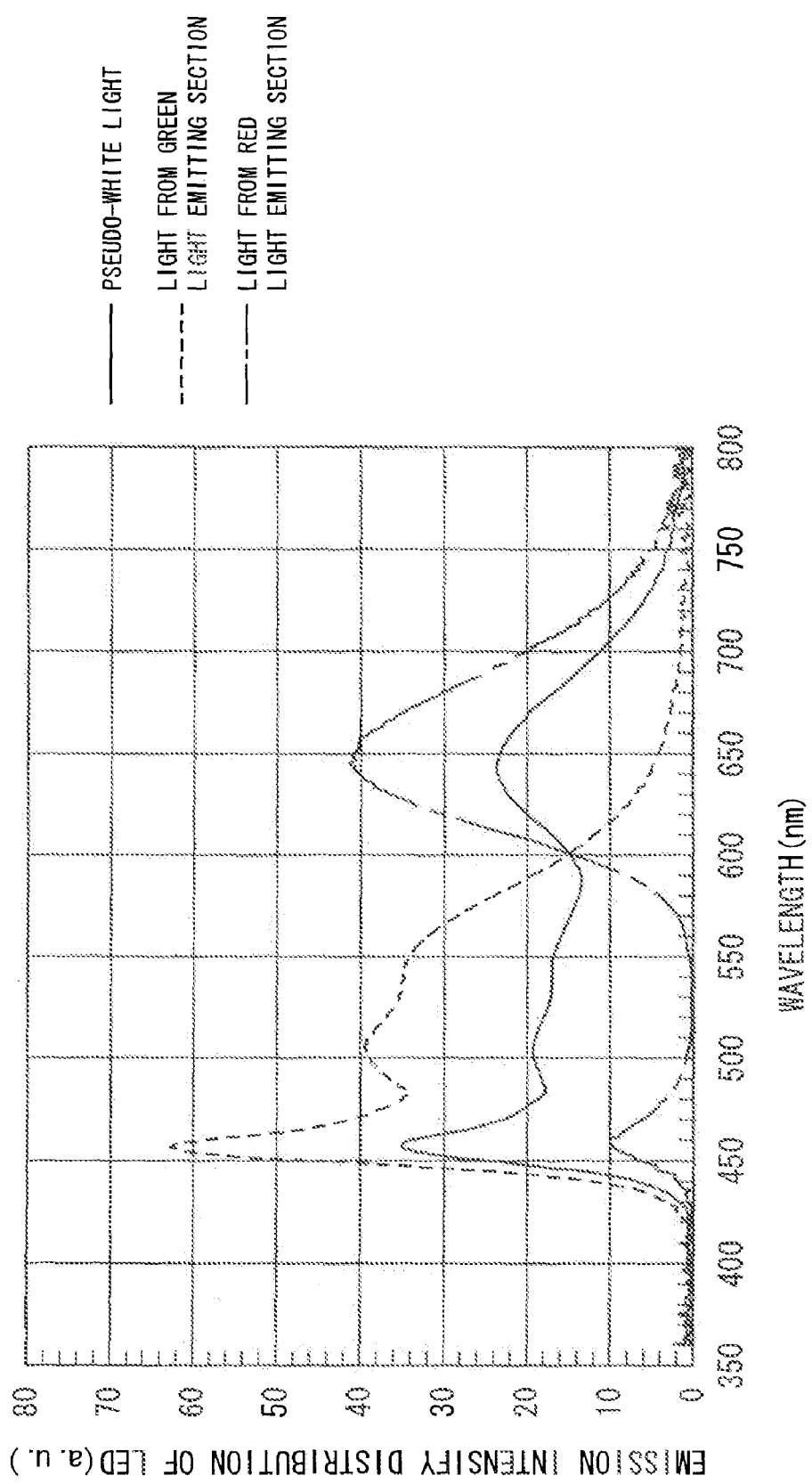
FIG. 12 is a graph showing the emission spectrum of white light, as calculated for example 1 of the present invention.

Based on the result of the measurement, white light giving a chromaticity coordinate of (x, y)=(0.33, 0.33) was generated from the light emitted from the green and red light emitting sections, and the emission spectrum, of the white light, was calculated. Namely, as shown in FIG. 11, an attempt was made to generate white light having a chromaticity coordinate on the line segment connecting the chromaticity coordinate of light (short wavelength light) from the green light emitting section and that of light (long wavelength light) from the red light emitting section. Emission intensity of light from both of green and red light emitting sections was calculated and adjusted to realize the intended white light. In this example, spectral ratio of the light from the green light emitting section and that from the red light emitting section was set at 0.48:0.52. Calculated emission spectrum is shown in FIG. 12. FIG. 11 is a chromaticity diagram illustrating the method of generating white light in Example 1 to 4. Plots at both ends of each line segment represent chromaticity coordinates of the light from the green light emitting section and the red light emitting section respectively.

The entire luminous flux from the white light was 1.2 lm per one blue LED.

Example 2

The green light emitting section was prepared in the same method as described for Example 1, except that the mixing ratio of the luminescent material and the binder was adjusted so that the mixed light (short wavelength light) consisting of blue light and green light gives a chromaticity coordinate of (x, y)=(0.27, 0.39).

Further, the red light emitting section was prepared in the same method as described for Example 1, except that the mixing ratio of the luminescent material and the binder was adjusted so that the mixed light (long wavelength light) consisting of blue light and red light gives a chromaticity coordinate of (x, y)=(0.45, 0.22).

Figure 13:
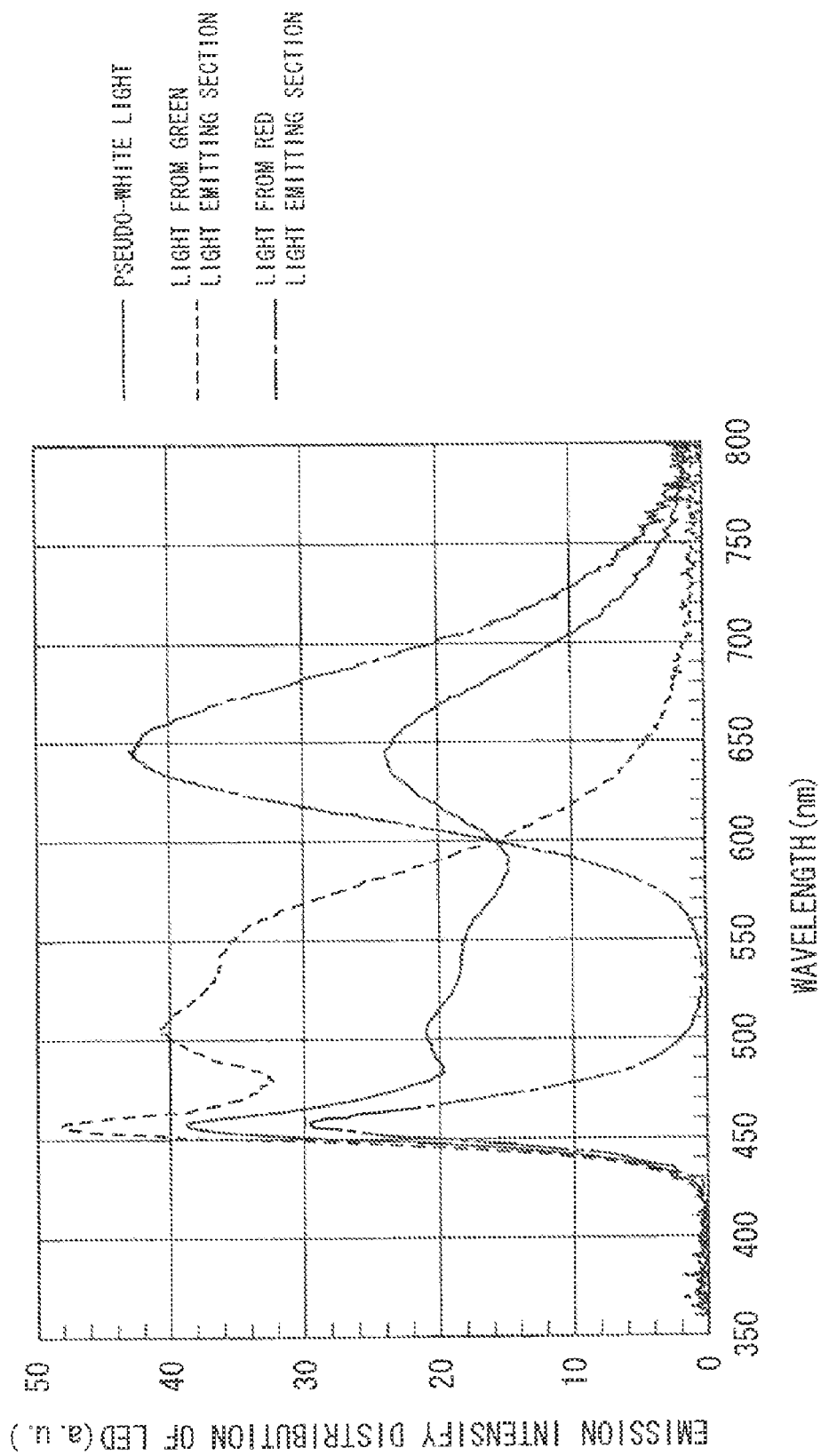
FIG. 13 is a graph showing the emission spectrum of white light, as calculated for example 2 of the present invention.

White light was generated similarly to Example 1 except that the chromaticity coordinate of the white light was set to (x, y)=(0.32, 0.33), and the emission spectrum was calculated. In this example, spectral ratio of the light from the green light emitting section and that from the red light emitting section was set at 0.50:0.50. FIG. 13 shows the emission spectrum, as calculated in this example.

The entire luminous flux from the white light was 1.3 lm per one blue LED.

Example 3

The green light emitting section was prepared in the same method as described for Example 1, except that the mixing ratio of the luminescent material and the binder was adjusted so that the mixed light (short wavelength light) consisting of blue light and green light gives a chromaticity coordinate of (x, y)=(0.28, 0.42).

Further, the red light emitting section was prepared in the same method as described for Example 1, except that the mixing ratio of the luminescent material and the binder was adjusted so that the mixed light (long wavelength light) consisting of blue light and red light gives a chromaticity coordinate of (x, y)=(0.42, 0.21).

Figure 14:
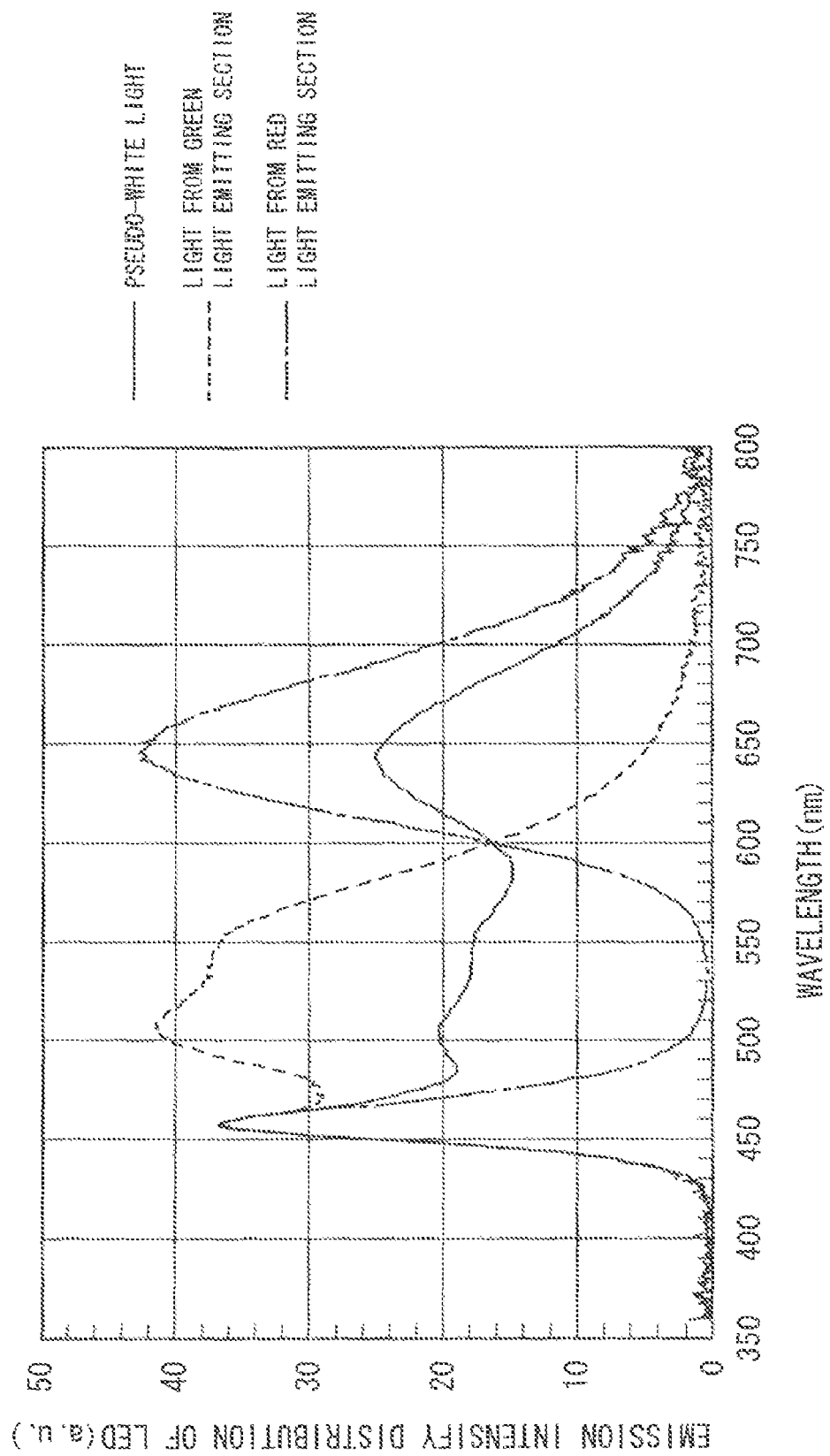
FIG. 14 is a graph showing the emission spectrum of white light, as calculated for example 3 of the present invention.

White light was generated similarly to Example 1 and the emission spectrum was calculated. In this example, spectral ratio of the light from the green light emitting section and that from the red light emitting section was set at 0.47:0.53. FIG. 14 shows the emission spectrum, as calculated in this example.

The entire luminous flux from the white light was 1.3 lm per one blue LED.

Example 4

The green light emitting section was prepared in the same method as described for Example 1, except that the mixing ratio of the luminescent material and the binder was adjusted so that the mixed light (short wavelength light) consisting of blue light and green light gives a chromaticity coordinate of (x, y)=(0.30, 0.47).

Further, the red light emitting section was prepared in the same method as described for Example 1, except that the mixing ratio of the luminescent material and the binder was adjusted so that the mixed light (long wavelength light) consisting of blue light and red light gives a chromaticity coordinate of (x, y)=(0.38, 0.18).

Figure 15:
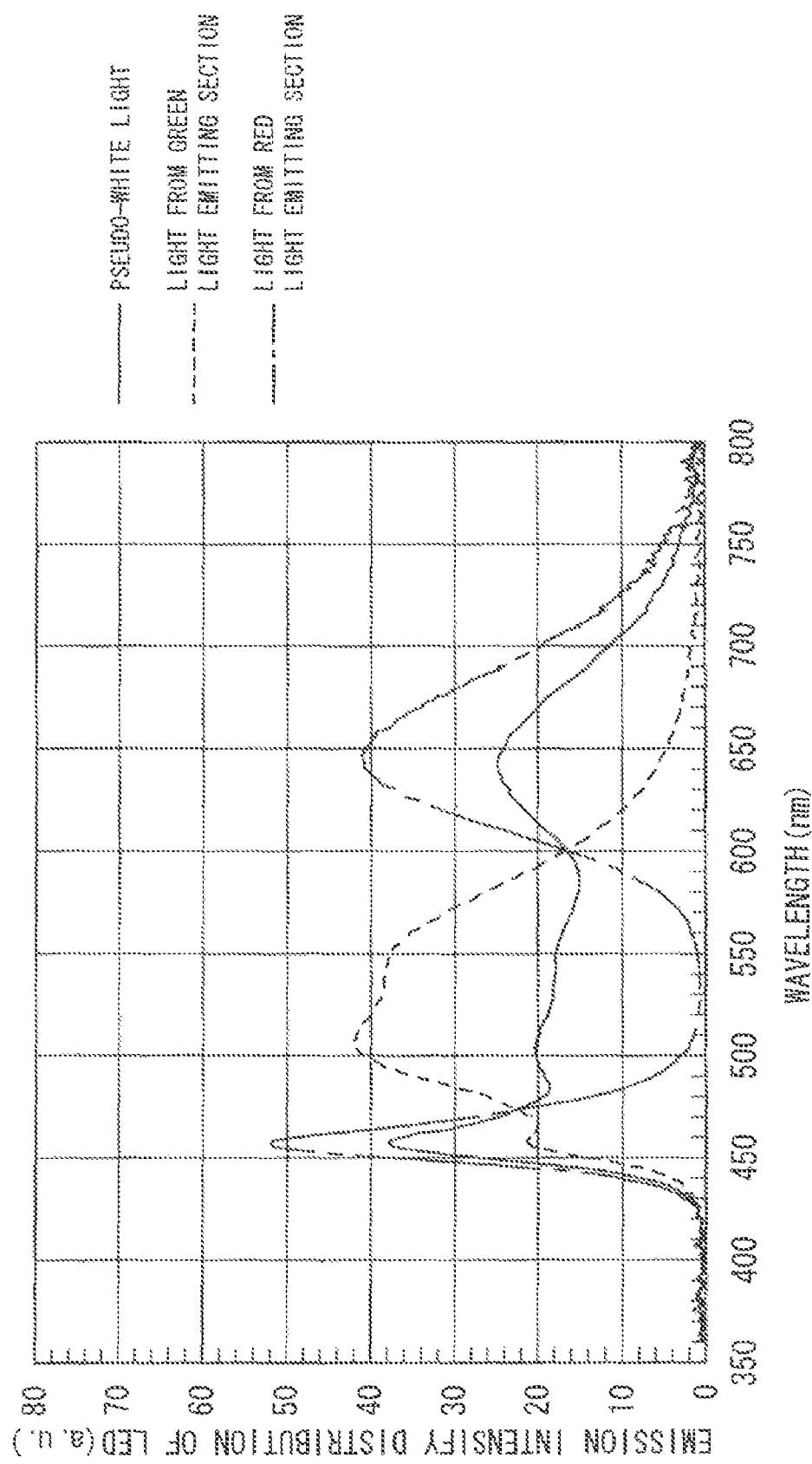
FIG. 15 is a graph showing the emission spectrum of white light, as calculated for example 4 of the present invention.

White light was generated similarly to Example 1 and the emission spectrum was calculated. In this example, spectral ratio of the light from the green light emitting section and that from the red light emitting section was set at 0.46:0.54. FIG. 15 shows the emission spectrum, as calculated in this example.

The entire luminous flux from the white light was 1.3 lm per one blue LED.

Example 5

The green light emitting section was prepared in the same method as described for Example 1, except that $Ca_{2.94}Ce_{0.06}Sc_2Si_3O_{12}$ was used as green luminescent material and the mixing ratio of the luminescent material and the binder was adjusted so that the mixed light (short wavelength light) consisting of blue light and green light gives a chromaticity coordinate of (x, y)=(0.24, 0.37).

Further, the red light emitting section was prepared in the same method as described for Example 1, except that the mixing ratio of the luminescent material and the binder was adjusted so that the mixed light (long wavelength light) consisting of blue light and red light gives a chromaticity coordinate of (x, y)=(0.52, 0.26).

Figure 16:
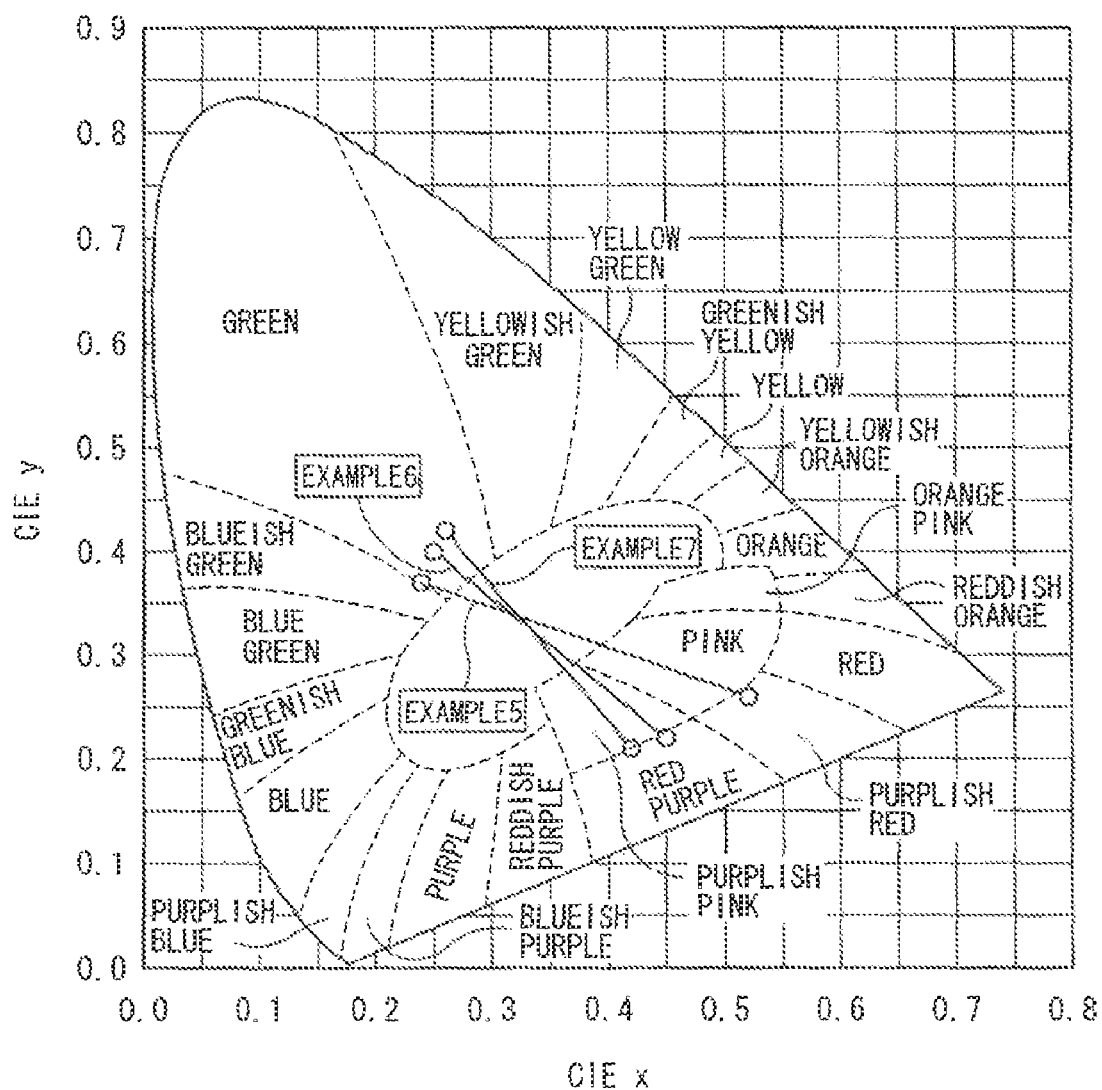
FIG. 16 is a chromaticity diagram illustrating the method of generating white light, as explained in examples 5 to 7 of the present invention.
Figure 17:
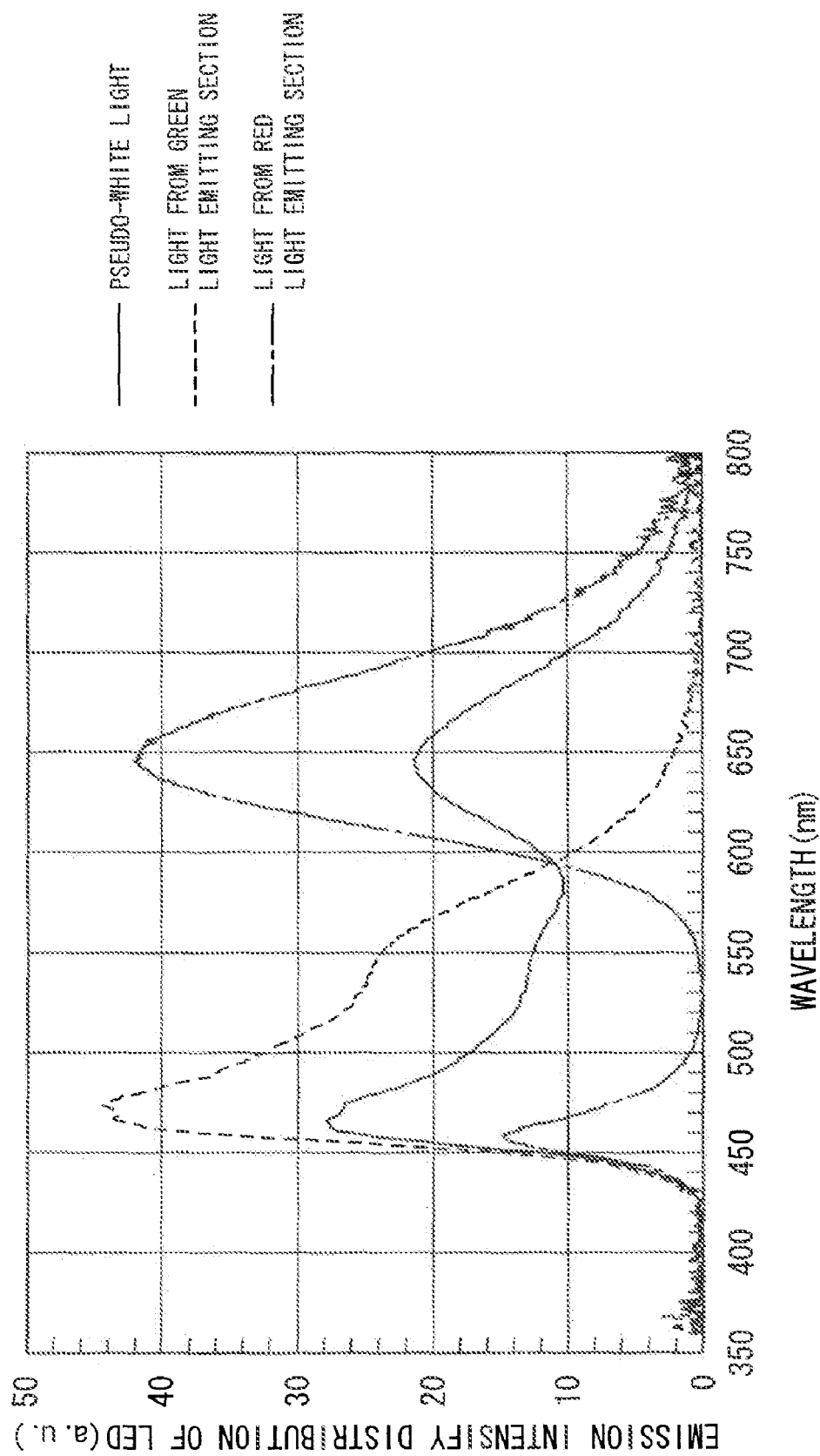
FIG. 17 is a graph showing the emission spectrum of white light, as calculated for example 5 of the present invention.

White light was generated similarly to Example 1 and the emission spectrum was calculated. In this example, spectral ratio of the light from the green light emitting section and that from the red light emitting section was set at 0.52:0.48. Further, a chromaticity diagram illustrating the method of generating white light in Example 5 to 7 is shown in FIG. 16. In this FIG. 16, as in FIG. 11, plots at both ends of each line segment represent chromaticity coordinates of light from the green light emitting section and the red light emitting section in each example. FIG. 17 shows the emission spectrum, as calculated in this example.

The entire luminous flux from the white light was 1.0 lm per one blue LED.

Example 6

The green light emitting section was prepared in the same method as described for Example 5, except that the mixing ratio of the luminescent material and the binder was adjusted so that the mixed light (short wavelength light) consisting of blue light and green light gives a chromaticity coordinate of (x, y)=(0.25, 0.40).

Further, the red light emitting section was prepared in the same method as described for Example 1, except that the mixing ratio of the luminescent material and the binder was adjusted so that the mixed light (long wavelength light) consisting of blue light and red light gives a chromaticity coordinate of (x, y)=(0.45, 0.22).

Figure 18:
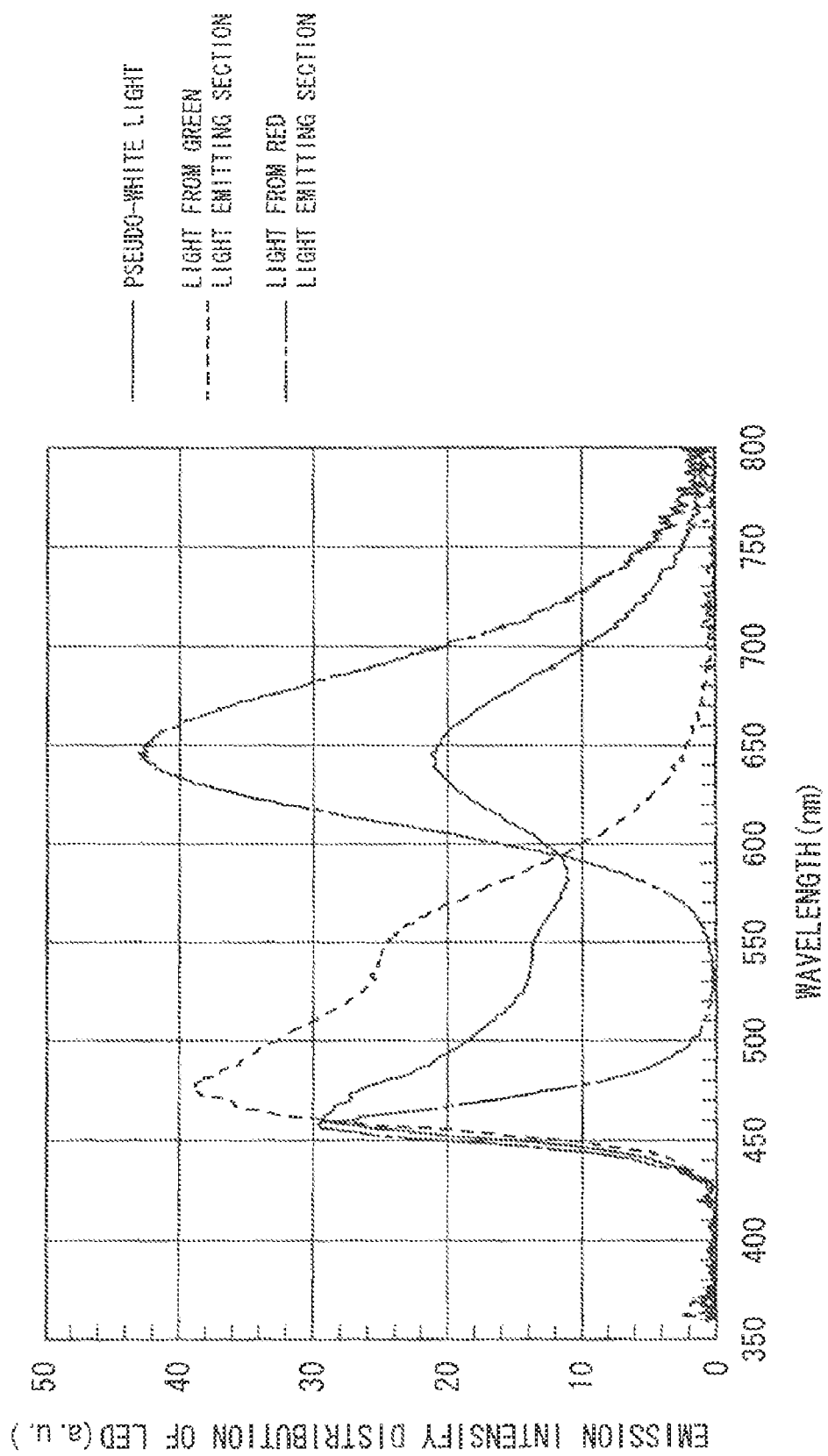
FIG. 18 is a graph showing the emission spectrum of white light, as calculated for example 6 of the present invention.

White light was generated similarly to Example 1 and the emission spectrum was calculated. In this example, spectral ratio of the light from the green light emitting section and that from the red light emitting section was set at 0.54:0.46. FIG. 18 shows the emission spectrum, as calculated in this example.

The entire luminous flux from the white light was 1.0 lm per one blue LED.

Example 7

The green light emitting section was prepared in the same method as described for Example 5, except that the mixing ratio of the luminescent material and the binder was adjusted so that the mixed light (short wavelength light) consisting of blue light and green light gives a chromaticity coordinate of (x, y)=(0.26, 0.42).

Further, the red light emitting section was prepared in the same method as described for Example 1, except that the mixing ratio of the luminescent material and the binder was adjusted so that the mixed light (long wavelength light) consisting of blue light and red light gives a chromaticity coordinate of (x, y)=(0.42, 0.21).

Figure 19:
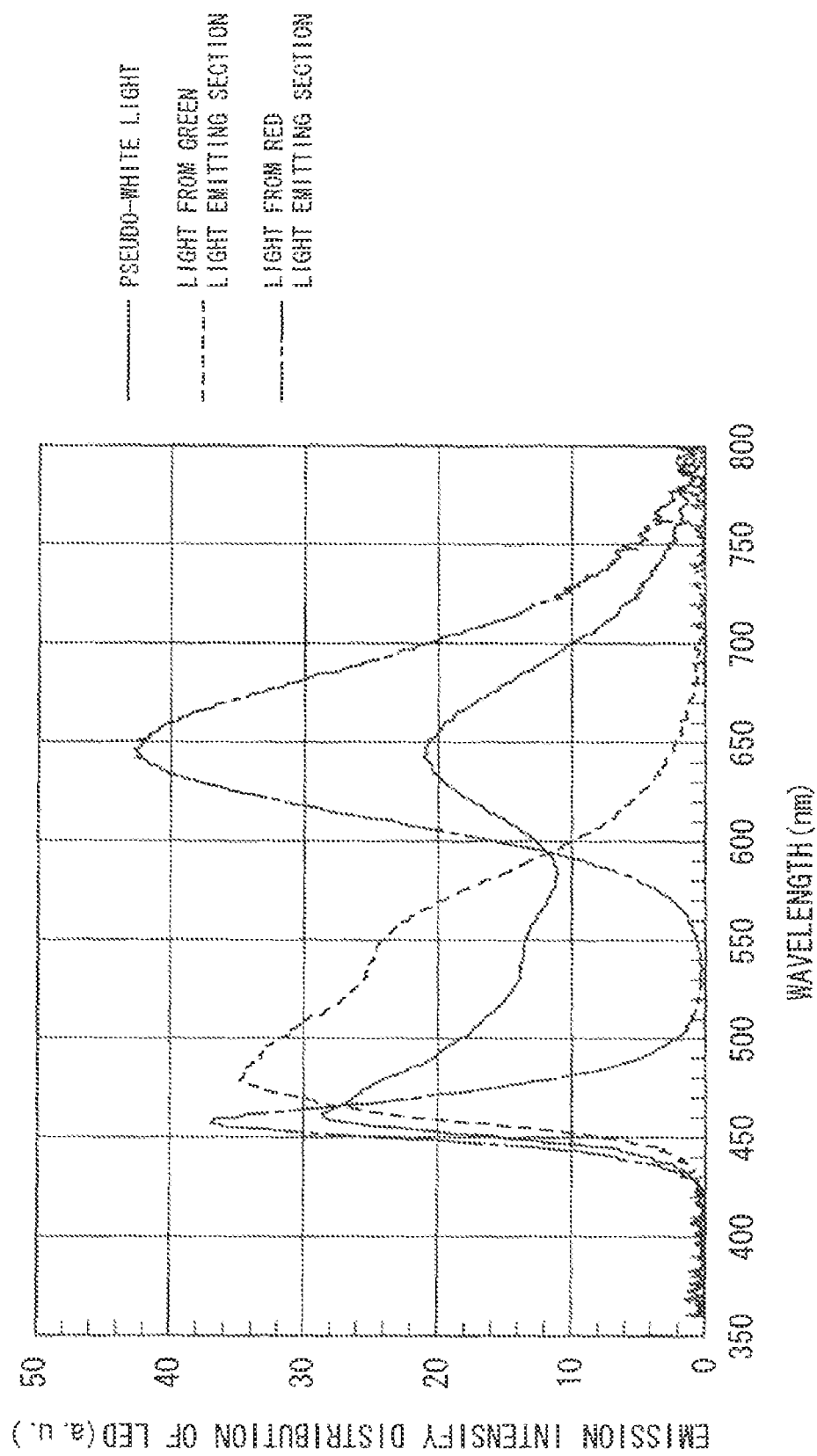
FIG. 19 is a graph showing the emission spectrum of white light, as calculated for example 7 of the present invention.

White light was generated similarly to Example 1 and the emission spectrum was calculated. In this example, spectral ratio of the light from the green light emitting section and that from the red light emitting section was set at 0.54:0.46. FIG. 19 shows the emission spectrum, as calculated in this example.

The entire luminous flux from the white light was 1.0 lm per one blue LED.

Example 8

The green light emitting section was prepared in the same method as described for Example 1, except that the mixing ratio of the luminescent material and the binder was adjusted so that the mixed light (short wavelength light) consisting of blue light and green light gives a chromaticity coordinate of (x, y)=(0.25, 0.35).

Further, the red light emitting section was prepared in the same method as described for Example 1, except that $Ca_{0.1984}Sr_{0.7936}Eu_{0.008}AlSiN_3$ was used as the luminescent material of red light emitting section and the mixing ratio of the luminescent material and the binder was adjusted so that the mixed light (long wavelength light) consisting of blue light and red light gives a chromaticity coordinate of (x, y)=(0.51, 0.29).

Figure 20:
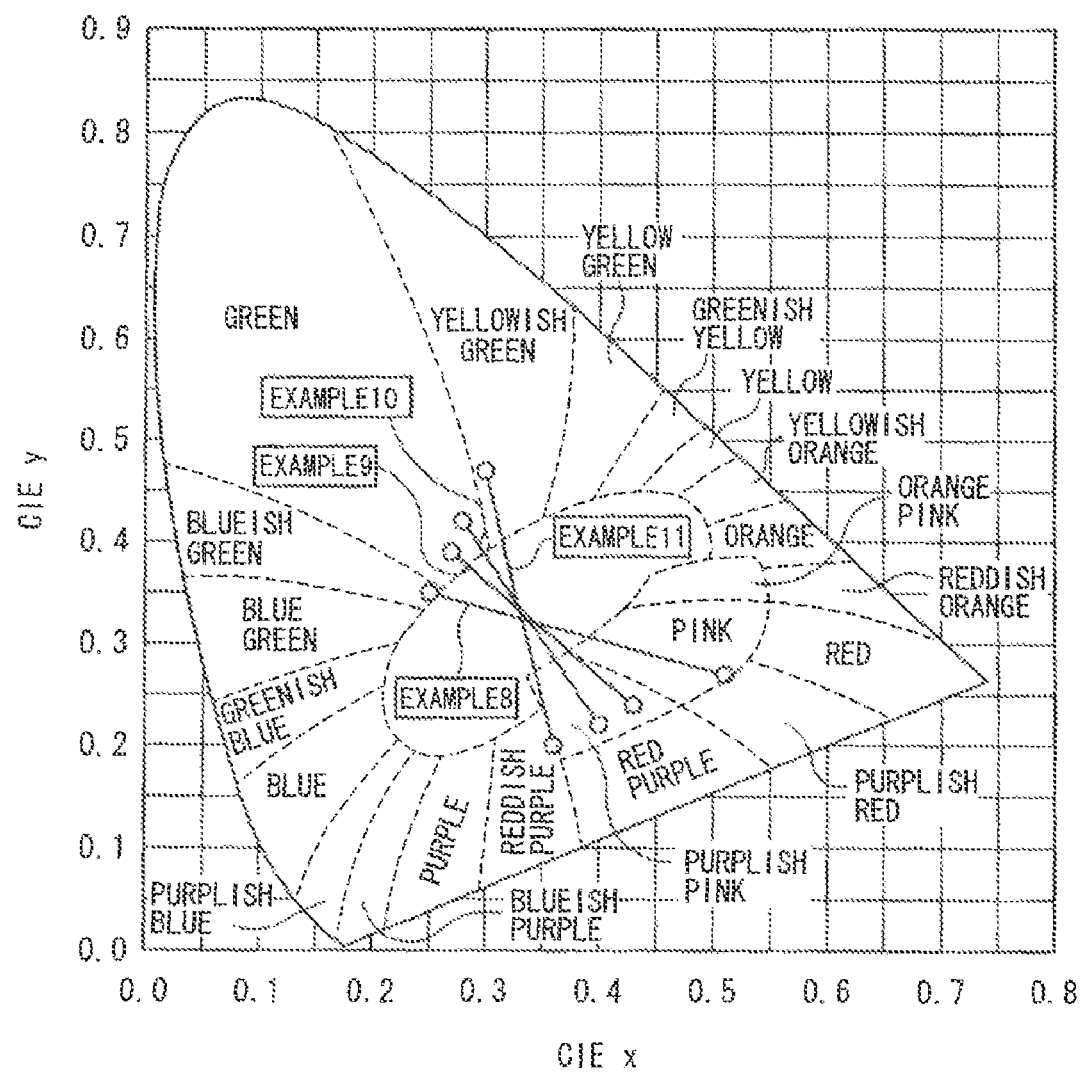
FIG. 20 is a chromaticity diagram illustrating the method of generating white light, as explained in examples 8 to 11 of the present invention.
Figure 21:
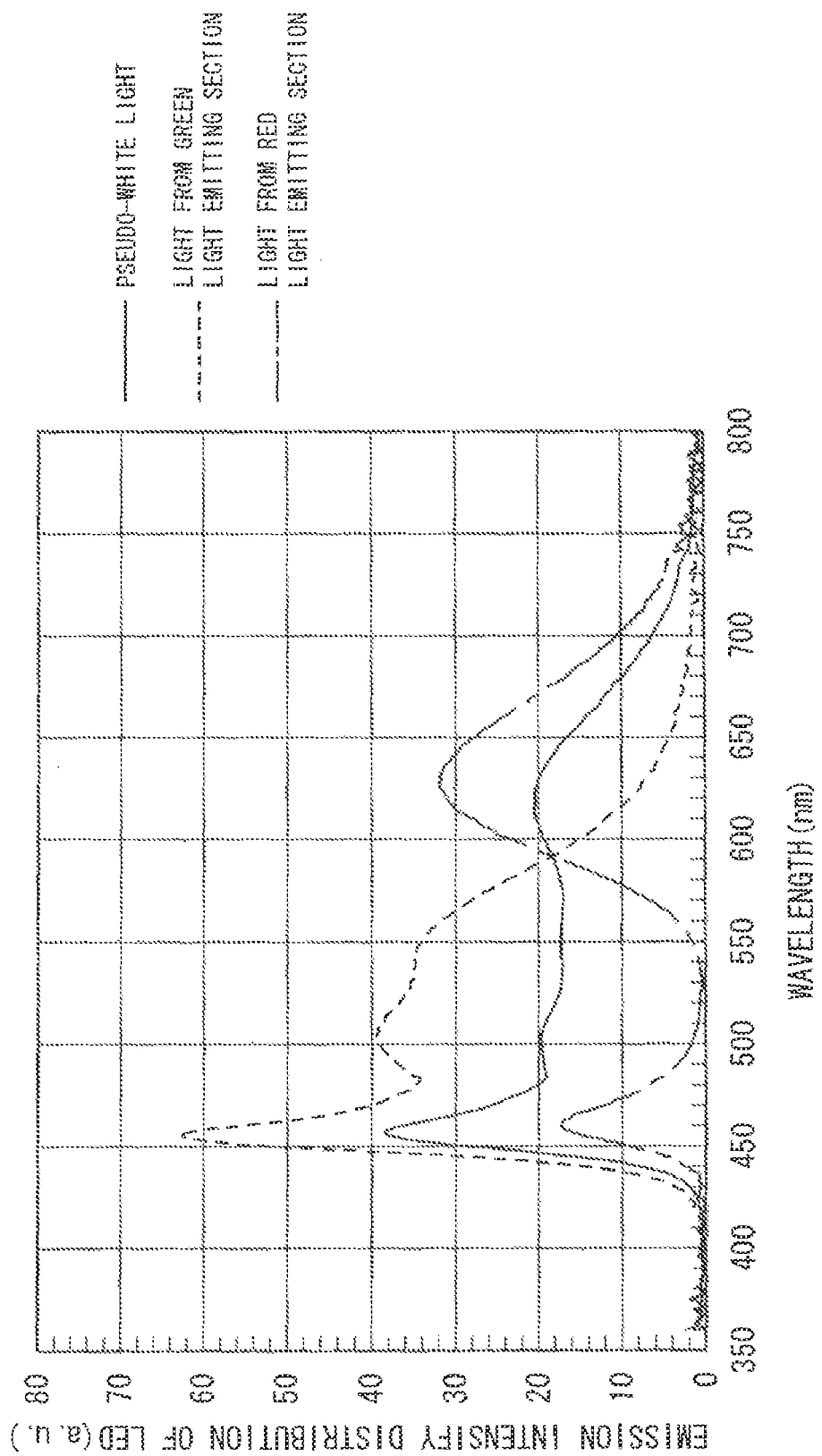
FIG. 21 is a graph showing the emission spectrum of white light, as calculated for example 8 of the present invention.

White light was generated similarly to Example 1 and the emission spectrum was calculated. In this example, spectral ratio of the light from the green light emitting section and that from the red light emitting section was set at 0.48:0.52. Further, a chromaticity diagram illustrating the method of generating white light in Example 8 to 11 is shown in FIG. 20. In this FIG. 20, as in FIGS. 11 and 16, plots at both ends of each line segment represent chromaticity coordinates of light from the green light emitting section and the red light emitting section in each example. FIG. 21 shows the emission spectrum, as calculated in this example.

The entire luminous flux from the white light was 1.3 lm per one blue LED.

Example 9

The green light emitting section was prepared in the same method as described for Example 1, except that the mixing ratio of the luminescent material and the binder was adjusted so that the mixed light (short wavelength light) consisting of blue light and green light gives a chromaticity coordinate of (x, y)=(0.27, 0.39).

Further, the red light emitting section was prepared in the same method as described for Example 8, except that the mixing ratio of the luminescent material and the binder was adjusted so that the mixed light (long wavelength light) consisting of blue light and red light gives a chromaticity coordinate of (x, y)=(0.43, 0.24).

Figure 22:
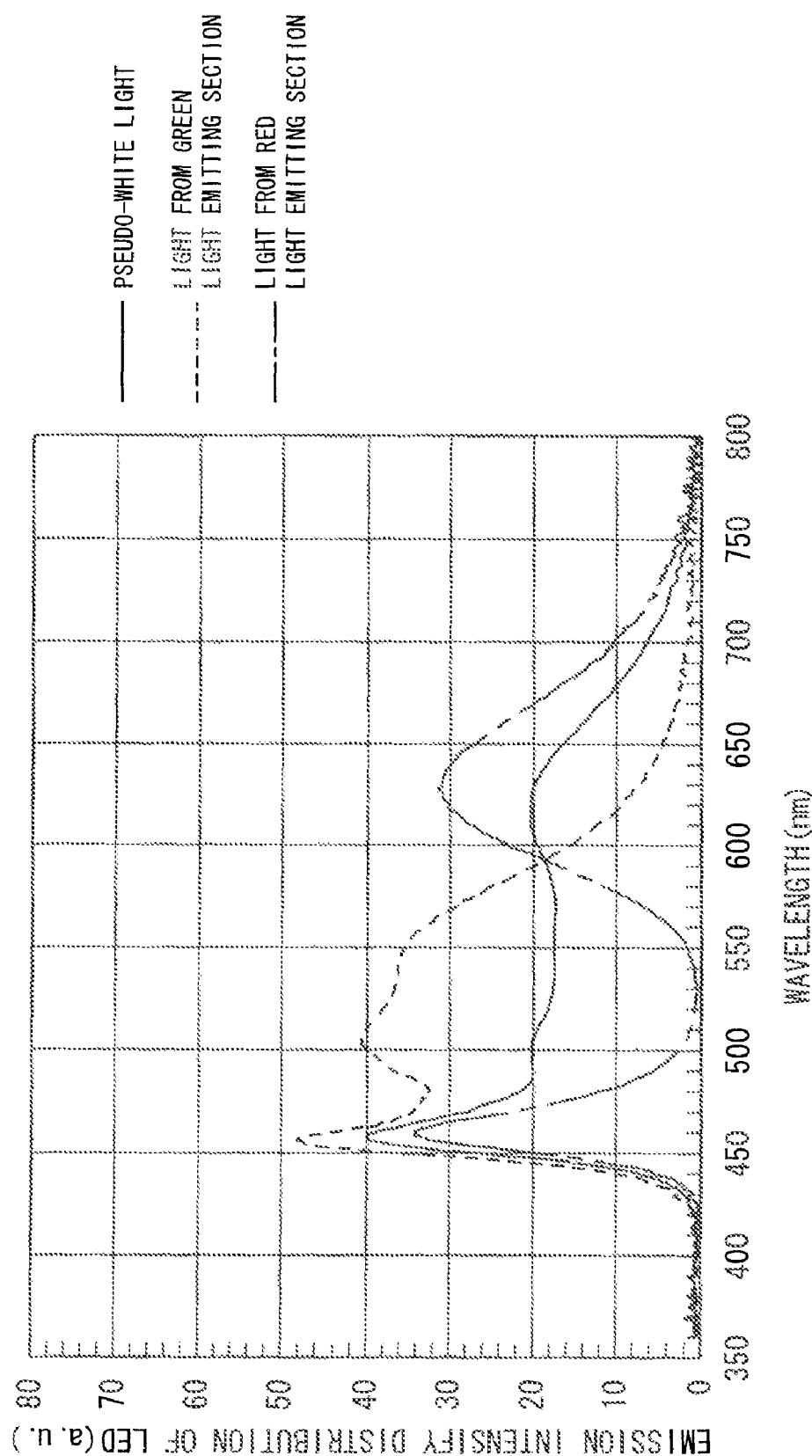
FIG. 22 is a graph showing the emission spectrum of white light, as calculated for example 9 of the present invention.

White light was generated similarly to Example 1 and the emission spectrum was calculated. In this example, spectral ratio of the light from the green light emitting section and that from the red light emitting section was set at 0.47:0.53. FIG. 22 shows the emission spectrum, as calculated in this example.

The entire luminous flux from the white light was 1.3 lm per one blue LED.

Example 10

The green light emitting section was prepared in the same method as described for Example 1, except that the mixing ratio of the luminescent material and the binder was adjusted so that the mixed light (short wavelength light) consisting of blue light and green light gives a chromaticity coordinate of (x, y)=(0.28, 0.42).

Further, the red light emitting section was prepared in the same method as described for Example 8, except that the mixing ratio of the luminescent material and the binder was adjusted so that the mixed light (long wavelength light) consisting of blue light and red light gives a chromaticity coordinate of (x, y)=(0.40, 0.22).

Figure 23:
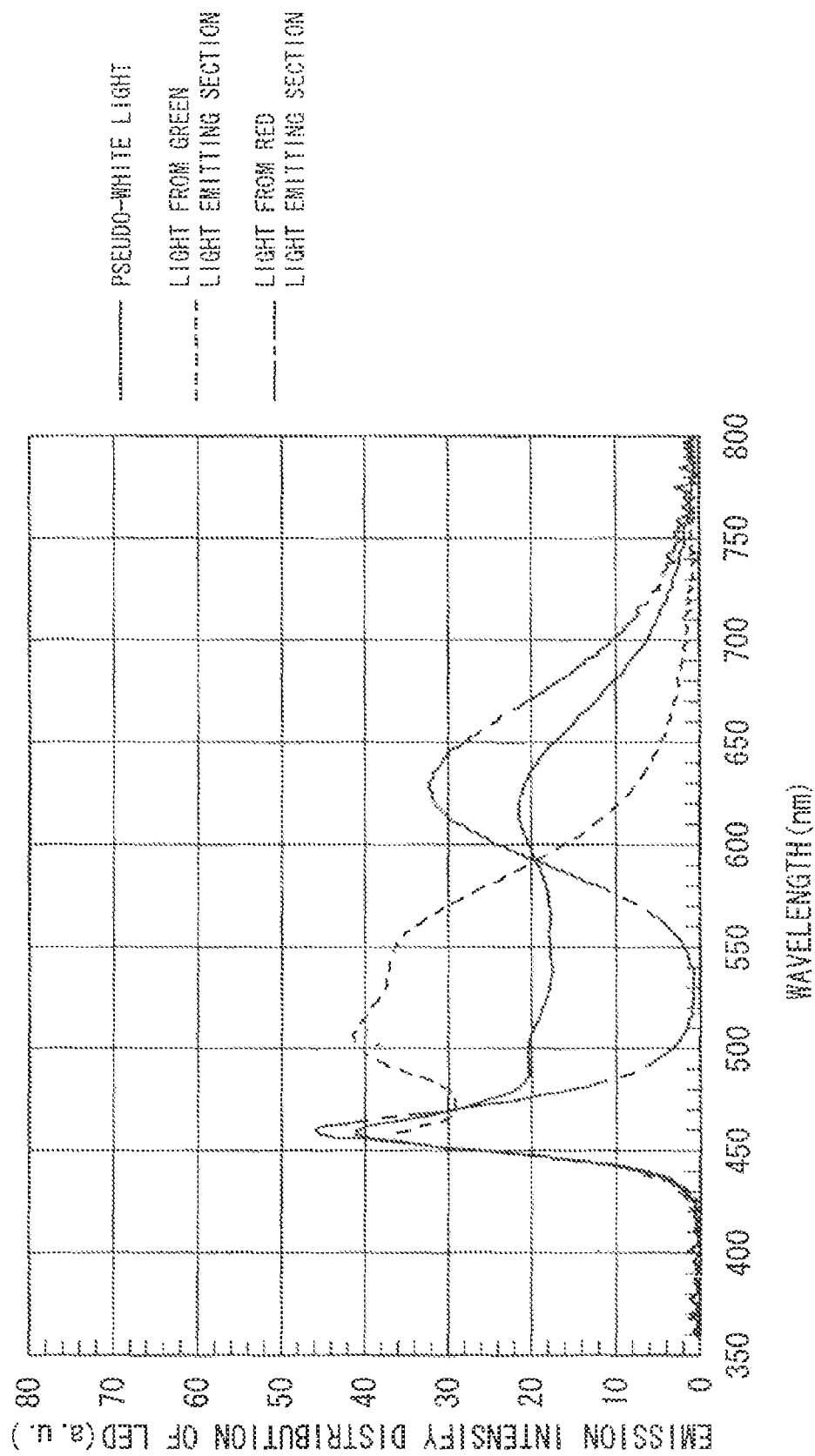
FIG. 23 is a graph showing the emission spectrum of white light, as calculated for example 10 of the present invention.

White light was generated similarly to Example 1 and the emission spectrum was calculated. In this example, spectral ratio of the light from the green light emitting section and that from the red light emitting section was set at 0.46:0.54. FIG. 23 shows the emission spectrum, as calculated in this example.

The entire luminous flux from the white light was 1.4 lm per one blue LED.

Example 11

The green light emitting section was prepared in the same method as described for Example 1, except that the mixing ratio of the luminescent material and the binder was adjusted so that the mixed light (short wavelength light) consisting of blue light and green light gives a chromaticity coordinate of (x, y)=(0.30, 0.47).

Further, the red light emitting section was prepared in the same method as described for Example 8, except that the mixing ratio of the luminescent material and the binder was adjusted so that the mixed light (long wavelength light) consisting of blue light and red light gives a chromaticity coordinate of (x, y)=(0.36, 0.20).

Figure 24:
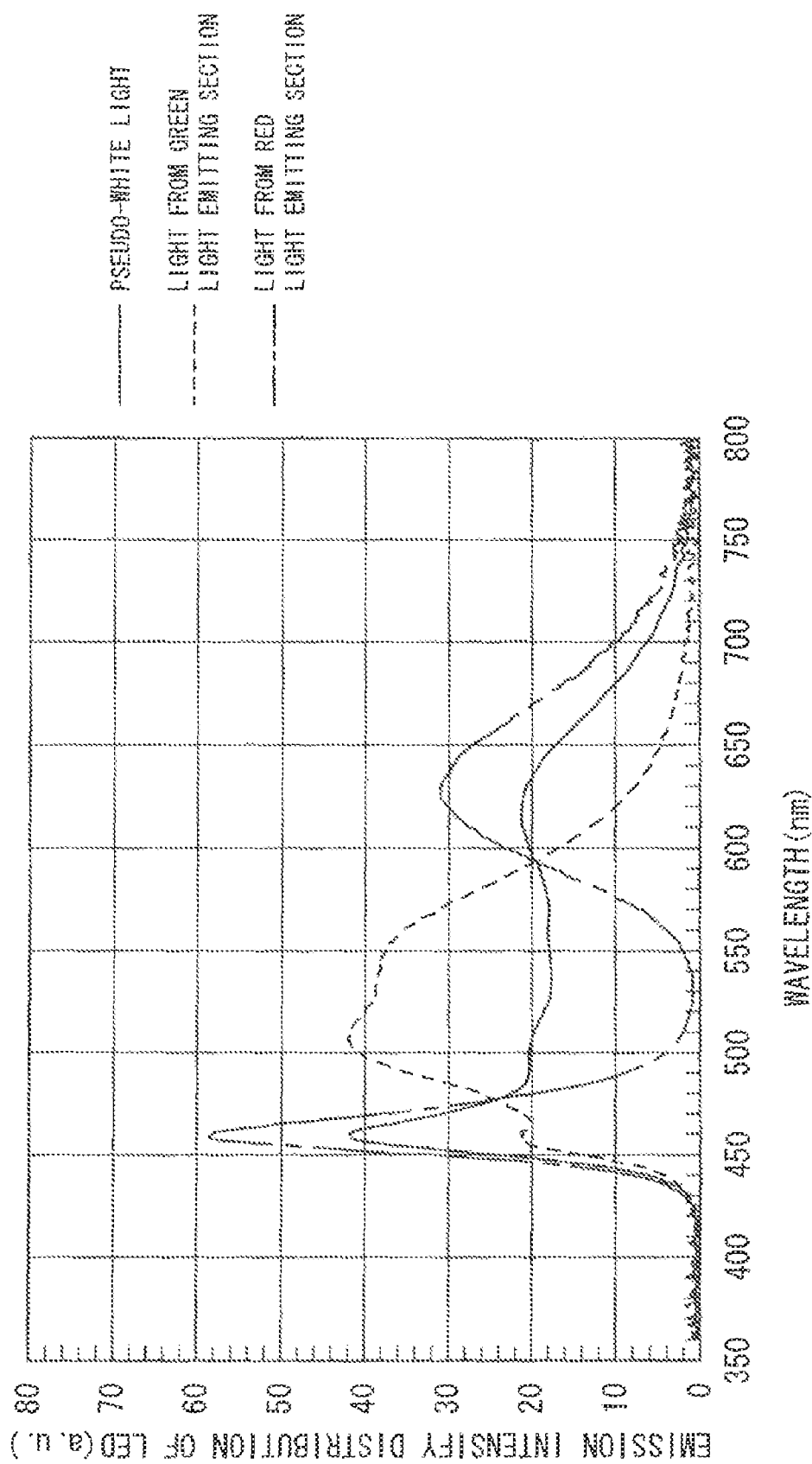
FIG. 24 is a graph showing the emission spectrum of white light, as calculated for example 11 of the present invention.

White light was generated similarly to Example 1 and the emission spectrum was calculated. In this example, spectral ratio of the light from the green light emitting section and that from the red light emitting section was set at 0.45:0.55. FIG. 24 shows the emission spectrum, as calculated in this example.

The entire luminous flux from the white light was 1.4 lm per one blue LED.

Example 12

The green light emitting section was prepared in the same method as described for Example 5, except that the mixing ratio of the luminescent material and the binder was adjusted so that the mixed light (short wavelength light) consisting of blue light and green light gives a chromaticity coordinate of (x, y)=(0.24, 0.36).

Further, the red light emitting section was prepared in the same method as described for Example 1, except that $Ca_{0.1984}Sr_{0.7936}Eu_{0.008}AlSiN_3$ was used as the luminescent material of red light emitting section and the mixing ratio of the luminescent material and the binder was adjusted so that the mixed light (long wavelength light) consisting of blue light and red light gives a chromaticity coordinate of (x, y)=(0.48, 0.27).

Figure 25:
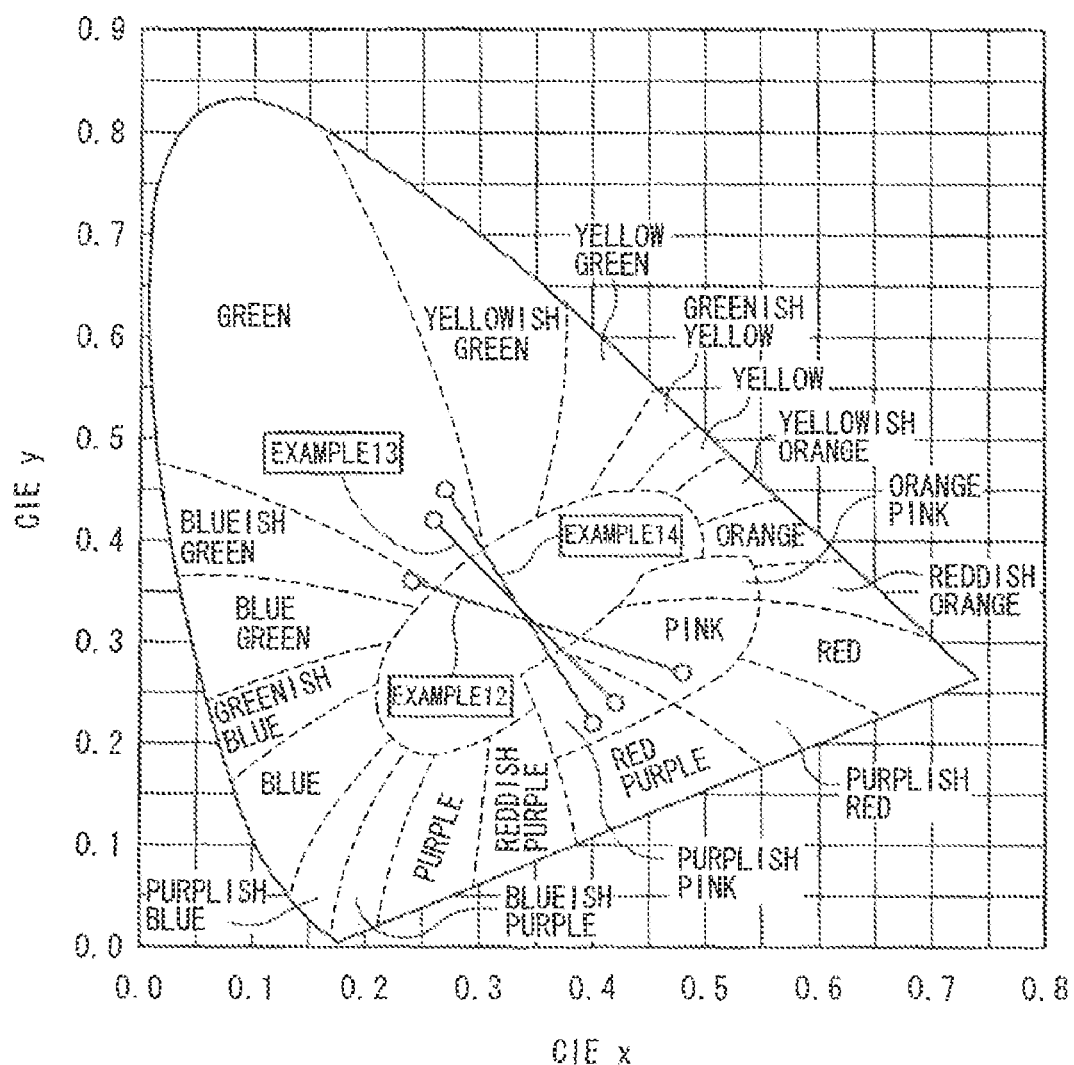
FIG. 25 is a chromaticity diagram illustrating the method of generating white light, as explained in examples 12 to 14 of the present invention.
Figure 26:
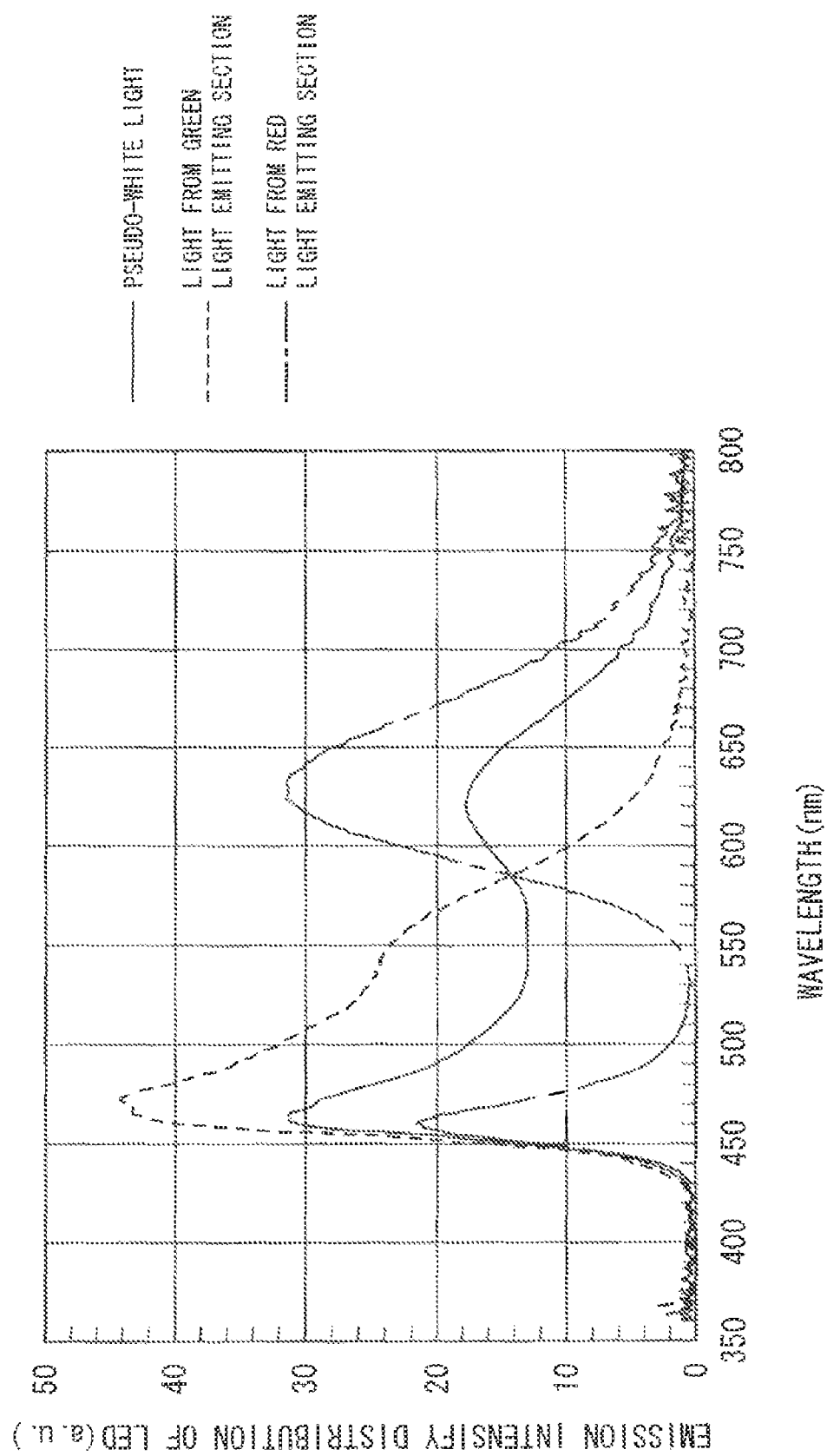
FIG. 26 is a graph showing the emission spectrum of white light, as calculated for example 12 of the present invention.

White light was generated similarly to Example 1 and the emission spectrum was calculated. In this example, spectral ratio of the light from the green light emitting section and that from the red light emitting section was set at 0.52:0.48. Further, a chromaticity diagram illustrating the method of generating white light in Example 12 to 14 is shown in FIG. 25. In this FIG. 25, as in FIGS. 11, 16 and 20, plots at both ends of each line segment represent chromaticity coordinates of light from the green light emitting section and the red light emitting section in each example. FIG. 26 shows the emission spectrum, as calculated in this example.

The entire luminous flux from the white light was 1.1 lm per one blue LED.

Example 13

The green light emitting section was prepared in the same method as described for Example 5, except that the mixing ratio of the luminescent material and the binder was adjusted so that the mixed light (short wavelength light) consisting of blue light and green light gives a chromaticity coordinate of (x, y)=(0.26, 0.42).

Further, the red light emitting section was prepared in the same method as described for Example 12, except that the mixing ratio of the luminescent material and the binder was adjusted so that the mixed light (long wavelength light) consisting of blue light and red light gives a chromaticity coordinate of (x, y)=(0.42, 0.24).

Figure 27:
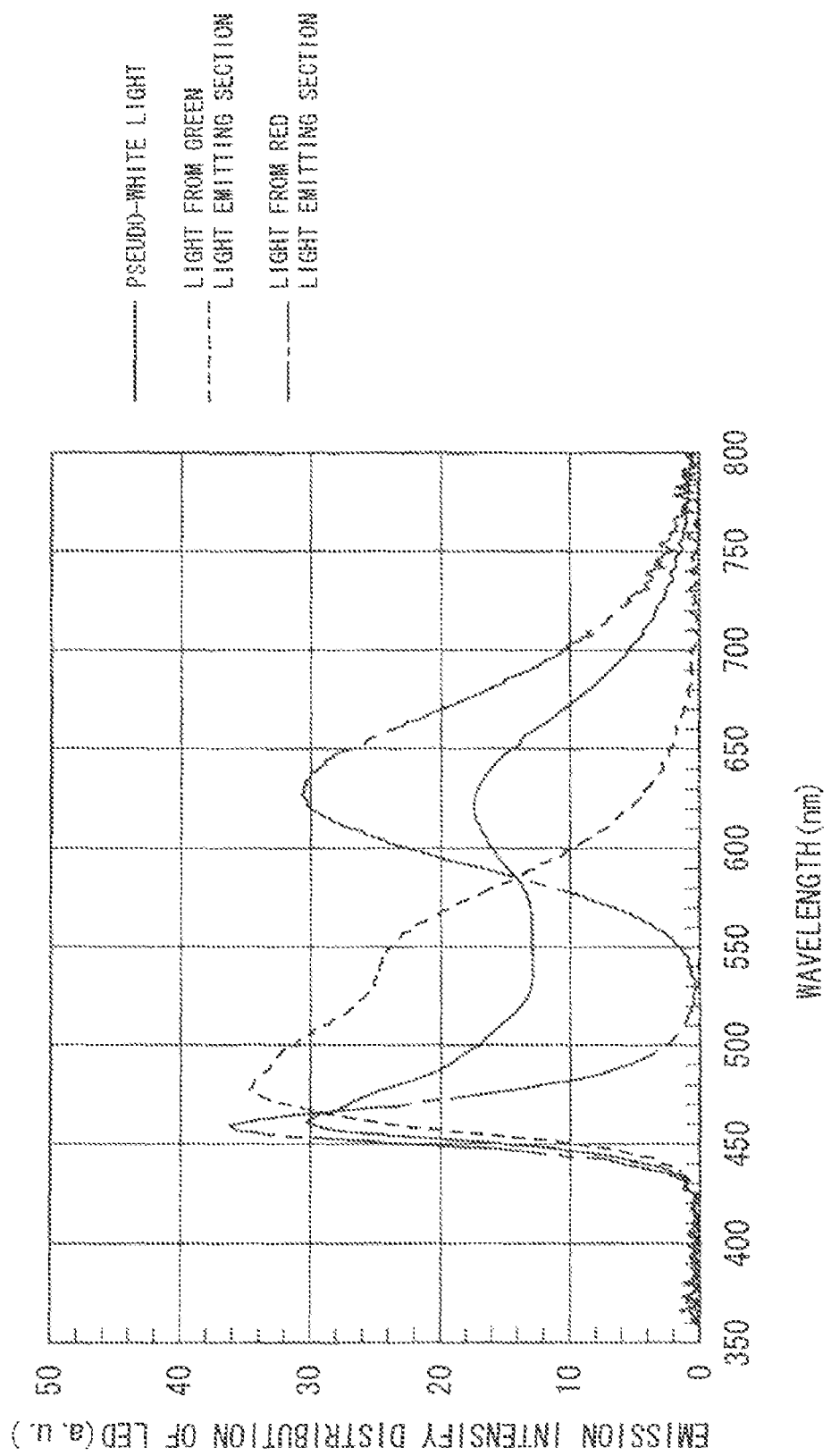
FIG. 27 is a graph showing the emission spectrum of white light, as calculated for example 13 of the present invention.

White light was generated similarly to Example 1 and the emission spectrum was calculated. In this example, spectral ratio of the light from the green light emitting section and that from the red light emitting section was set at 0.51:0.49. FIG. 27 shows the emission spectrum, as calculated in this example.

The entire luminous flux from the white light was 1.1 lm per one blue LED.

Example 14

The green light emitting section was prepared in the same method as described for Example 5, except that the mixing ratio of the luminescent material and the binder was adjusted so that the mixed light (short wavelength light) consisting of blue light and green light gives a chromaticity coordinate of (x, y)=(0.27, 0.45).

Further, the red light emitting section was prepared in the same method as described for Example 12, except that the mixing ratio of the luminescent material and the binder was adjusted so that the mixed light (long wavelength light) consisting of blue light and red light gives a chromaticity coordinate of (x, y)=(0.40, 0.22).

Figure 28:
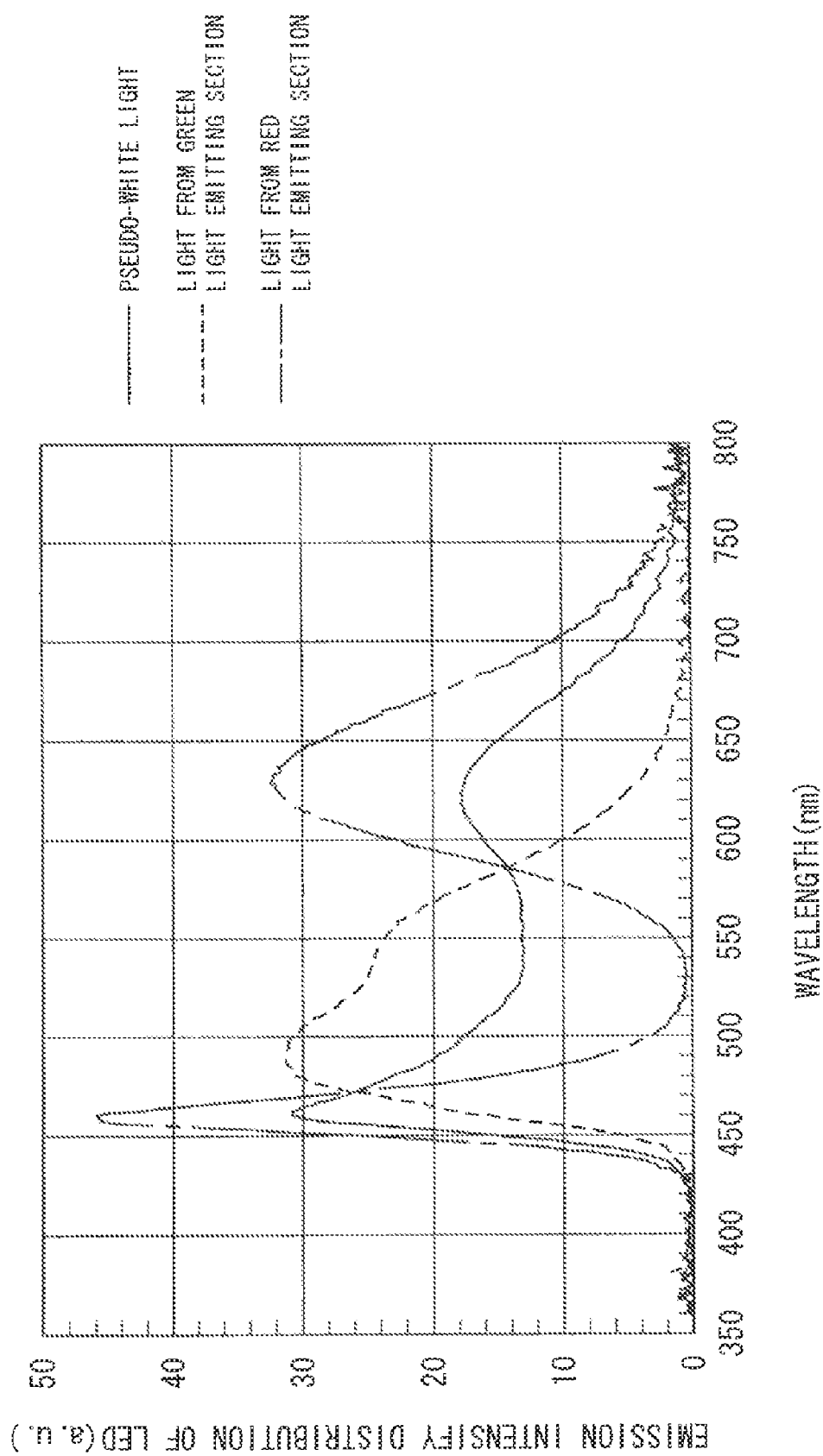
FIG. 28 is a graph showing the emission spectrum of white light, as calculated for example 14 of the present invention.

White light was generated similarly to Example 1 and the emission spectrum was calculated. In this example, spectral ratio of the light from the green light emitting section and that from the red light emitting section was set at 0.52:0.48. FIG. 28 shows the emission spectrum, as calculated in this example.

The entire luminous flux from the white light was 1.1 lm per one blue LED.

SUMMARY

From the examples mentioned above, it was confirmed that white light with abundant luminous flux can be obtained with the green light emitting section and red light emitting section installed independently. Further, this white light contains blue light, green light and red light components, and the use of a backlight unit comprising independently installed green light emitting section and red light emitting section, as described above, makes possible the creation of a display device having high emission efficiency and color reproduction property.

INDUSTRIAL APPLICABILITY

The present invention can be applied in any field where light is involved. The examples include: lighting system used indoors as well as outdoors, cellular phone, electric appliances for household use, display to be installed outdoors, display for various electronic appliances such as liquid crystal display and liquid crystal projector, indoors indicator.

Although the present invention was explained in detail referring to certain embodiments, it is evident for those skilled in the art that various changes or modifications can be made thereto without departing from the spirit and scope of the present invention.

The present invention is based on the specification of Japanese Patent Application No. 2004-194154 filed on Jun. 30, 2004, and the specification of Japanese Patent Application No. 2004-303363 filed on Oct. 18, 2004, and their entireties are hereby included by reference.

The invention claimed is:

1. A light emitting device, comprising:
a first light emitting section that comprises a first blue light source that receives electric power through a first wire and a first electrode and a first luminescent material which is excited by a first blue light emitted by the first blue light source and thereby emits green light, and the first light emitting section emits a first mixed light containing the first blue light emitted from the first blue light source and the green light emitted from the first luminescent material; and
a second light emitting section that comprises a second blue light source that receives electric power through a second wire and a second electrode and a second luminescent material which is excited by a second blue light emitted by the second blue light source and thereby emits red light, and the second light emitting section emits a second mixed light containing the second blue light emitted from the second blue light source and the red light emitted from the second luminescent material,
wherein the light emitting device emits white light containing the first mixed light and the second mixed light, and when a ratio of electric power supplied to the first blue light source through the first wire and the first electrode and electric power supplied to the second blue light source through the second wire and the second electrode is changed, balance in intensity of the first and second blue lights, green light, and red light contained in the white light changes.

2. The light emitting device according to claim 1, wherein:
the first blue light source is a light emitting diode, a laser diode, or an electroluminescence element; and
the second blue light source is a light emitting diode, a laser diode, or an electroluminescence element.

3. The light emitting device according to claim 1, wherein the first light emitting section further comprises a third luminescent material which is excited by the first blue light emitted by the first blue light source and thereby emits red light.

4. The light emitting device according to claim 1, wherein the second light emitting section comprises a fourth luminescent material which is excited by the second blue light emitted by the second blue light source and thereby emits green light.

5. The light emitting device according to claim 1, wherein the second luminescent material is a phosphor represented by following Formula (3), $$M_a A_b D_c E_d X_e \quad (3)$$

where
M represents one or more elements containing at least Eu and selected from the group consisting of Mn, Ce, Pr, Nd, Sm, Eu, Th, Dy, Ho, Er, Tm and Yb,
A represents one or more elements selected from bivalent metal elements other than M,
D represents one or more elements selected from tetravalent metal elements,
E represents one or more elements selected from trivalent metal elements,
x represents one or more elements selected from a group consisting of O, N, and F, and a value of a, b, c, d, e is selected from the value
satisfying all of the following conditions:
a is a number of $0.00001 \leq a \leq 0.1$
a and b establish a relationship of a+b=1
c is a number of $0.5 \leq c \leq 4$
d is a number of $0.5 \leq d \leq 8$
c, d, and e establish a relationship of $0.8 \times (2/3 + 4/3 \times c + d) \leq e$, and
c, d, and e establish a relationship of $e \leq 1.2 \times (2/3 + 4/3 \times c + d)$.

6. The light emitting device according to claim 1, wherein:
the first light emitting section is formed in a first cup-shaped recess;
the second light emitting section is formed in a second cup-shaped recess;
the first cup-shaped recess is formed in a first frame; and
the second cup-shaped recess is formed in a second frame different from the first frame.

7. A light emitting device, comprising:
a first light emitting section that comprises a first light source that receives electric power through a first wire and a first electrode and a first luminescent material which is excited by light emitted by the first light source and thereby emits light containing a light component having a wavelength longer than that of the light emitted by the first light source, and the first light emitting section emits a first light containing the light emitted from the first light source and the light emitted from the first luminescent material; and
a second light emitting section that comprises a second light source that receives electric power through a second wire and a second electrode, and a second luminescent material which is excited by light emitted by the second light source and thereby emits light containing a light component having a wavelength longer than that of light emitted by the first luminescent material, and the second light emitting section emits a second light containing the light emitted from the second light source and the light emitted from the second luminescent material and being different in chromaticity from the first light, wherein the light emitting device emits mixed light containing the first light and the second light, and when a ratio of electric power supplied to the first light source through the first wire and the first electrode and electric power supplied to the second light source through the second wire and the second electrode is changed, chromaticity of the mixed light changes.

8. The light emitting device according to claim 7, wherein:
the first light source and the second light source are driven by electric pulses; and
the change in the ratio of electric power includes a change in a ratio of a pulse lighting period of the first light source and a pulse lighting period of the second light source.

9. The light emitting device according to claim 7, wherein:
the first light source is a light emitting diode, a laser diode, or an electroluminescence element; and
the second light source is a light emitting diode, a laser diode, or an electroluminescence element.

10. The light emitting device according to claim 7, wherein:
the light emitted by the second light source has a wavelength of 370 nm or longer and of 500 nm or shorter;
the second luminescent material is a phosphor represented by following Formula (3), $$M_a A_b D_c E_d X_e \quad (3)$$

where
M represents one or more elements containing at least Eu and selected from the group consisting of Mn, Ce, Pr, Nd, Sm, Eu, Tb, Dy, Ho, Er, Tm and Yb,
A represents one or more elements selected from bivalent metal elements other than M,
D represents one or more elements selected from tetravalent metal elements,
E represents one or more elements selected from trivalent metal elements,
x represents one or more elements selected from a group consisting of O, N, and F, and
a value of a, b, c, d, e is selected from the value satisfying
all of the following conditions:
a is a number of $0.00001 \leq a \leq 0.1$
a and b establish a relationship of $a+b=1$
c is a number of $0.5 \leq c \leq 4$
d is a number of $0.5 \leq d \leq 8$
c, d, and e establish a relationship of $0.8 \times (2/3+4/3 \times c+d) \leq e$, and
c, d, and e establish a relationship of $e \leq 1.2 \times (2/3+4/3 \times c+d)$.

11. The light emitting device according to claim 7, wherein:
the first light emitting section is formed in a first cup-shaped recess;
the second light emitting section is formed in a second cup-shaped recess;
the first cup-shaped recess is formed in a first frame; and
the second cup-shaped recess is formed in a second frame different from the first frame.

12. A light emitting device, comprising:
a first light emitting section that emits a first mixed light which contains blue light and green light and which has a first predetermined chromaticity; and
a second light emitting section which emits a second mixed light which contains blue light and red light and which has a second predetermined chromaticity different from the first predetermined chromaticity,
wherein the light emitting device emits white light having a chromaticity coordinate on a line segment connecting a chromaticity coordinate of the first mixed light and that of the second mixed light.

13. The light emitting device according to claim 12, wherein the chromaticity coordinate of the first mixed light is in the range surrounded by (0.25, 0.65), (0.43, 0.52), (0.32, 0.33), and (0.18, 0.33).

* * * * *